(12) United States Patent
Takeuchi et al.

(10) Patent No.: US 6,643,902 B2
(45) Date of Patent: Nov. 11, 2003

(54) PIEZOELECTRIC/ELECTROSTRICTIVE DEVICE AND METHOD OF MANUFACTURING SAME

(75) Inventors: Yukihisa Takeuchi, Aichi-Pref. (JP); Tsutomu Nanataki, Toyoake (JP); Koji Kimura, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 09/683,477

(22) Filed: Jan. 4, 2002

(65) Prior Publication Data

US 2002/0057041 A1 May 16, 2002

Related U.S. Application Data

(62) Division of application No. 09/613,536, filed on Jul. 10, 2000, now Pat. No. 6,538,362.

(30) Foreign Application Priority Data

| Oct. 1, 1999 | (JP) | ................................. 11-281522 |
| Oct. 28, 1999 | (JP) | ................................. 11-307844 |
| Nov. 16, 1999 | (JP) | ................................. 11-326195 |
| Dec. 27, 1999 | (JP) | ................................. 11-371967 |
| Jan. 21, 2000 | (JP) | ................................. 2000-013576 |
| Jan. 24, 2000 | (JP) | ................................. 2000-015123 |
| Mar. 1, 2000 | (JP) | ................................. 2000-056434 |
| May 1, 2000 | (JP) | ................................. 2000-133004 |

(51) Int. Cl.$^7$ ................................. H04R 17/00
(52) U.S. Cl. ................ 29/25.35; 29/594; 29/896.22; 29/412
(58) Field of Search ................ 29/594, 896.22, 29/896.23, 25.35, 830, 412, 417; 310/328; 156/256, 89.16, 89.17

(56) References Cited

U.S. PATENT DOCUMENTS

4,523,120 A    6/1985   Assard et al.
5,063,321 A    11/1991  Carter (List continued on next page.)

FOREIGN PATENT DOCUMENTS

EP    1017116 A2    5/2000
EP    1089351 A2    4/2001

(List continued on next page.)

OTHER PUBLICATIONS

Soeno, Yoshikazu et al., "Piezoelectric Piggy–Back Microactuator for Hard Disk Drive," IEEE Transactions on Magnetics, vol. 35, No. 2, Mar. 1999, pp 983–987.

Koganezawa, S. et al., "Dual–Stage Actuator System for Magnetic Disk Drives Using a Shear Mode Pezoelectric Microactuator," IEEE Transactions on Magnetics, vol. 35, No. 2, Mar. 1999, pp 988–992.

Primary Examiner—A. Dexter Tugbang
Assistant Examiner—Tai V. Nguyen
(74) Attorney, Agent, or Firm—Burr & Brown

(57) ABSTRACT

A method of manufacturing a piezoelectric/electrostrictive device comprises a pair of mutually opposing thin plate sections, a movable section, and a fixation section for supporting the thin plate sections and the movable section. Piezoelectric/electrostrictive elements are arranged on the pair of thin plate sections. A hole is formed by the inner walls of the pair of thin plate sections, an inner wall of the movable section, and an inner wall of the fixation section. A through-hole having a rectangular cross section is formed over a range from a forward end surface of the movable section to the hole to realize a light weight of the movable section.

10 Claims, 44 Drawing Sheets

U.S. PATENT DOCUMENTS

| | | | |
|---|---|---|---|
| 5,341,550 A | * 8/1994 | Kaida | 29/25.35 |
| 5,525,853 A | * 6/1996 | Nye | 310/316 |
| 5,691,594 A | 11/1997 | Takeuchi et al. | |
| 5,693,997 A | 12/1997 | Griffith et al. | |
| 5,747,915 A | 5/1998 | Benavides | |
| 5,912,524 A | 6/1999 | Ohnishi et al. | |
| 5,969,248 A | 10/1999 | Kurachi et al. | |
| 6,049,158 A | 4/2000 | Takeuchi et al. | |
| 6,109,104 A | * 8/2000 | Fukuda | 73/504.13 |
| 6,140,739 A | * 10/2000 | Arai | 310/321 |
| 6,262,516 B1 | 7/2001 | Fukuda et al. | |
| 6,448,693 B1 | 9/2002 | Takeuchi et al. | |
| 2002/0109438 A1 | 8/2002 | Takeuchi et al. | |

FOREIGN PATENT DOCUMENTS

| | | |
|---|---|---|
| EP | 1089352 A2 | 4/2001 |
| EP | 1089358 A2 | 4/2001 |
| EP | 10089356 A2 | 4/2001 |
| JP | 62 89285 A | 4/1987 |
| JP | 63 21615 A | 1/1988 |
| JP | 63-64640 | 3/1988 |
| JP | 2 8110 A | 1/1990 |
| JP | 2-119278 | 5/1990 |
| JP | 9 219544 A | 8/1997 |
| JP | 10-136665 | 5/1998 |
| JP | 11 51959 A | 2/1999 |
| WO | 01/26166 A1 | 4/2001 |
| WO | 1 26169 A1 | 4/2001 |

* cited by examiner

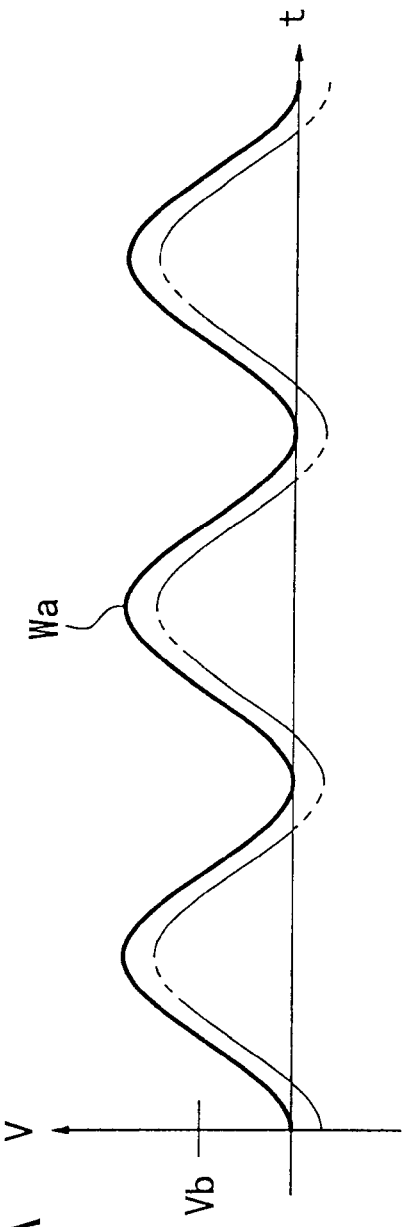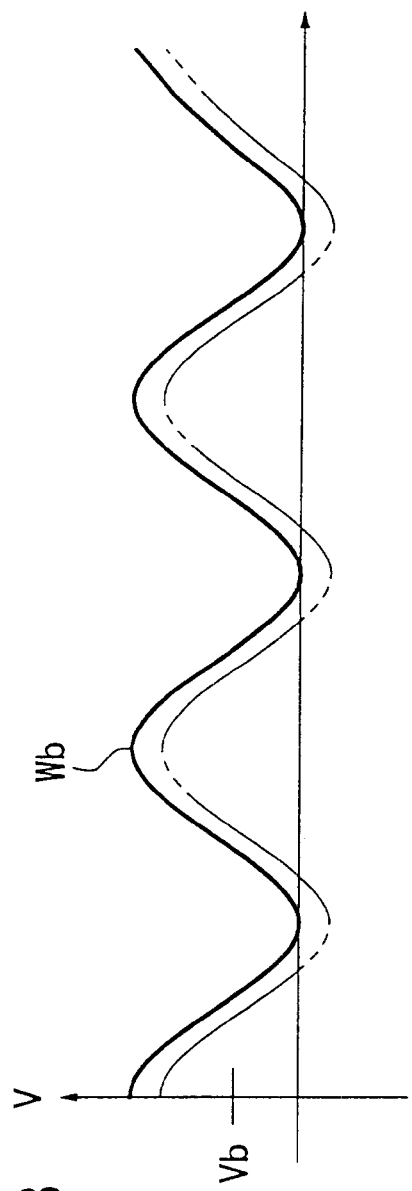
FIG. 15A
FIG. 15B

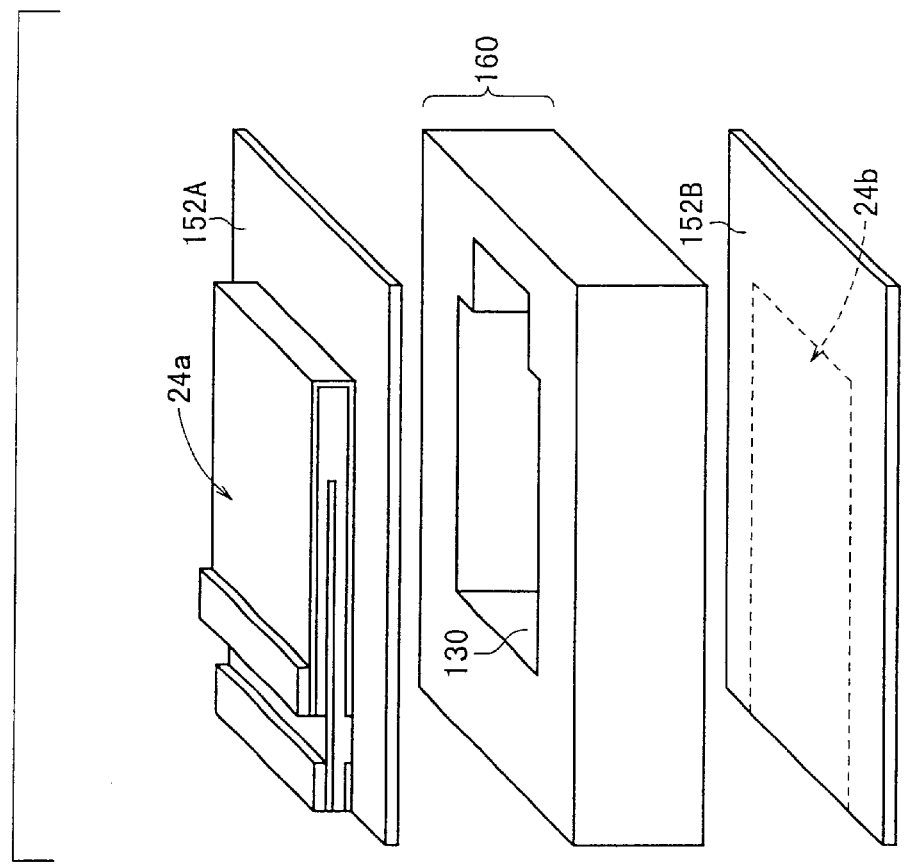
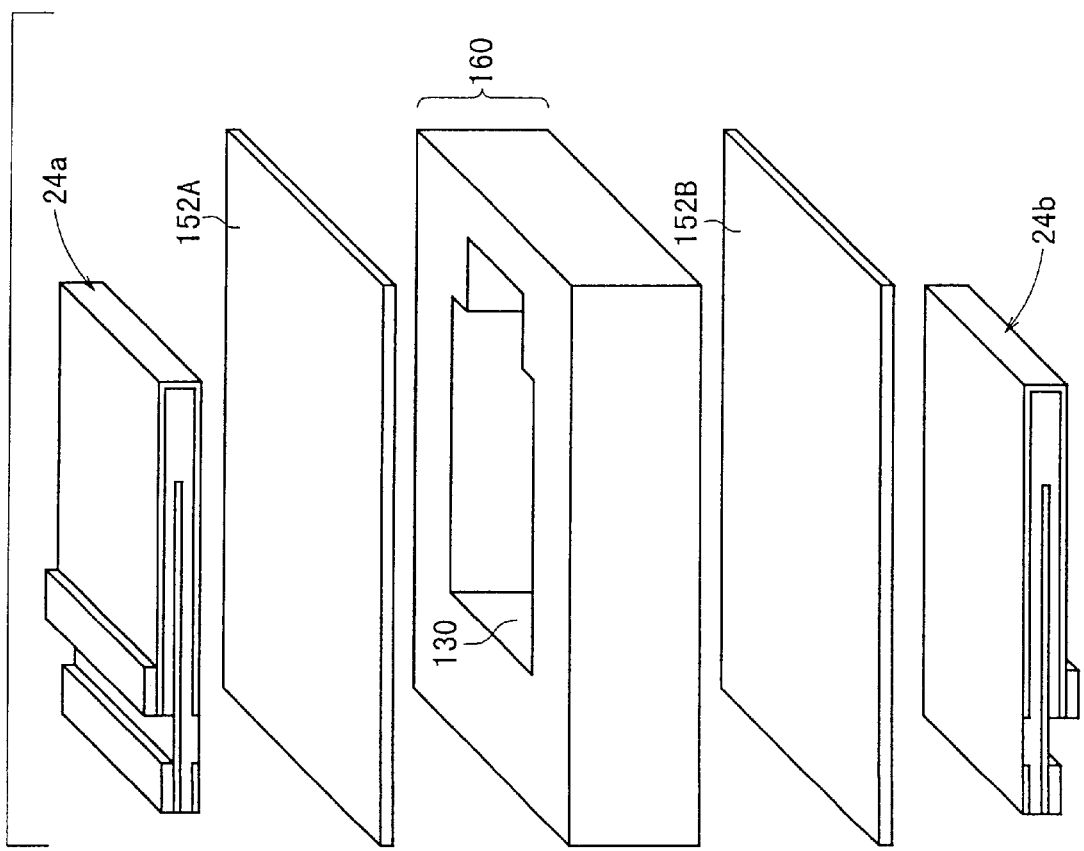

FIG. 39A
FIG. 39B
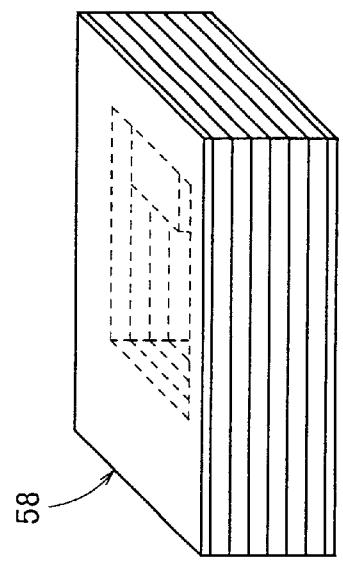
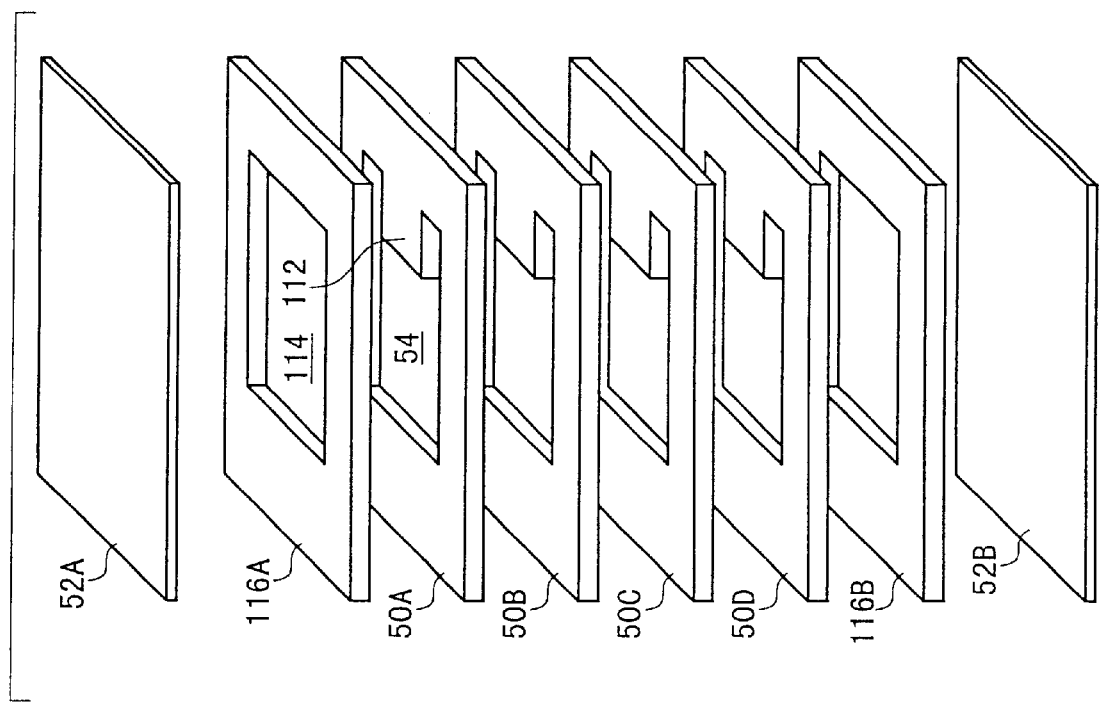

PIEZOELECTRIC/ELECTROSTRICTIVE DEVICE AND METHOD OF MANUFACTURING SAME

CROSS REFERENCE TO A RELATED APPLICATION

This application is a division of U.S. patent application Ser. No. 09/613,536, filed Jul. 10, 2000, now U.S. Pat. No. 6,538,362, the entirety of which is incorporated herein by reference.

BACKGROUND OF THE INVENTION

1. Field of the Invention

The present invention relates to a piezoelectric/electrostrictive device which is provided with a movable section to be operated on the basis of a displacement action of a piezoelectric/electrostrictive element, or a piezoelectric/electrostrictive device which is capable of detecting displacement of a movable section by the aid of a piezoelectric/electrostrictive element, and a method for producing the same. In particular, the present invention relates to a piezoelectric/electrostrictive device which is excellent in strength, shock resistance, and moisture resistance and which makes it possible to efficiently operate a movable section to a great extent, and a method for producing the same.

2. Description of the Related Art

Recently, it is desirable to realize a displacement element that makes it possible to adjust an optical path length and position in an order of submicron, for example, in the fields of optics, magnetic recording, and precision machining. The development for such a displacement element is advanced and is based on the use of the displacement brought about by an inverse piezoelectric effect or an electrostrictive effect caused when a voltage is applied to a piezoelectric/electrostrictive material (for example, a ferroelectric material).

As shown in FIG. 44, for example, those hitherto disclosed as such a displacement element include a piezoelectric actuator comprising a fixation section 204, a movable section 206, and a beam section 208 for supporting the fixation and movable sections. The displacement element is formed in an integrated manner with a hole 202 provided through a plate-shaped member 200 composed of a piezoelectric/electrostrictive material and with an electrode layer 210 provided on the beam section (see, for example, Japanese Laid-Open Patent Publication No. 10-136665).

The piezoelectric actuator is operated such that when a voltage is applied to the electrode layer 210, the beam section 208 makes expansion and contraction in a direction along a line obtained by connecting the fixation section 204 and the movable section 206 in accordance with the inverse piezoelectric effect or the electrostrictive effect. Therefore, the movable section 206 can perform a circular arc-shaped displacement or a rotational displacement in the plane of the plate-shaped member 200.

On the other hand, Japanese Laid-Open Patent Publication No. 63-64640 discloses a technique in relation to an actuator based on the use of a bimorph. In this technique, electrodes for the bimorph are provided in a divided manner. The actuator is driven due to the selection of the divided electrodes, and thus, a highly accurate positioning is performed at a high speed. This patent document (especially in FIG. 4) discloses a structure in which, for example, two bimorphs are used in an opposed manner.

However, the piezoelectric actuator described above involves such a problem that the amount of operation of the movable section is small, because the displacement in the direction of expansion and contraction of the piezoelectric/electrostrictive material (i.e., in the in-plane direction of the plate-shaped member) is transmitted to the movable section as it is.

All of the parts of the piezoelectric actuator are made of a piezoelectric/electrostrictive material which is a fragile material having a relatively heavy weight. Therefore, the following problems arise. That is, the mechanical strength is low, and the piezoelectric actuator is inferior in handling performance, shock resistance, and moisture resistance. Further, the piezoelectric actuator itself is heavy, and its operation tends to be affected by harmful vibrations (for example, residual vibration and noise vibration during high speed operation).

In order to solve the problems described above, it has been suggested that a filler material having flexibility is supplied to a hole included in the device. However, it is clear that a decreased amount of displacement resulting from the inverse piezoelectric effect or the electrostrictive effect remains in effect, even when the filler material is supplied to the above-mentioned hole.

On the other hand, FIG. 4 in Japanese Laid-Open Patent Publication No. 63-64640 resides in the junction of a mediating member and a bimorph in which the mediating member is joined with the portion at which no divided electrode exists. The effect of the divided electrode cannot be utilized at the joined portion. That is, the junction is merely made at the bimorph portion which is not the displacement-generating section. A similar form is adopted for the junction of the head and the bimorph.

As a result, the following structure is brought about. That is, a bending displacement of the bimorph is expressed toward an internal space between the mediating member and the head. Therefore, it is impossible to effectively displace the head itself with respect to the external space.

In many cases, the conventional devices of this type have such a structure rendering it difficult to realize a high resonance frequency required for a high speed operation, or such devices have such a structure rendering it impossible to increase the displacement of the movable section. Consequently, the following contradicting structure is obtained. That is, whenever a high resonance frequency is desired, the displacement amount of the movable section is sacrificed. On the other hand, whenever the displacement amount of the movable section is increased, it is impossible to achieve the realization of a high resonance frequency.

SUMMARY OF INVENTION

The present invention has been made taking the foregoing problems into consideration. An object of the present invention is to provide a piezoelectric/electrostrictive device and a method for producing the same which make it possible to obtain a displacement element that is scarcely affected by harmful vibrations during its operation. Another object is to provide a device capable of achieving a high speed response with a high mechanical strength while being excellent in handling performance, shock resistance, and moisture resistance. A further object is to provide a device wherein a movable section can be greatly displaced with a high speed of the displacement action and thus, realizing a high resonance frequency. Yet another object is to provide a sensor element which makes it possible to accurately detect a vibration of the movable section.

According to the present invention, there is provided a piezoelectric/electrostrictive device comprising a pair of mutually opposing thin plate sections, a movable section, and a fixation section for supporting the thin plate sections and the movable section. One or more piezoelectric/electrostrictive elements is arranged on at least one of the thin plate sections. A hole is formed by the inner walls of the pair of thin plate sections, an inner wall of the movable section, and an inner wall of the fixation section. The movable section has a cutout portion. It is also preferable that the cutout portion includes a hollow section and/or a through-hole provided for the movable section.

Accordingly, the movable section is allowed to have a light weight owing to the presence of the cutout. Therefore, it is possible to increase the resonance frequency without decreasing the displacement amount of the movable section. Further, it is possible to appropriately decrease the rigidity of the movable section. Therefore, an advantage is obtained such that the displacement amount of the movable section can be increased. When the thin plate section, the movable section, and the fixation section are integrated into one unit, it is unnecessary to construct all parts with the piezoelectric/electrostrictive material which is a fragile material having a relatively heavy weight. Therefore, an advantage is obtained such that the mechanical strength is high while being excellent in handling performance, shock resistance, and moisture resistance, and the operation is scarcely affected by harmful vibration (for example, residual vibration and noise vibration during high speed operation).

According to another aspect of the present invention, there is provided a piezoelectric/electrostrictive device comprising a pair of mutually opposing thin plate sections, a movable section, and a fixation section for supporting the thin plate sections and the movable section; one or more piezoelectric/electrostrictive elements arranged on at least one thin plate section of the pair of thin plate sections; and a hole formed by both inner walls of the pair of thin plate sections, an inner wall of the movable section, and an inner wall of the fixation section; wherein a part of the inner wall of the movable section is expanded in the hole.

Accordingly, for example, when a part is attached to the movable section, it is possible to increase the areal size of a part attachment surface of the movable section, without changing the maximum length of the piezoelectric/electrostrictive device. Thus, it is possible to improve the reliability concerning the attachment of the part.

Further, the weight is increased, because the expanded section is provided. However, the expanded section is expanded toward the hole. Therefore, the center of gravity of the movable section can be located at a position deviated toward the fixation section. Any influence is hardly exerted by the decrease in resonance frequency caused by the increase in weight. In this arrangement, the part is also attached at a position deviated toward the fixation section. Therefore, the resonance frequency is scarcely decreased after the part is attached. The displacement of the movable section is not decreased as well. That is, the device is designed such that the resonance frequency is substantially improved.

In other words, according to the present invention, the degree of the influence on the resonance frequency (decrease in resonance frequency), which would be otherwise enhanced when much weight is given to the attachment of the part, can be decreased, while enlarging the areal size of the part attachment surface of the movable section, and improving the reliability concerning the attachment of the part.

In the present invention, it is also preferable that a cutout is provided for the movable section. Accordingly, it is possible to simultaneously realize a light weight of the movable section and an increase in the displacement amount of the movable section. Thus, it is possible to simultaneously achieve the mutually contradicting "realization of the high resonance frequency" and the "increase in displacement".

Further, it is also preferable that a part of the inner wall of the movable section is expanded to the hole. Accordingly, it is possible to realize the "reliability of the part attachment" in addition to the "realization of the high resonance frequency" and the "increase in displacement".

In the invention described above, it is also preferable that the movable section is constructed to have a main movable section body and a portion which is provided for at least one surface of the main movable section body and which has an areal size larger than that of the main movable section body. When the portion, which has the areal size larger than that of the main movable section body, is utilized to attach the part, then it is possible to contemplate the reliability of the part attachment, and it is possible to enhance the reliability concerning the operation.

In the invention described above, the movable section, the fixation section, and the thin plate sections may be made of ceramics or metal. Alternatively, each of the components may be made of a ceramic material, or each of them may be made of a metal material. Further, each of the components may be constructed to have a hybrid structure obtained by combining those produced from materials of ceramics and metal.

It is also preferable that the thin plate sections, the movable section, and the fixation section are composed of a ceramic substrate obtained by being integrated into one unit by simultaneously sintering a ceramic green laminate and cutting off unnecessary portions. It is also preferable that the piezoelectric/electrostrictive element has a film-shaped configuration, and it is integrated with the ceramic substrate by means of sintering.

In this arrangement, the piezoelectric/electrostrictive element may be constructed to have a piezoelectric/electrostrictive layer and a pair of electrodes formed on the piezoelectric/electrostrictive layer. Further, the piezoelectric/electrostrictive element may have a piezoelectric/electrostrictive layer and a pair of electrodes formed on both sides of the piezoelectric/electrostrictive layer, and one electrode of the pair of electrodes may be formed on at least the thin plate section. In this arrangement, the vibration caused by the piezoelectric/electrostrictive element can be efficiently transmitted to the movable section or the fixation section via the thin plate section.

Accordingly, it is possible to improve the response performance. Especially, it is preferable that the piezoelectric/electrostrictive element is constructed in a stacked form comprising a plurality of the piezoelectric/electrostrictive layers and the electrodes.

When the arrangement as described above is adopted, the following features are obtained. That is, the force generated by the piezoelectric/electrostrictive element is increased. Accordingly, it is possible to obtain the large displacement. Further, owing to the increase in rigidity of the device itself, it is possible to realize the high resonance frequency, and it is easy to achieve the realization of the high speed of the displacement operation.

In the invention described above, it is also preferable that the hole is filled with a gel material. In this arrangement, although the displacement action of the movable section is restricted due to the presence of the filler material in ordinary cases, the invention described above intends to reduce the weight as a result of the formation of the cutout for the movable section, and increase the displacement amount of the movable section. Therefore, the restriction of the displacement action of the movable section by the filler material is counteracted, and it is possible to realize the effect owing to the presence of the filler material, i.e., the realization of the high resonance frequency and the maintenance of the rigidity.

According to still another aspect of the present invention, there is provided a method for producing a piezoelectric/electrostrictive device comprising a pair of mutually opposing thin plate sections, a movable section, and a fixation section for supporting the thin plate sections and the movable section; one or more piezoelectric/electrostrictive elements arranged on at least one thin plate section of the pair of thin plate sections; and a hole formed by both inner walls of the pair of thin plate sections, an inner wall of the movable section, and an inner wall of the fixation section; the method comprising a step of forming the movable section having a cutout by cutting off a predetermined part after producing at least the piezoelectric/electrostrictive element on the thin plate section.

In still another aspect, the present invention preferably lies in a method comprising a step of producing a ceramic laminate by integrally sintering a ceramic green laminate including at least a ceramic green sheet having a window for forming at least the hole thereafter and ceramic green sheets to be formed into the thin plate sections thereafter to produce the ceramic laminate; a step of forming the piezoelectric/electrostrictive element on an outer surface of a portion of the ceramic laminate to be formed into the thin plate section; and a cutoff step of forming the movable section having at least a cutout by means of at least one time of cutoff treatment for the ceramic laminate formed with the piezoelectric/electrostrictive element.

Accordingly, the movable section is allowed to have a light weight owing to the presence of the cutout. It is possible to efficiently and easily produce the piezoelectric/electrostrictive device which makes it possible to increase the resonance frequency without decreasing the displacement amount of the movable section. It is possible to realize mass production of the high performance piezoelectric/electrostrictive device.

The phrase "after producing the piezoelectric/electrostrictive element" referred to herein indicates a state in which at least the piezoelectric/electrostrictive layer is formed. As for the electrode to be formed after the formation of the piezoelectric/electrostrictive layer, the electrode may be formed after performing the cutoff to form the movable section having the cutout.

It is also preferable that in the step of producing the ceramic laminate, the ceramic laminate is produced by integrally sintering a ceramic green laminate including a ceramic green sheet having a window for forming the movable section having at least the cutout, and the ceramic green sheets to be formed into the thin plate sections thereafter to produce the ceramic laminate; and in the cutoff step, the movable section having at least the cutout is formed by means of the cutoff treatment for the ceramic laminate formed with the piezoelectric/electrostrictive element.

It is also preferable that the cutout includes a hollow section and/or a through-hole provided for the movable section.

According to still another aspect of the present invention, there is provided a method for producing a piezoelectric/electrostrictive device comprising a pair of mutually opposing thin plate sections, a movable section, and a fixation section for supporting the thin plate sections and the movable section; one or more piezoelectric/electrostrictive elements arranged on at least one thin plate section of the pair of thin plate sections; and a hole formed by the inner walls of the pair of thin plate sections, an inner wall of the movable section, and an inner wall of the fixation section; the method comprising a step of forming the movable section having an expanded section expanded in the hole by cutting off a predetermined part after producing at least the piezoelectric/electrostrictive element on the thin plate section.

In still another aspect, the present invention preferably lies in a method comprising a step of producing a ceramic laminate by integrally sintering a ceramic green laminate including at least a ceramic green sheet having a window for forming at least the hole thereafter and ceramic green sheets to be formed into the thin plate sections thereafter to produce the ceramic laminate; a step of forming the piezoelectric/electrostrictive element on an outer surface of a portion of the ceramic laminate to be formed into the thin plate section; and a cutoff step of forming the movable section having at least an expanded section expanded in the hole by means of at least one time of cutoff treatment for the ceramic laminate formed with the piezoelectric/electrostrictive element.

Accordingly, it is possible to efficiently and easily produce the piezoelectric/electrostrictive device which makes it possible to decrease the degree of the influence on the resonance frequency (decrease in resonance frequency), while increasing the areal size of the part attachment surface of the movable section.

It is also preferable that in the step of producing the ceramic laminate, the ceramic laminate is produced by integrally sintering a ceramic green laminate including a ceramic green sheet having a window for forming the movable section formed with at least an expanded section, and the ceramic green sheets to be formed into the thin plate sections thereafter to produce the ceramic laminate; and in the cutoff step, the movable section having at least an expanded section is formed by means of the cutoff treatment for the ceramic laminate formed with the piezoelectric/electrostrictive element.

It is also preferable for the production methods described above that in the cutoff step, the hole is simultaneously exposed by means of the cutoff treatment for the ceramic laminate. In this process, the formation of the movable section having the cutout may be performed simultaneously with the formation of the hole. There is no limitation for the sequence to perform the formation steps.

Therefore, the piezoelectric/electrostrictive device according to the present invention can be utilized as the active device including, for example, various transducers, various actuators, frequency region functional parts (filters), transformers, vibrators, resonators, oscillators, and discriminators for communication and power generation applications, as well as the sensor element for various sensors including, for example, ultrasonic sensors, acceleration sensors, angular velocity sensors, shock sensors, and mass sensors. Especially, the piezoelectric/electrostrictive device according to the present invention can be preferably utilized for various actuators to be used for a mechanism for adjusting the displacement and the positioning and for adjusting the angle for various precision parts such as those of optical instruments and precision mechanical equipments.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF DRAWINGS

FIG. 15A shows a waveform illustrating a voltage waveform to be applied to the first piezoelectric/electrostrictive element;

FIG. 15B shows a waveform illustrating a voltage waveform to be applied to the second piezoelectric/electrostrictive element;

FIG. 21A illustrates a state in which the ceramic green laminate is sintered into a ceramic laminate;

FIG. 21B illustrates a state in which piezoelectric/electrostrictive elements, which are constructed as separate members, are bonded to surfaces of metal plates to serve as thin plate sections respectively;

FIG. 39A illustrates a process for laminating ceramic green sheets required when the piezoelectric/electrostrictive device according to the sixth embodiment is produced in accordance with the first production method;

FIG. 39B illustrates a state in which a ceramic green laminate is formed;

DETAILED DESCRIPTION

Explanation will be made below with reference to FIGS. 1 to 43 for illustrative embodiments of the piezoelectric/electrostrictive device and the production method for the same according to the present invention.

It is noted that the piezoelectric/electrostrictive device of the present invention includes a piezoelectric/electrostrictive element for mutually converting electrical energy and mechanical energy. Therefore, the piezoelectric/electrostrictive device is most preferably used as an active element for various actuators and vibrators. It is especially employed as a displacement element based on the use of the displacement brought about by the inverse piezoelectric effect and the electrostrictive effect. Additionally, the piezoelectric/electrostrictive device is also preferably used as a passive element such as acceleration sensor elements and shock sensor elements.

Figure 1:
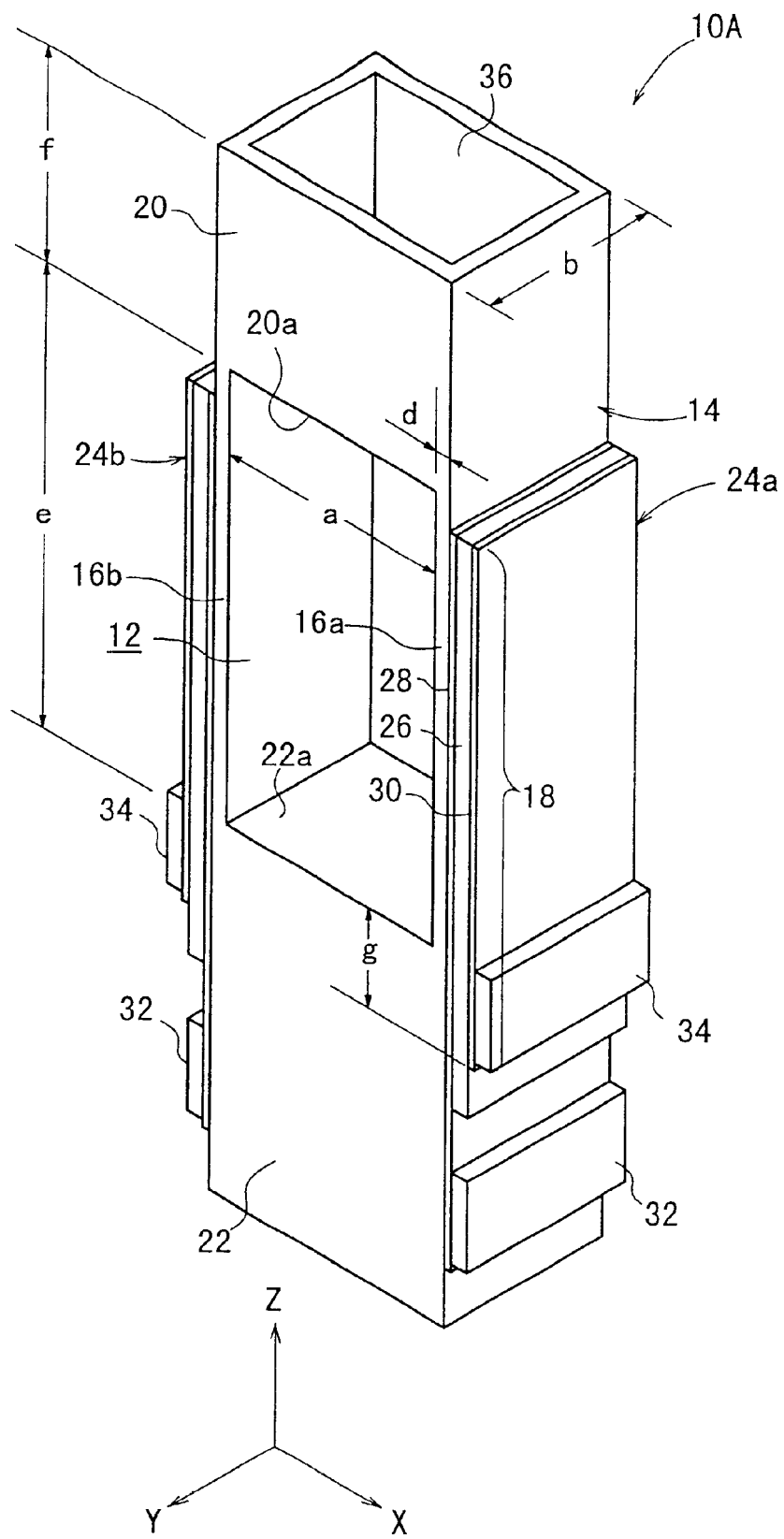
FIG. 1 shows a perspective view illustrating an arrangement of a piezoelectric/electrostrictive device according to a first embodiment.
Figure 2:
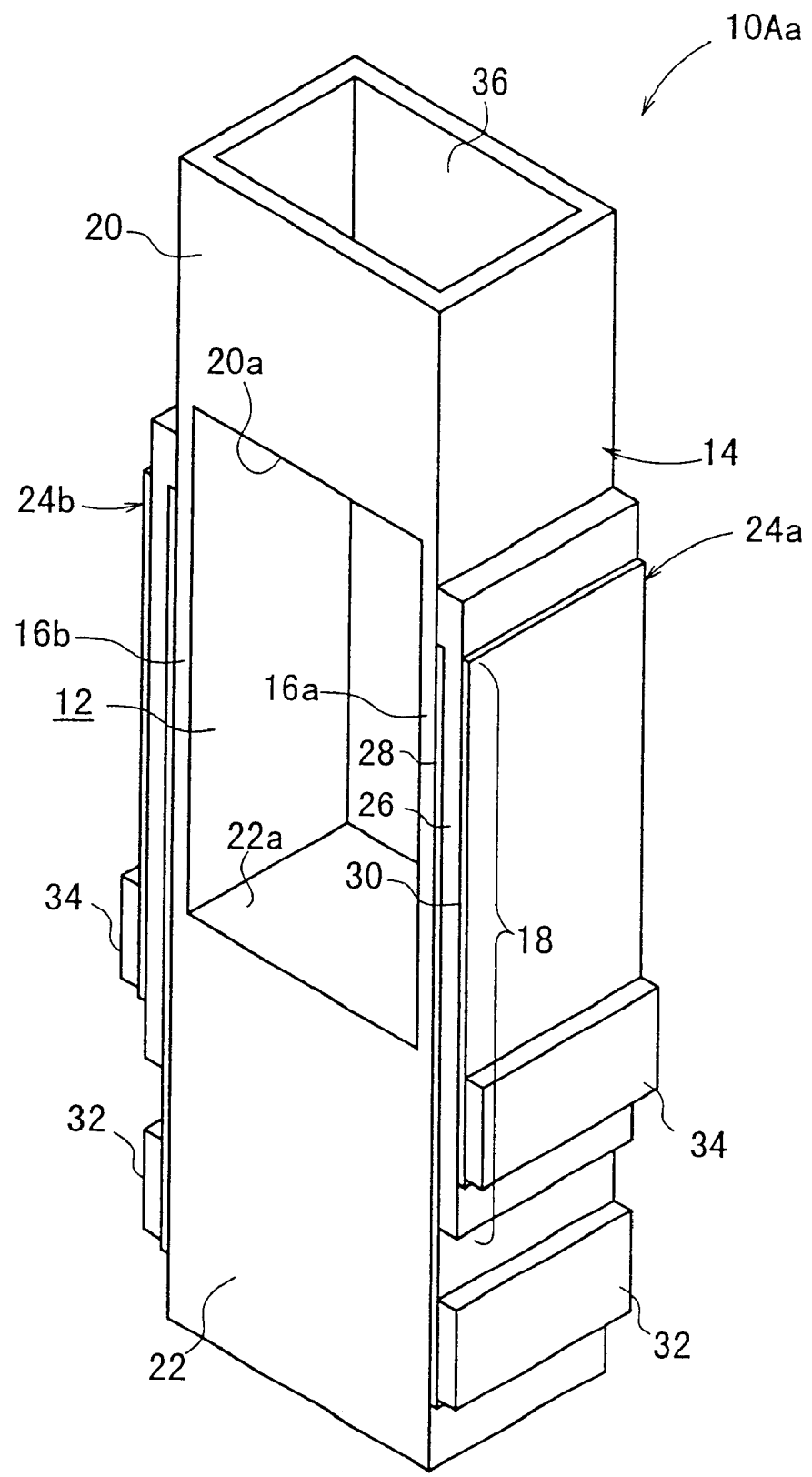
FIG. 2 shows a perspective view illustrating an arrangement of a piezoelectric/electrostrictive device according to a first modified embodiment.
Figure 3:
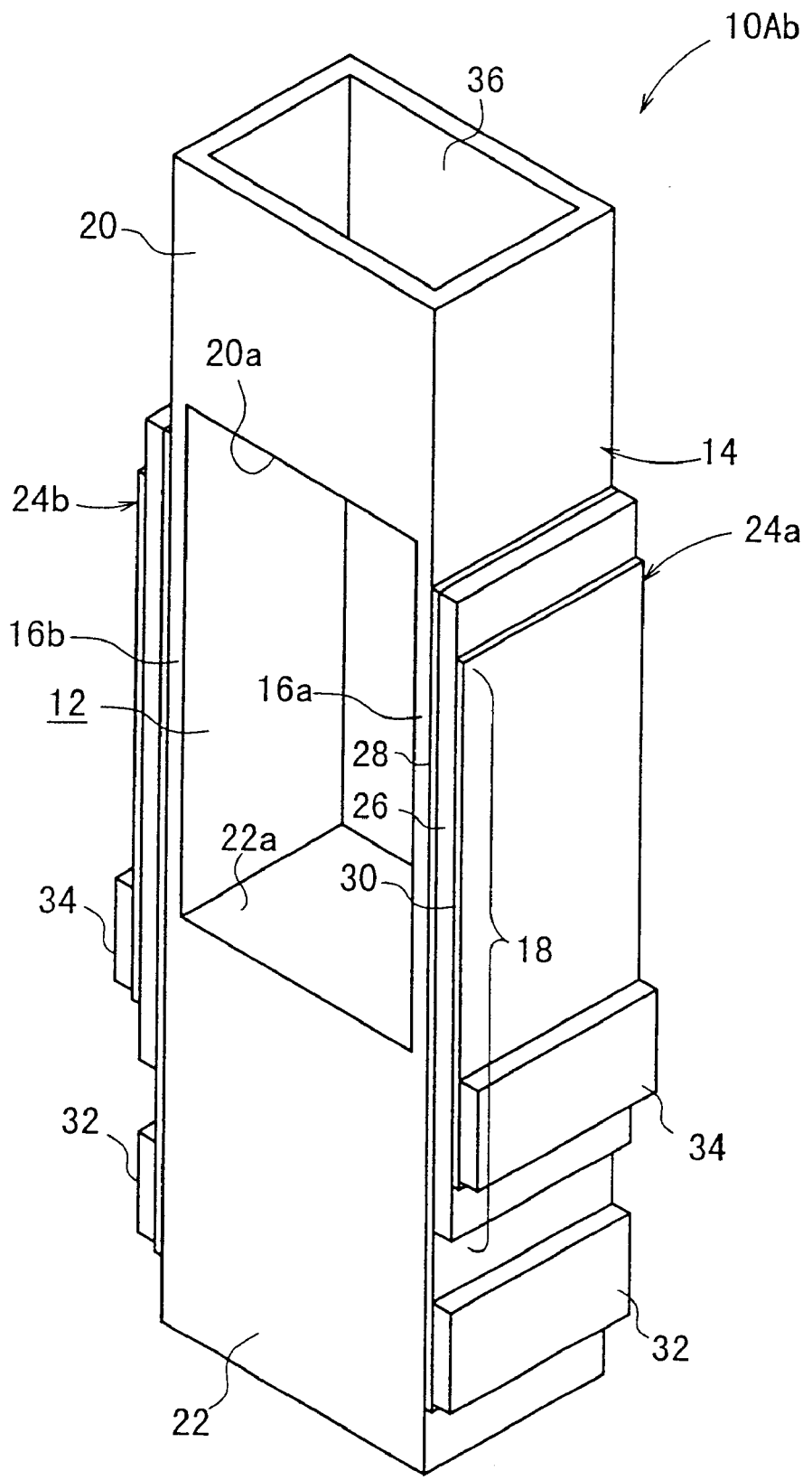
FIG. 3 shows a perspective view illustrating an arrangement of a piezoelectric/electrostrictive device according to a second modified embodiment.

As shown in FIG. 1, the piezoelectric/electrostrictive device 10A according to this embodiment has a substrate 14 which has a lengthy rectangular parallelepiped-shaped configuration and a hole 12 provided at an approximately central portion in the major axis direction thereof.

The substrate 14 comprises a pair of mutually opposing thin plate sections 16a, 16b, a movable section 20, and a fixation section 22 for supporting the pair of thin plate sections 16a, 16b and the movable section 20. Piezoelectric/electrostrictive elements 24a, 24b are formed on parts of at least the thin plate sections 16a, 16b, respectively.

The following definition is made for the perspective views including, for example, FIG. 1. That is, concerning the movable section 20 and the fixation section 22, the surface disposed and viewed at the front is defined to be a "front surface", and the surface disposed at the back is defined to be a "back surface". Further, concerning the movable section 20 and the fixation section 22, the surfaces, which are continuous to the upper surfaces of the thin plate sections 16a, 16b (surfaces on which the piezoelectric/electrostrictive elements 24a, 24b are formed), are defined to be "side surfaces".

Those usable as the substrate 14 include a structure comprising ceramic or metal materials as a whole, or a hybrid structure obtained by combining products produced with materials of ceramics and metals.

Those adoptable for the substrate 14 include, for example, a structure in which respective parts are bonded to one another with an adhesive such as an organic resin or a glass material or the like. An integrated ceramic structure is obtained by sintering and integrating a ceramic green laminate into one unit. An integrated metal structure is obtained, for example, by brazing, soldering, eutectic bonding, or welding into one unit. Preferably, it is desirable to construct the substrate 14 with a ceramic laminate integrated into one unit by sintering a ceramic green laminate.

The time-dependent change of state scarcely occurs in the integrated product of ceramic, because no adhesive exists at joined portions between the respective parts. Therefore, the reliability of the joined portion is high, giving a structure which is advantageous to ensure the proper rigidity. Additionally, the integrated product of ceramic can be easily produced with the method for laminating ceramic green sheets (described below).

The piezoelectric/electrostrictive elements 24a, 24b are prepared as separate members (described below), and the prepared piezoelectric/electrostrictive elements 24a, 24b are affixed to the substrate 14 with an adhesive such as organic resin or glass or by means of, for example, brazing, soldering, or eutectic bonding. Alternatively, the piezoelectric/electrostrictive elements 24a, 24b may be directly formed on the substrate 14 through the use of a film formation method.

The piezoelectric/electrostrictive device 10A includes a hole 12 having, for example, a rectangular configuration which is formed by the inner walls of the pair of thin plate sections 16a, 16b, an inner wall 20a of the movable section 20, and an inner wall 22a of the fixation section 22. The piezoelectric/electrostrictive device 10A operates to displace the movable section 20 in accordance with the driving of either or both of the piezoelectric/electrostrictive elements 24a and 24b. The piezoelectric/electrostrictive device 10A is also fabricated to detect the displacement of the movable section 20 through a sensing function of either or both of the piezoelectric/electrostrictive elements 24a and 24b.

Each of the piezoelectric/electrostrictive elements 24a, 24b comprises a piezoelectric/electrostrictive layer 26, and a pair of electrodes 28, 30 formed on both sides of the piezoelectric/electrostrictive layer 26. One electrode (i.e., numeral 28 in FIG. 1) of the pair of electrodes 28, 30 is formed on at least each of the pair of the thin plate sections 16a, 16b.

In the embodiment shown in FIG. 1, respective forward end surfaces of the pair of electrodes 28, 30 and the piezoelectric/electrostrictive layer 26 (employed to construct the piezoelectric/electrostrictive elements 24a, 24b) are substantially aligned. A substantial driving portion 18 of the piezoelectric/electrostrictive element 24a, 24b (portion at which the pair of electrodes 28, 30 are overlapped with each other with the piezoelectric/electrostrictive layer 26 interposed therebetween) is continuously formed over a range from a part of the outer circumferential surface of the fixation section 22 to a part of the outer circumferential surface of the thin plate section 16a, 16b. Especially, in this embodiment, the respective forward end surfaces of the pair of electrodes 28, 30 are located at the positions slightly deviated rearwardly from the inner wall 20a of the movable section 20. Of course, the piezoelectric/electrostrictive elements 24a, 24b may be formed such that the substantial driving portion 18 is located over a range from a part of the movable section 20 to a part of the thin plate section 16a, 16b.

A voltage is applied to the pair of electrodes 28, 30 via terminals (pads) 32, 34 of the respective electrodes 28, 30 formed on both side surfaces (element formation surfaces) of the fixation section 22 respectively. The respective terminals 32, 34 are positioned as follows. That is, the terminal 32 corresponding to the first electrode 28 is formed at a position deviated toward the rearward end of the fixation section 22. The terminal 34 corresponding to the second electrode 30 (disposed on the side of the external space) is formed at a position deviated toward the inner wall 22a of the fixation section 22.

In this embodiment, the piezoelectric/electrostrictive device 10A can be individually fixed by utilizing the surfaces that are respectively different from the surfaces on which the terminals 32, 34 are arranged. As a result, it is possible to obtain a high reliability for both of the fixation of the piezoelectric/electrostrictive device 10A and the electric connection between the circuit and the terminals 32, 34. In this arrangement, the electric connection between the terminals 32, 34 and the circuit is made, for example, by means of a flexible printed circuit (also referred to as FPC), a flexible flat cable (also referred to as FFC), and a wire bonding.

As shown in FIG. 1, the piezoelectric/electrostrictive device 10A according to the first embodiment is constructed such that a cutout 36 is formed in the movable section 20. In the embodiment shown in FIG. 1, the cutout 36 is a through-hole having a rectangular cross section which is formed continuously over a range from the forward end surface of the movable section 20 to the hole 12.

Structures other than the structure shown in FIG. 1 are available for use in the arrangement of the piezoelectric/electrostrictive elements 24a, 24b. That is, as in a piezoelectric/electrostrictive device 10Aa according to a first modified embodiment shown in FIG. 2, it is also preferable that while the respective forward ends of the pair of electrodes 28, 30 (employed to construct the piezoelectric/electrostrictive elements 24a, 24b) are substantially aligned, only the forward end of the piezoelectric/electrostrictive layer 26 is allowed to protrude toward the movable section 20. Alternatively, as in a piezoelectric/electrostrictive device 10Ab according to a second modified embodiment shown in FIG. 3, it is also preferable that the respective forward ends of the first electrode 28 and the piezoelectric/electrostrictive layer 26 are aligned, and only the forward end of the second electrode 30 is disposed at a position deviated toward the fixation section 22.

Figure 4:
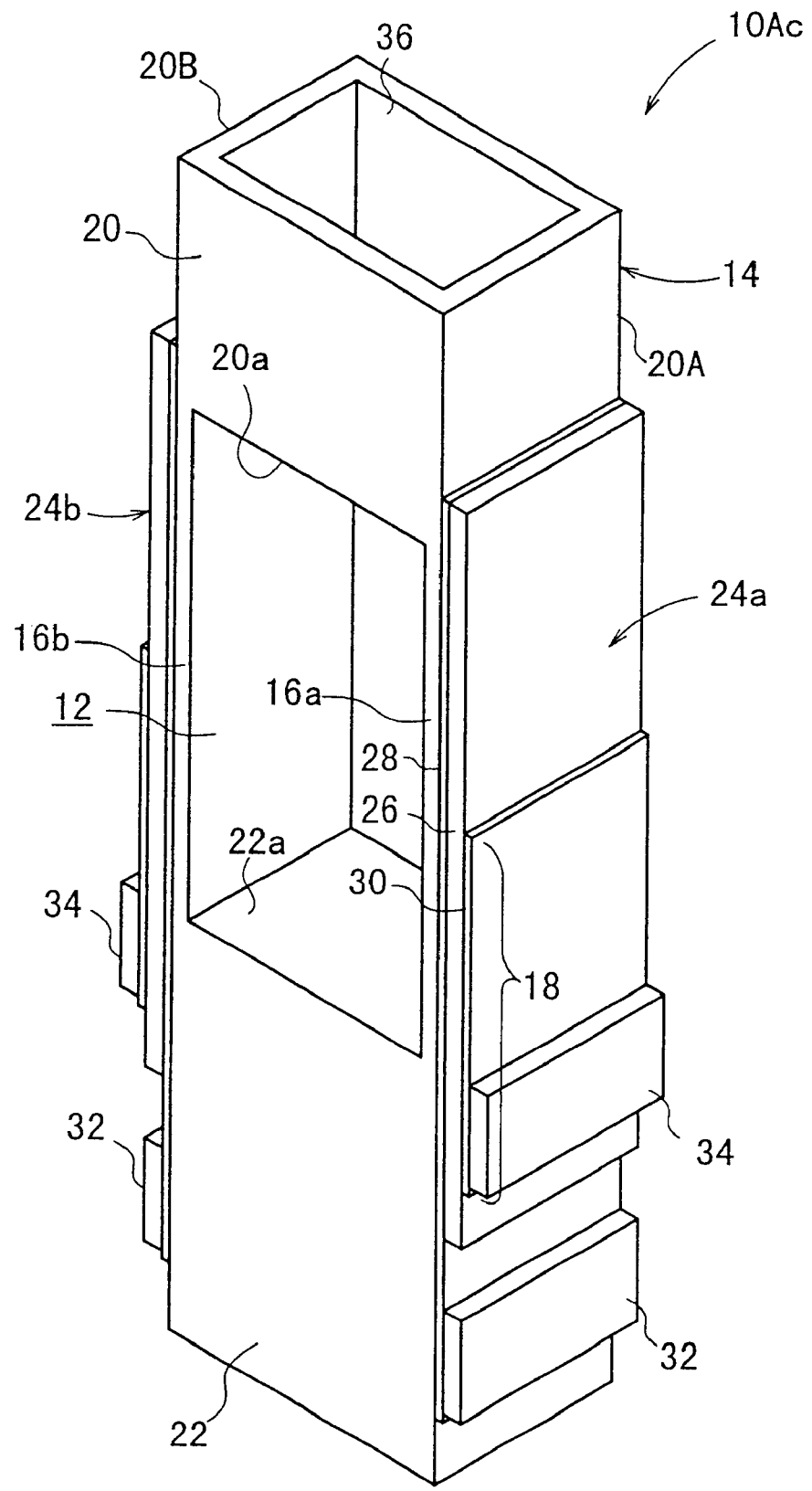
FIG. 4 shows a perspective view illustrating an arrangement of a piezoelectric/electrostrictive device according to a third modified embodiment.

Alternatively, as in a piezoelectric/electrostrictive device 10Ac according to a third modified embodiment shown in FIG. 4, it is also preferable that the respective forward ends of the first electrode 28 and the piezoelectric/electrostrictive layer 26 are allowed to extend up to the side surface of the movable section 20, and the forward end of the second electrode 30 is located at an approximately central portion in a length direction (i.e., the Z axis direction) of the thin plate section 16a, 16b.

In the embodiments described above, the piezoelectric/electrostrictive elements 24a, 24b are constructed with the piezoelectric/electrostrictive layer 26 having a one-layered structure and a pair of electrodes 28, 30. Alternatively, it is also preferable that the piezoelectric/electrostrictive elements 24a, 24b are constructed in a stacked form composed of a plurality of the piezoelectric/electrostrictive layers 26 and the electrodes 28, 30.

Figure 5:
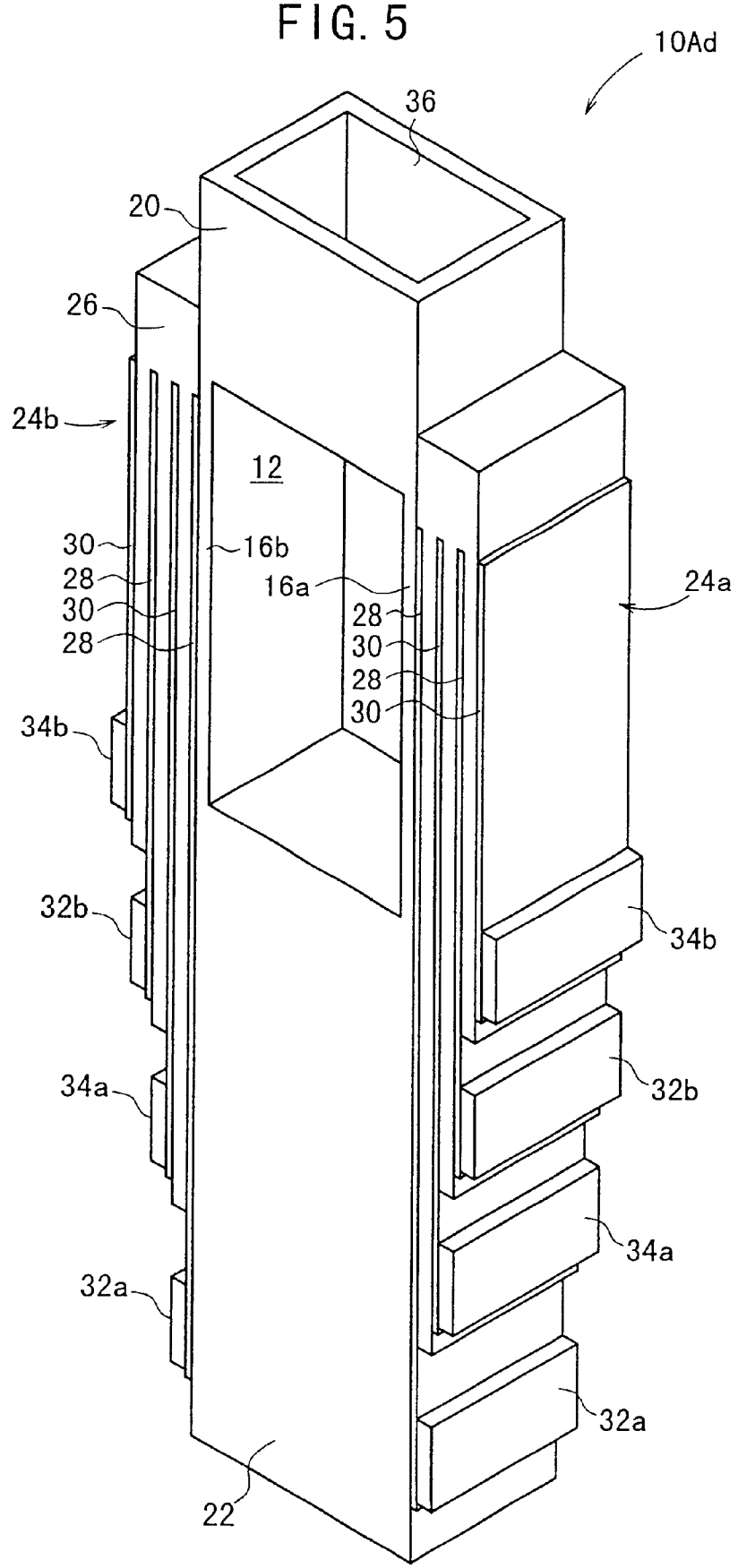
FIG. 5 shows a perspective view illustrating an arrangement of a piezoelectric/electrostrictive device according to a fourth modified embodiment.

For example, as in a piezoelectric/electrostrictive device 10Ad according to a fourth modified embodiment shown in FIG. 5, each of the piezoelectric/electrostrictive layer 26 and the pair of electrodes 28, 30 resides in a multilayered structure. The first electrodes 28 and the second electrodes 30 are alternately stacked with each other to provide the piezoelectric/electrostrictive element 24a, 24b which has a multiple stage structure at a portion (substantial driving portion 18) at which the first electrodes 28 and the second electrodes 30 are overlapped with each other with the piezoelectric/electrostrictive layer 26 interposed therebetween. FIG. 5 is illustrative of the following case. That is, the piezoelectric/electrostrictive layer 26 has a three-layered structure. The first electrodes 28 are formed in a separate manner respectively on the lower surface of the first layer (side surface of the thin plate section 16a, 16b) and on the upper surface of the second layer. The second electrodes 30 are formed in a separate manner respectively on the upper surface of the first layer and on the upper surface of the third layer. Further, terminals 32a, 32b are provided on respective ends of the first electrodes 28 respectively, and terminals 34a, 34b are provided on respective ends of the second electrodes 30 respectively.

Figure 6:
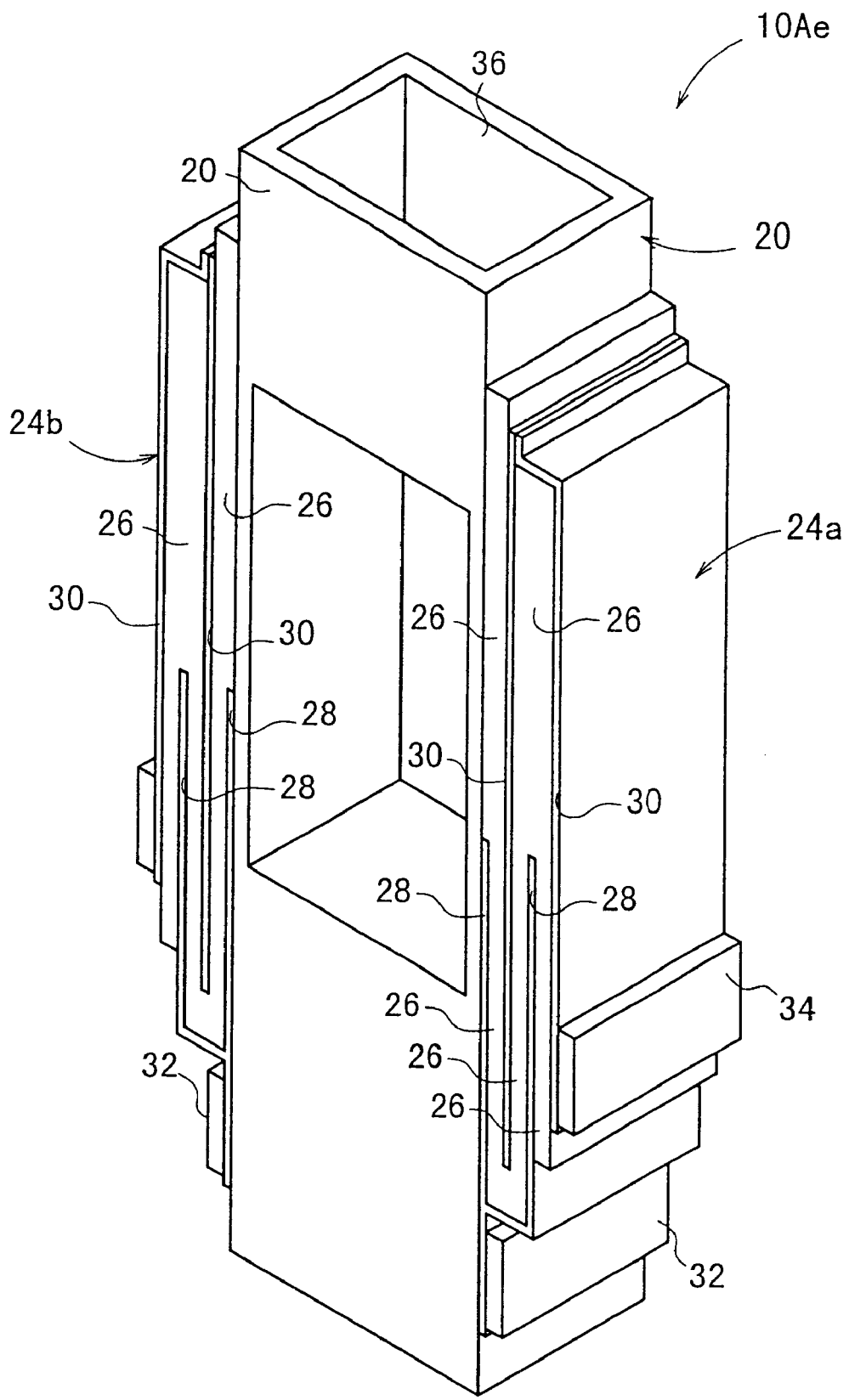
FIG. 6 shows a perspective view illustrating an arrangement of a piezoelectric/electrostrictive device according to a fifth modified embodiment.

As in a piezoelectric/electrostrictive device 10Ae according to a fifth modified embodiment shown in FIG. 6, each of the piezoelectric/electrostrictive layer 26 and the pair of electrodes 28, 30 resides in a multilayered structure. The first electrode 28 and the second electrode 30 are alternately stacked with each other so that a substantially comb-shaped configuration is obtained in a cross section to provide the piezoelectric/electrostrictive element 24a, 24b which has a multiple stage structure at a portion (substantial driving portion 18) at which the first electrode 28 and the second electrode 30 are overlapped with each other with the piezoelectric/electrostrictive layer 26 interposed therebetween.

FIG. 6 is illustrative of the following case. That is, the piezoelectric/electrostrictive layer 26 has a three-layered structure. The first electrode 28 is formed in a comb-shaped configuration to be located on the lower surface of the first layer (side surface of the thin plate section 16a, 16b) and on the upper surface of the second layer. The second electrode 30 is formed in a comb-shaped configuration to be located on the upper surface of the first layer and on the upper surface of the third layer. In the case of this structure, each of the first electrode 28 and the second electrode 30 is continuous and common. Accordingly, it is possible to decrease the number of terminals 32, 34 as compared with the structure shown in FIG. 5. Therefore, it is possible to suppress the increase in size which would be otherwise involved in the multilayered structure of the piezoelectric/electrostrictive element 24a, 24b.

When the number of stages is increased, it is possible to increase the driving force. However, the electric power consumption is also increased in accordance therewith. Therefore, when the device is practically produced and used, for example, it is preferable that the number of stages is appropriately determined depending on the way of use and the state of use. In the case of the piezoelectric/electrostrictive device 10Ae according to the fifth modified embodiment, even when the driving force is increased by providing the multiple stage structure of the piezoelectric/electrostrictive element 24a, 24b, the width of the thin plate section 16a, 16b (distance in the Y axis direction) is basically unchanged. Therefore, the device is extremely preferred for use in applications, for example, employing an actuator for the purpose of a ringing control and the positioning of a magnetic head for a hard disk to be used in an extremely narrow gap.

Figure 7:
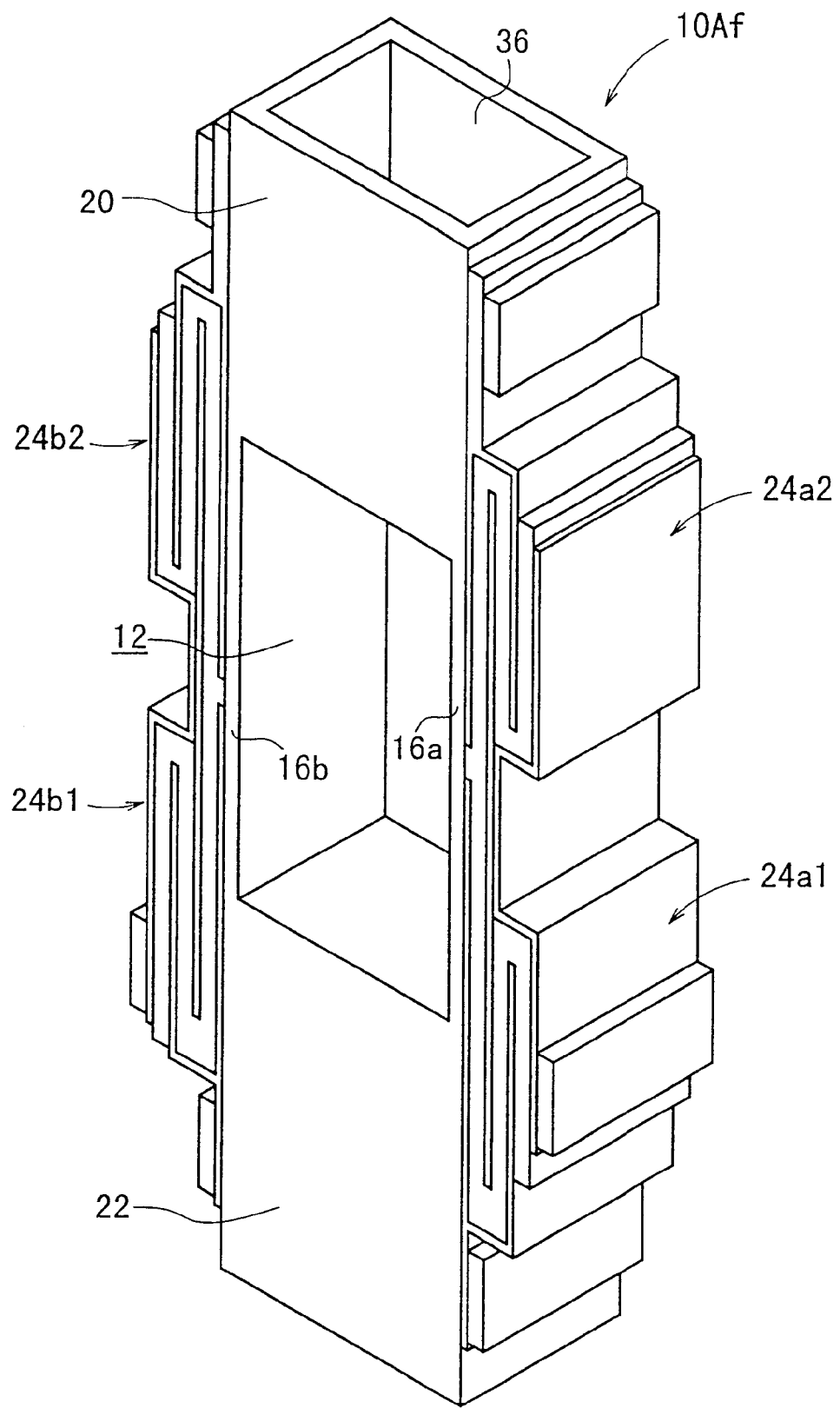
FIG. 7 shows a perspective view illustrating an arrangement of a piezoelectric/electrostrictive device according to a sixth modified embodiment.

Alternatively, as in a piezoelectric/electrostrictive device 10Af according to a sixth modified embodiment shown in FIG. 7, it is also preferable that two piezoelectric/electrostrictive elements 24a1, 24b1 having a multiple stage structure are formed to extend over the fixation section 22 and the thin plate section 16a, 16b respectively, and another two piezoelectric/electrostrictive elements 24a2, 24b2 having a multiple stage structure are formed to extend over the movable section 20 and the thin plate section 16a, 16b respectively. In this arrangement, the movable section 20 can be displaced extremely greatly owing to the effect that the piezoelectric/electrostrictive element 24a, 24b has the multiple stage structure and the effect that the number of points of action to displace the movable section 20 is increased. Additionally, the piezoelectric/electrostrictive device 10Af is excellent in high speed response performance, which is preferred.

Figure 8:
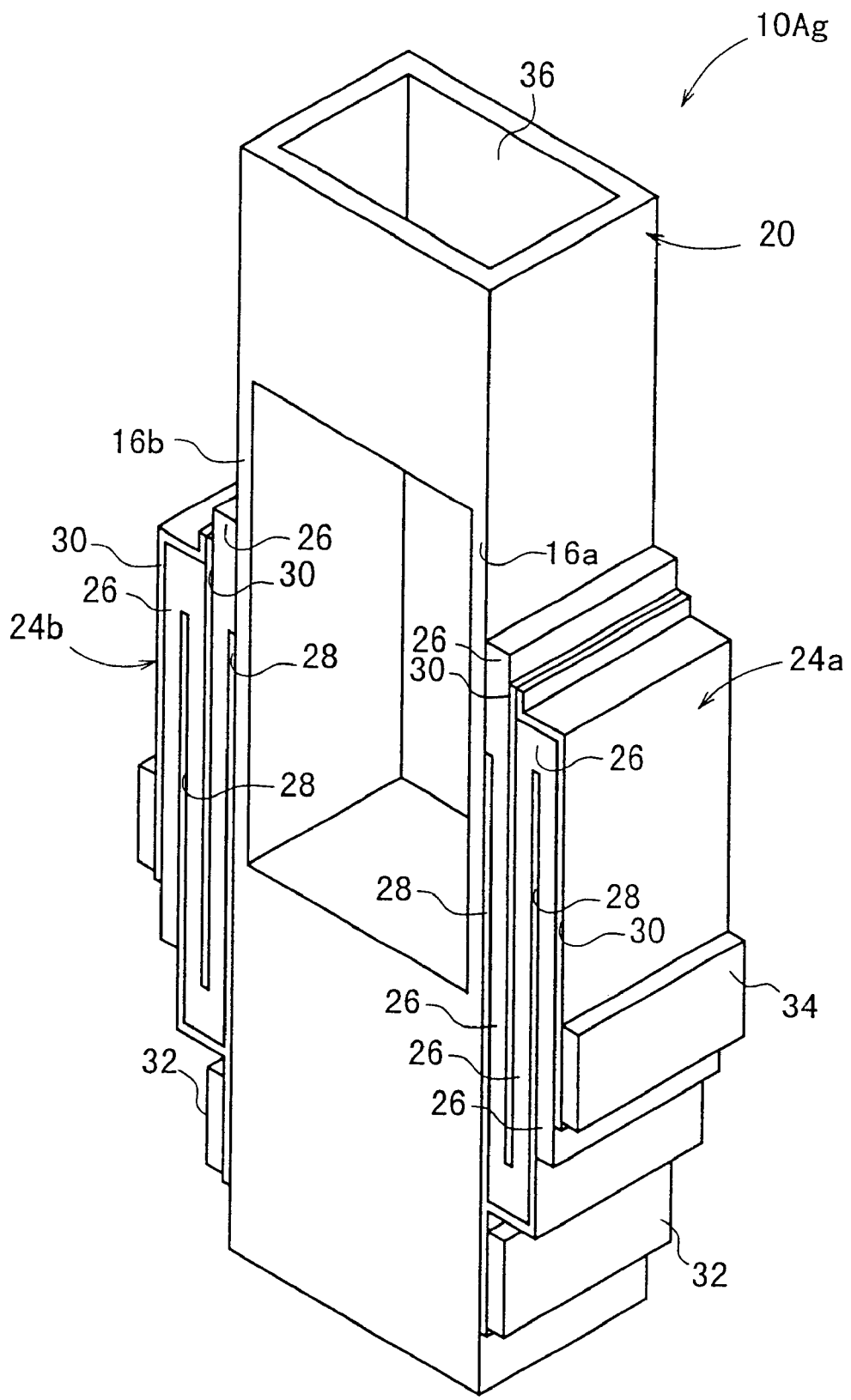
FIG. 8 shows a perspective view illustrating an arrangement of a piezoelectric/electrostrictive device according to a seventh modified embodiment.

Alternatively, as in a piezoelectric/electrostrictive device 10Ah according to a seventh modified embodiment shown in FIG. 8, it is also preferable to form the piezoelectric/electrostrictive element 24a, 24b so that the forward end thereof stays on the thin plate section 16a, 16b. FIG. 8 is illustrative of the case in which the forward end of the piezoelectric/electrostrictive element 24a, 24b is located at a substantially central portion in the length direction of the thin plate section 16a, 16b. This arrangement is advantageous in that the movable section 20 can be displaced to a great extent substantially in parallel to the side surface direction (X axis direction).

Figure 9:
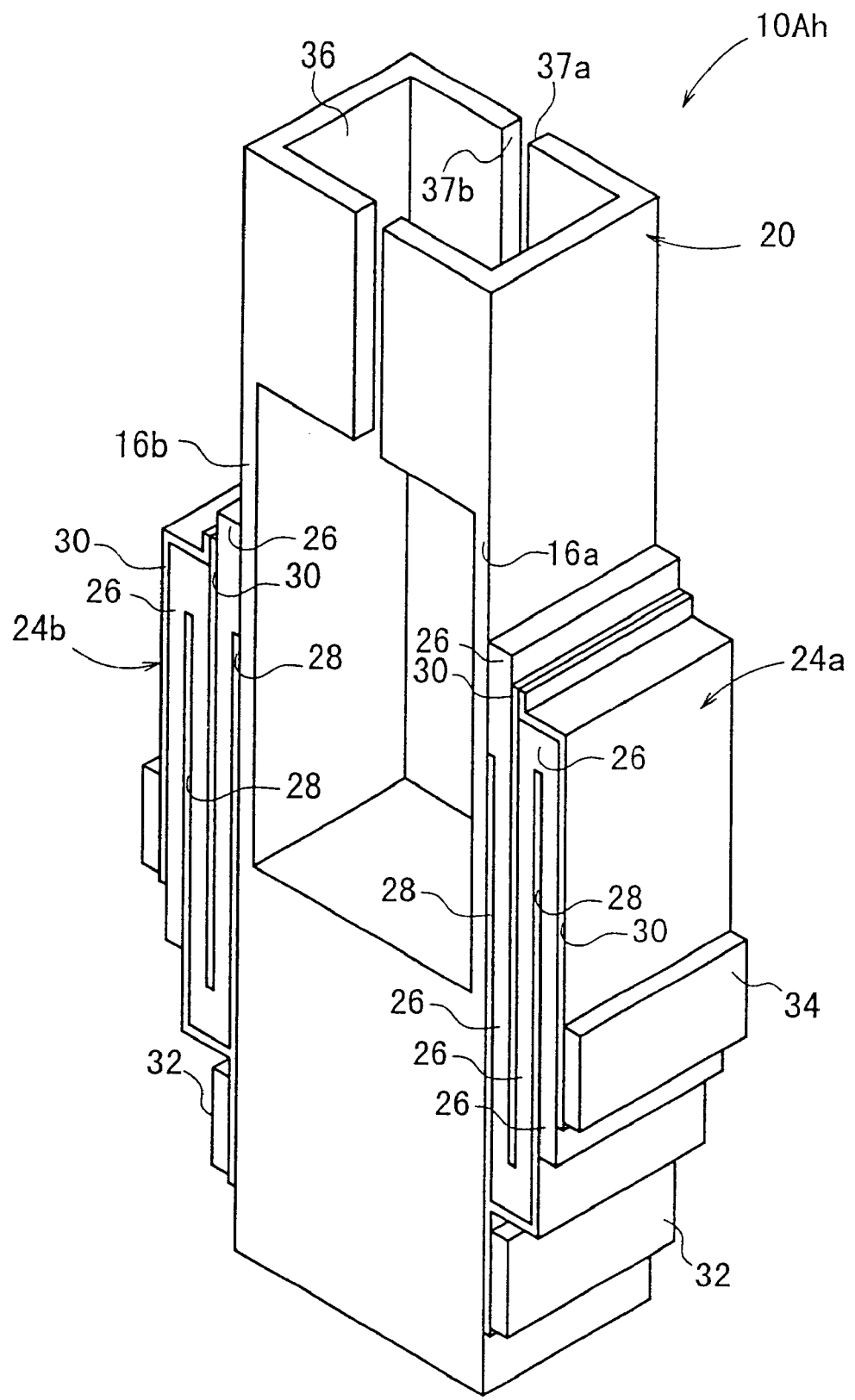
FIG. 9 shows a perspective view illustrating an arrangement of a piezoelectric/electrostrictive device according to an eighth modified embodiment.

Alternatively, as in a piezoelectric/electrostrictive device 10Ah according to an eighth modified embodiment shown in FIG. 9, it is also preferable that mutually opposing end surfaces 37a, 37b are formed for the movable section 20. In this arrangement, the internal residual stress, which has been generated in the piezoelectric/electrostrictive elements 24a, 24b and/or the thin plate sections 16a, 16b during the production, can be released by the movement of the end surfaces 37a, 37b. Therefore, the displacement action of the movable section 20 is not inhibited by the internal residual stress. Thus, it is possible to obtain the displacement action of the movable section 20 substantially as designed.

Additionally, the release of the stress makes it possible to improve the mechanical strength of the piezoelectric/electrostrictive device 10Ah as well. The embodiment described above is illustrative of the case in which the mutually opposing end surfaces 37a, 37b are provided for the movable section 20. Alternatively, the mutually opposing end surfaces 37a, 37b may be provided for the fixation section 22.

Figure 10:
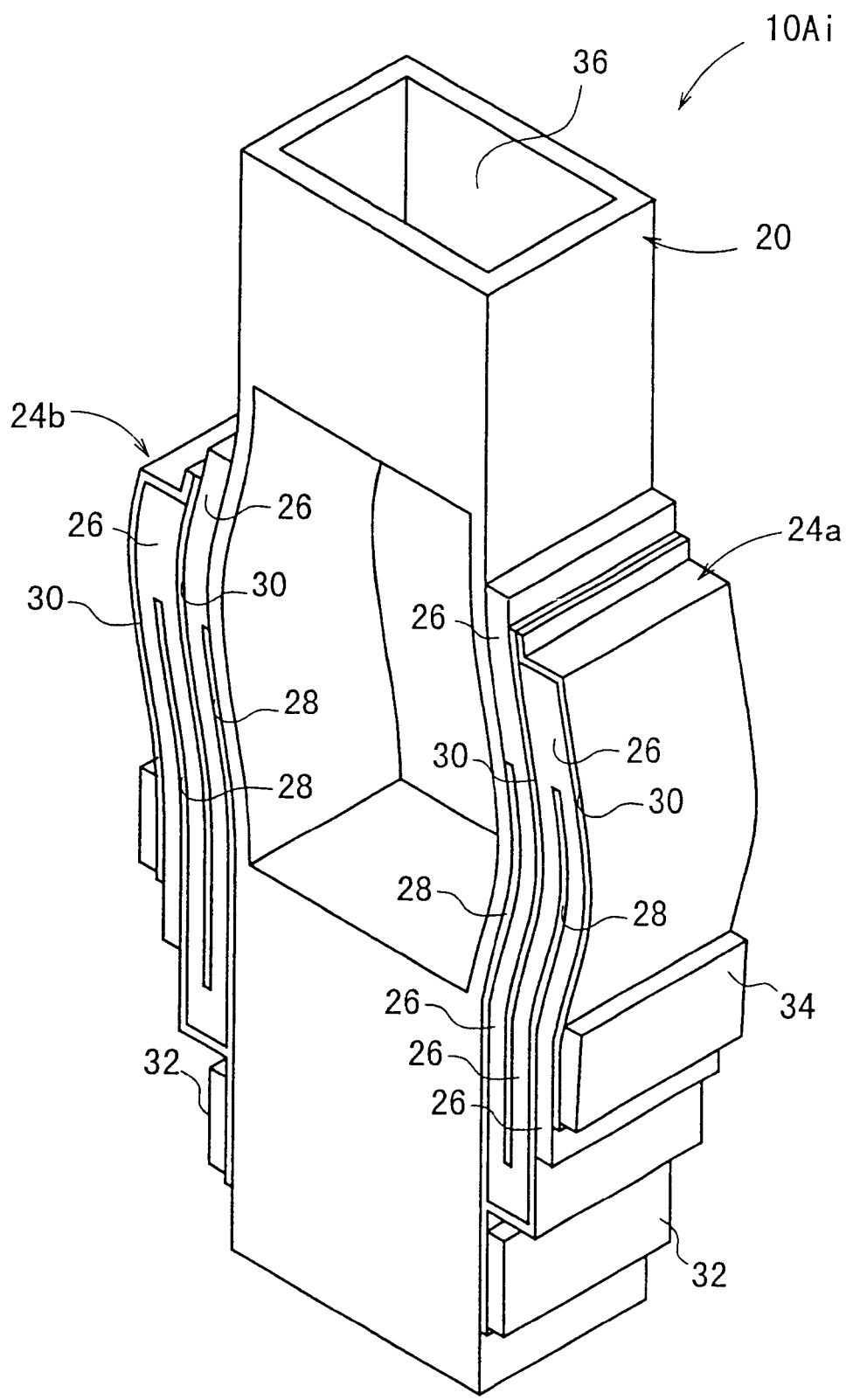
FIG. 10 shows a perspective view illustrating an arrangement of a piezoelectric/electrostrictive device according to a ninth modified embodiment.

Alternatively, as in a piezoelectric/electrostrictive device 10Ai according to a ninth modified embodiment shown in FIG. 10, it is also preferable that a pair of thin plate sections 16a, 16b are bent in directions to make separation from each other, and they are convex toward the outside. In this arrangement, high rigidity is exhibited for the vibration (bending displacement) of the thin plate sections 16a, 16b. As a result, it is possible to increase the resonance frequency of the vibration itself of the thin plate sections 16a, 16b. The structure, in which the thin plate sections 16a, 16b are previously bent in the directions to make separation from each other, i.e., toward the external space as described above, is a structure which is efficient to convert the displacement of the piezoelectric/electrostrictive elements 24a, 24b into the displacement of the movable section 20 in the direction toward the external space. Therefore, it is possible to greatly displace the movable section 20.

In other words, in the ninth modified embodiment, the rigidity of the thin plate sections 16a, 16b is enhanced, while the decrease in displacement of the movable section 20, which is postulated from the increased rigidity, is suppressed by providing the structure in which the thin plate sections 16a, 16b are allowed to protrude outwardly to increase the conversion efficiency of the displacement. As a result, the structure makes it possible to displace the movable section 20 at a high speed to a great extent. Further, the structure described above also exhibits large durability against the force (external force) exerted on the thin plate sections 16a, 16b from the outside. Therefore, the device is also excellent in strength.

Figure 11:
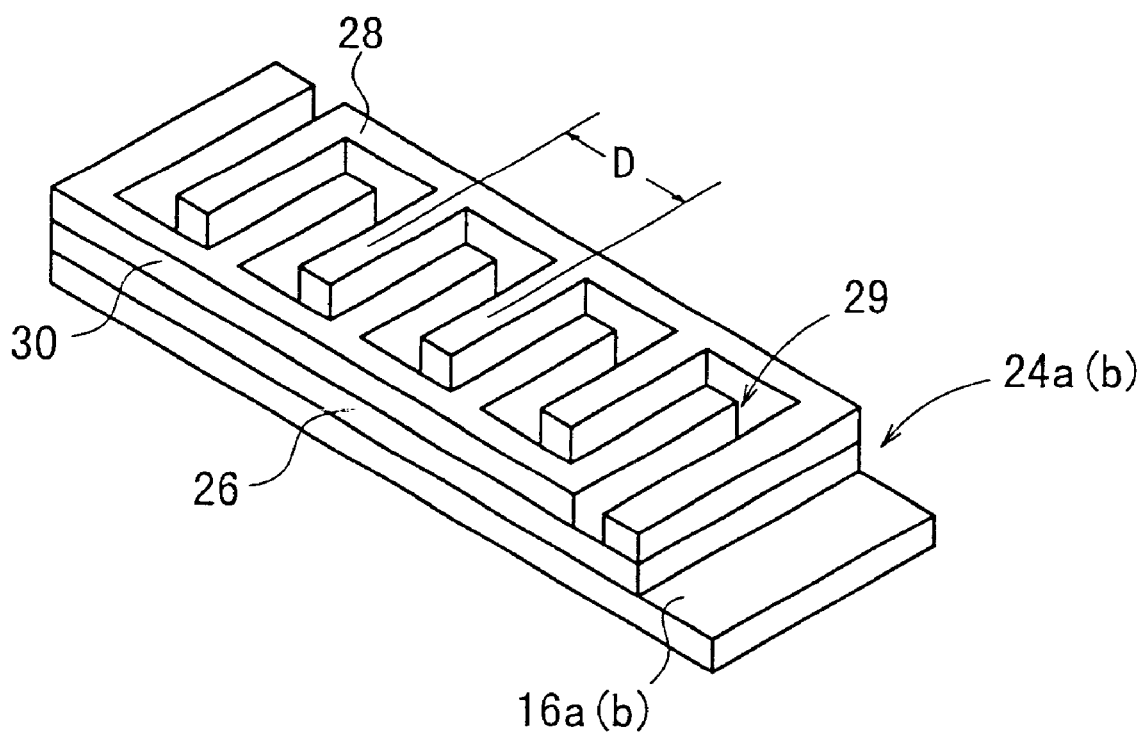
FIG. 11 shows, with partial omission, another embodiment of the piezoelectric/electrostrictive element.

The piezoelectric/electrostrictive element 24a, 24b described above is illustrative of the case of the construction of the so-called sandwich structure in which the piezoelectric/electrostrictive layer 26 is allowed to intervene between the pair of electrodes 28, 30. Alternatively, as shown in FIG. 11, a pair of comb-shaped electrodes 28, 30 may be formed on the first principal surface of the piezoelectric/electrostrictive layer 26 formed on at least the side surface of the thin plate section 16a, 16b. Further alternatively, as shown in FIG. 12, a pair of comb-shaped electrodes 28, 30 are formed and embedded in the piezoelectric/electrostrictive layer 26 formed on at least the side surface of the thin plate section 16a, 16b.

The structure shown in FIG. 11 is advantageous in that it is possible to suppress the electric power consumption to be low. The structure shown in FIG. 12 makes it possible to effectively utilize the inverse piezoelectric effect in the direction of the electric field having large generated force and strain, which is advantageous to cause the large displacement.

Specifically, the piezoelectric/electrostrictive element 24a, 24b shown in FIG. 11 comprises the pair of electrodes 28, 30 having a comb-shaped structure formed on the first principal surface of the piezoelectric/electrostrictive layer 26. In this structure, the first electrode 28 and the second electrode 30 are mutually opposed to one another in an alternate manner with a gap 29 having a constant width interposed therebetween. FIG. 11 is illustrative of the case in which the pair of electrodes 28, 30 are formed on the first principal surface of the piezoelectric/electrostrictive layer 26. Alternatively, the pair of electrodes 28, 30 may be formed between the thin plate section 16a, 16b and the piezoelectric/electrostrictive layer 26. Further alternatively, the pair of comb-shaped electrodes 28, 30 may be formed on the first principal surface of the piezoelectric/electrostrictive layer 26 and between the thin plate section 16a, 16b and the piezoelectric/electrostrictive layer 26 respectively.

Figure 12:
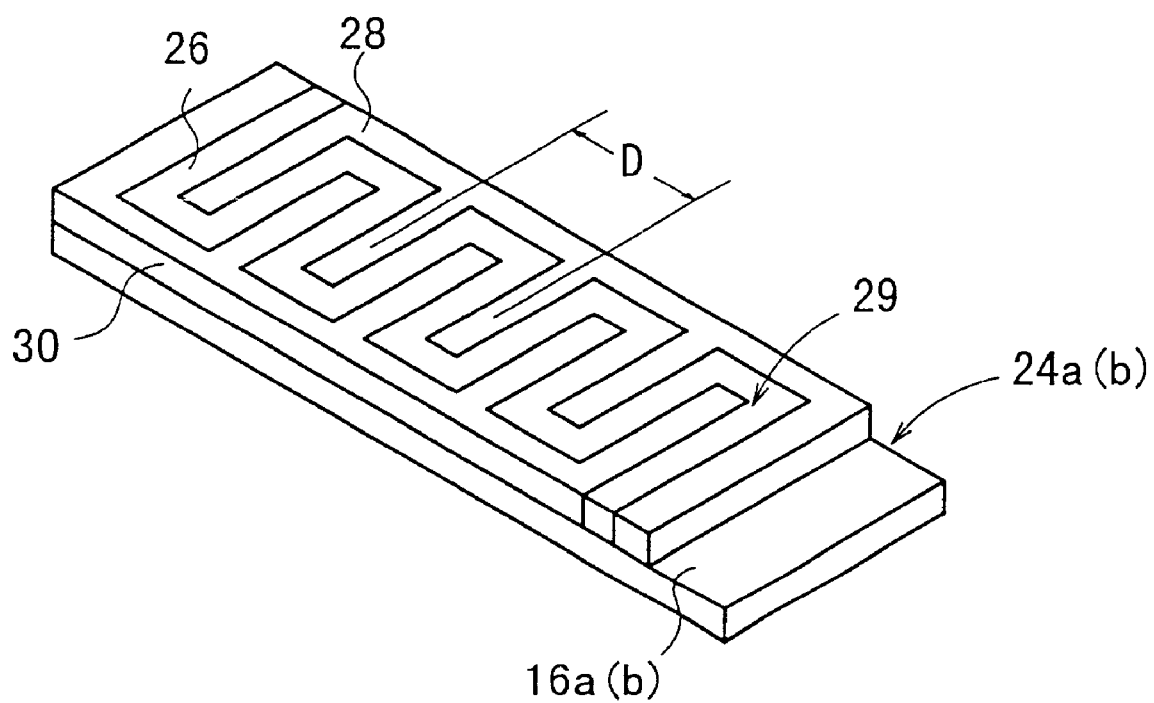
FIG. 12 shows, with partial omission, still another embodiment of the piezoelectric/electrostrictive element.

On the other hand, in the piezoelectric/electrostrictive element 24a, 24b shown in FIG. 12, the pair of electrodes 28, 30 having a comb-shaped structure are formed so that they are embedded in the piezoelectric/electrostrictive layer 26. In this structure, the first electrode 28 and the second electrode 30 are mutually opposed to one another in an alternate manner with a gap 29 having a constant width interposed therebetween.

The piezoelectric/electrostrictive elements 24a, 24b as shown in FIGS. 11 and 12 can be preferably used for the piezoelectric/electrostrictive device 10A according to the first embodiment as well. When the pair of comb-shaped electrodes 28, 30 are used as in the piezoelectric/electrostrictive elements 24a, 24b shown in FIGS. 11 and 12, the displacement of the piezoelectric/electrostrictive element 24a, 24b can be increased by decreasing the pitch D of the comb teeth of the respective electrodes 28, 30.

Figure 13:
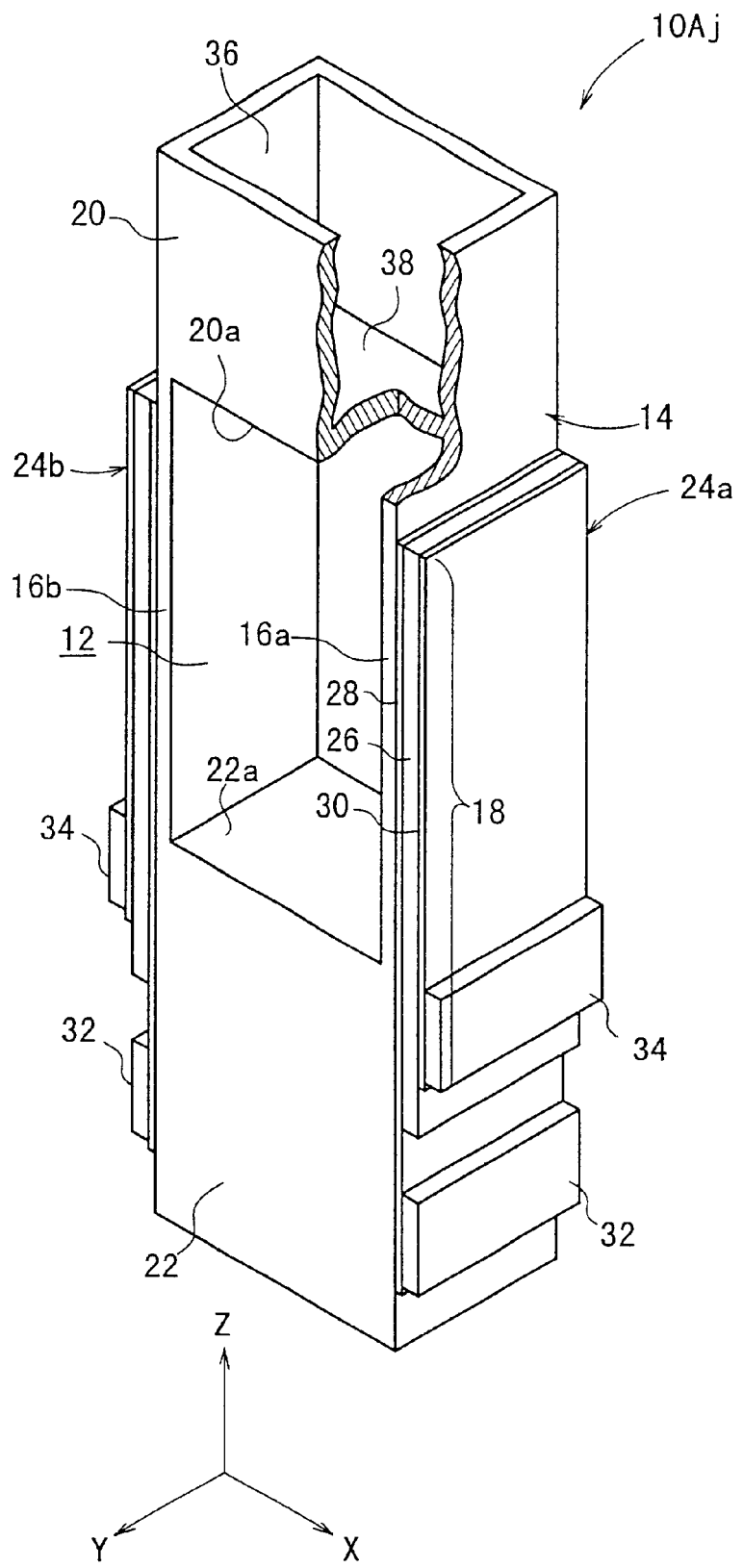
FIG. 13 shows a perspective view illustrating an arrangement of a piezoelectric/electrostrictive device according to a tenth modified embodiment.

Alternatively, as in a piezoelectric/electrostrictive device 10Aj according to a tenth modified embodiment shown in FIG. 13, it is also preferable that a partition 38 is provided between the cutout 36 and the hole 12. This arrangement provides an effect equivalent to that obtained in the case in which the cutout 36 formed for the movable section 20 is the through-hole (for example, see FIG. 1). Further, when various members or parts are inserted into the cutout 36 to be fixed thereto, the member or the part is easily positioned by the aid of the partition 38. It is possible to reduce the dispersion of the characteristic of the final product. Further, it is possible to utilize the five surfaces as the bonding and fixing surface. Thus, the reliability is improved concerning the attachment of the member or the part.

Figure 14:
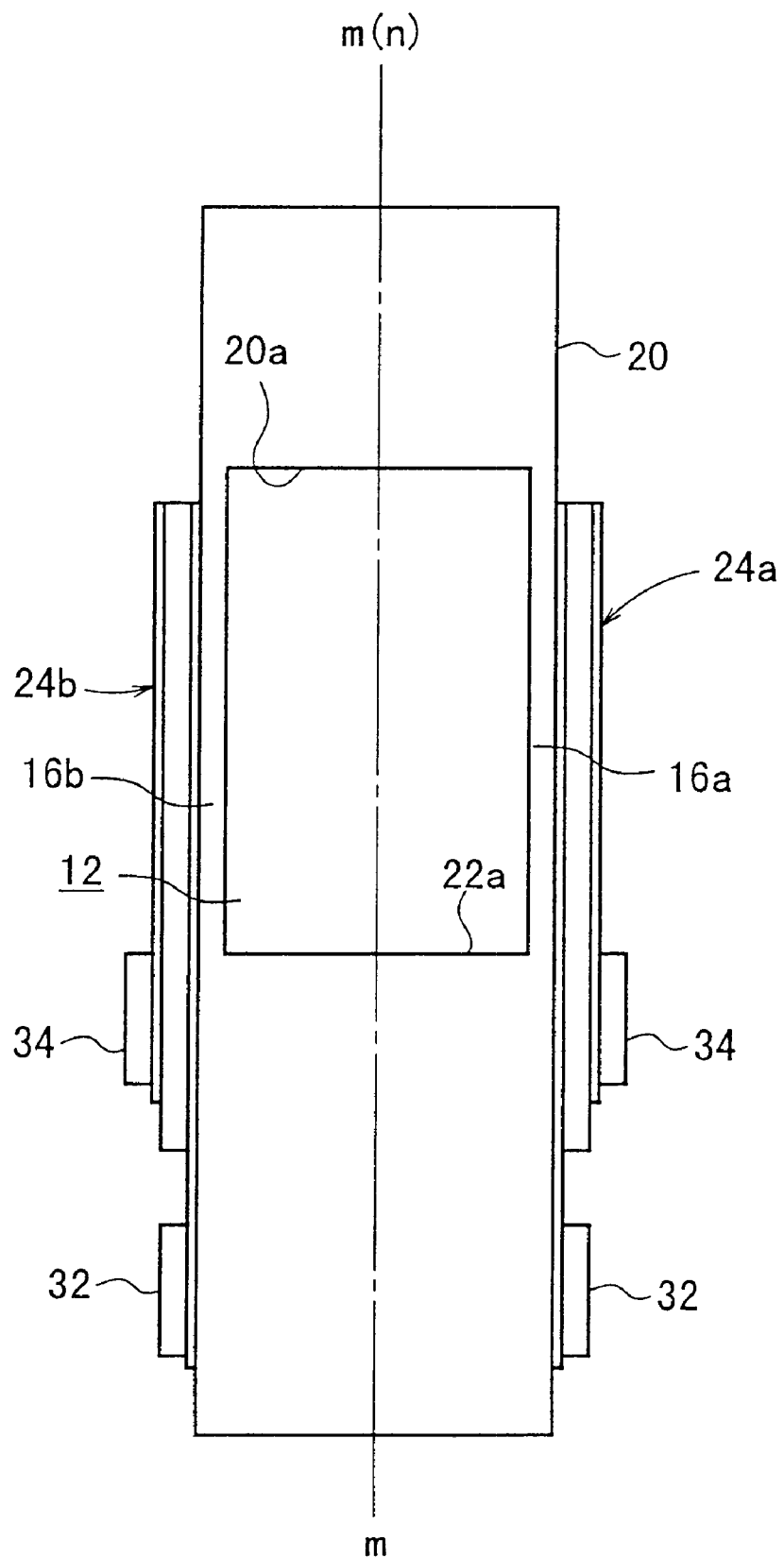
FIG. 14 illustrates a situation in which both of the piezoelectric/electrostrictive elements do not make the displacement action in the piezoelectric/electrostrictive device according to the first embodiment.

The operation of the piezoelectric/electrostrictive device 10A according to the first embodiment will now be explained. At first, for example, when the two piezoelectric/electrostrictive elements 24a, 24b are in the natural state, namely when both of the piezoelectric/electrostrictive elements 24a, 24b do not make the displacement action, then the major axis m of the piezoelectric/electrostrictive device 10A (major axis of the fixation section 22) is substantially coincident with the central axis n of the movable section 20 as shown in FIG. 14.

Starting from this state, for example, a sine wave Wa, which has a predetermined bias electric potential Vb, is applied to the pair of electrodes 28, 30 of the first piezoelectric/electrostrictive element 24a as shown in a waveform figure shown in FIG. 15A, while a sine wave Wb, which has a phase different from that of the sine wave Wa by about 180°, is applied to the pair of electrodes 28, 30 of the second piezoelectric/electrostrictive element 24b as shown in FIG. 15B.

Figure 16:
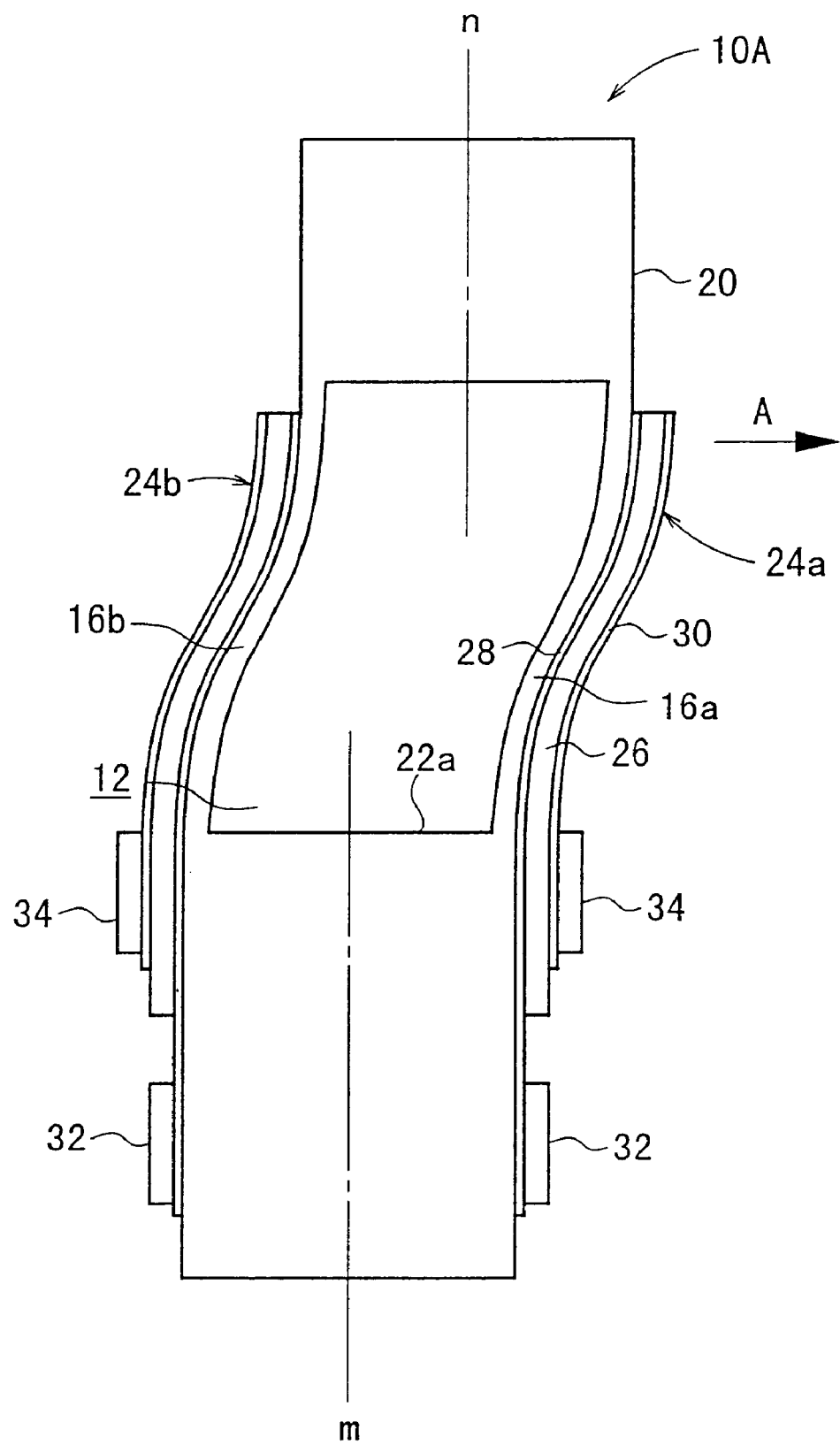
FIG. 16 illustrates a situation in which the piezoelectric/electrostrictive element makes the displacement action in the piezoelectric/electrostrictive device according to the first embodiment.

The piezoelectric/electrostrictive layer 26 of the first piezoelectric/electrostrictive element 24a makes the contraction displacement in the direction of the first principal surface at a stage at which, for example, a voltage having a maximum value is applied to the pair of electrodes 28, 30 of the first piezoelectric/electrostrictive element 24a. Accordingly, as shown in FIG. 16, for example, the stress is generated for the first thin plate section 16a to bend the thin plate section 16a, for example, in the rightward direction as shown by the arrow A. Therefore, the first thin plate section 16a is bent in the rightward direction. At this time, a state is given, in which no voltage is applied to the pair of electrodes 28, 30 of the second piezoelectric/electrostrictive element 24b. Therefore, the second thin plate section 16b follows the bending of the first thin plate section 16a, and it is bent in the rightward direction. As a result, the movable section 20 is displaced, for example, in the rightward direction with respect to the major axis m of the piezoelectric/electrostrictive device 10A. The displacement amount is changed depending on the maximum value of the voltage applied to each of the piezoelectric/electrostrictive elements 24a, 24b. For example, the larger the maximum value is, the larger the displacement amount is.

Especially, when a material having coercive electric field is applied as the constitutive material for the piezoelectric/electrostrictive layer 26, it is also preferable that the bias electric potential is adjusted so that the level of the minimum value is a slightly negative level as depicted by waveforms indicated by dashed lines in FIGS. 15A and 15B. In this case, for example, the stress, which is in the same direction as the bending direction of the first thin plate section 16a, is generated in the second thin plate section 16b by driving the piezoelectric/electrostrictive element (for example, the second piezoelectric/electrostrictive element 24b) to which the negative level is applied. Accordingly, it is possible to further increase the displacement amount of the movable section 20. In other words, when the waveforms indicated by the dashed lines in FIGS. 15A and 15B are used, the device is allowed to have such a function that the piezoelectric/electrostrictive element 24b or 24a, to which the negative level is applied, supports the piezoelectric/electrostrictive element 24a or 24b which principally makes the displacement action.

In the case of the piezoelectric/electrostrictive device 10Af shown in FIG. 7, the voltage (see the sine waveform Wa) shown in FIG. 15A is applied, for example, to the piezoelectric/electrostrictive element 24a1 and the piezoelectric/electrostrictive element 24b2 which are arranged on the diagonal line, and the voltage (see the sine waveform Wb) shown in FIG. 15B is applied to the other piezoelectric/electrostrictive element 24a2 and the other piezoelectric/electrostrictive element 24b1.

As described above, in the piezoelectric/electrostrictive device 10A according to the first embodiment, the minute displacement of the piezoelectric/electrostrictive element 24a, 24b is amplified into the large displacement action by utilizing the bending of the thin plate section 16a, 16b, and it is transmitted to the movable section 20. Accordingly, it is possible to greatly displace the movable section 20 with respect to the major axis m of the piezoelectric/electrostrictive device 10A.

Especially, in the first embodiment, the movable section 20 is provided with the cutout 36 (through-hole 36 in this case) to realize a light weight of the movable section 20. Therefore, it is possible to increase the resonance frequency without decreasing the displacement amount of the movable section 20.

The frequency herein indicates the frequency of the voltage waveform obtained when the movable section 20 is displaced rightwardly and leftwardly by alternately switching the voltage applied to the pair of electrodes 28, 30. The resonance frequency indicates the maximum frequency at which the displacement action of the movable section 20 can follow in a predetermined vibration mode.

In the piezoelectric/electrostrictive device 10A according to the first embodiment, the movable section 20, the thin plate sections 16a, 16b, and the fixation section 22 are integrated into one unit. It is unnecessary that all of the parts are formed with the relatively fragile and heavy piezoelectric/electrostrictive material. Therefore, the device has the following advantages. That is, the device has a high mechanical strength, and it is excellent in handling performance, shock resistance, and moisture resistance. Further, the operation of the device is scarcely affected by harmful vibrations (for example, noise vibrations and remaining vibrations during high speed operation).

In the first embodiment, the piezoelectric/electrostrictive element 24a, 24b is constructed to have the piezoelectric/electrostrictive layer 26 and the pair of electrodes 28, 30 formed on both sides of the piezoelectric/electrostrictive layer 26. The first electrode 28 is formed on at least the outer surface of the thin plate section 16a, 16b. Therefore, the vibration caused by the piezoelectric/electrostrictive element 24a, 24b can be efficiently transmitted to the movable section 20 via the thin plate section 16a, 16b. Thus, it is possible to improve the response performance.

In the first embodiment, the portion (substantial driving portion 18), at which the pair of electrodes 28, 30 are overlapped with each other with the piezoelectric/electrostrictive layer 26 interposed therebetween, is continuously formed over the range from a part of the fixation section 22 to a part of the thin plate section 16a, 16b. If the substantial driving portion 18 is formed to further extend over a part of the movable section 20, then it is feared that the displacement action of the movable section 20 is restricted by the substantial driving portion 18, and it is impossible to obtain the large displacement. However, in the first embodiment, the substantial driving portion 18 is formed such that it does not range over both of the movable section 20 and the fixation section 22. Therefore, it is possible to avoid the inconvenience of the restriction of the displacement action of the movable section 20, and it is possible to increase the displacement amount of the movable section 20.

On the other hand, when the piezoelectric/electrostrictive element 24a, 24b is formed on the part of the movable section 20, it is preferable that the substantial driving portion 18 is located over a range from a part of the movable section 20 to a part of the thin plate section 16a, 16b, because of the following reason. That is, if the substantial driving portion 18 is formed to extend up to a part of the fixation section 22, the displacement action of the movable section 20 is restricted as described above.

Next, explanation will be made for the preferred illustrative constructions of the piezoelectric/electrostrictive device 10A according to the first embodiment.

At first, in order to ensure the displacement action of the movable section 20, it is preferable that the distance g, by which the substantial driving portion 18 of the piezoelectric/electrostrictive element 24a, 24b is overlapped with the fixation section 22 or the movable section 20, is not less than ½ of the thickness d of the thin plate section 16a, 16b.

The device is constructed such that the ratio a/b between the distance (distance in the X axis direction) a between the inner walls of the thin plate sections 16a, 16b and the width (distance in the Y axis direction) b of the thin plate section 16a, 16b is 0.5 to 20. The ratio a/b is preferably 1 to 10 and more preferably 2 to 8. The prescribed value of the ratio a/b is prescribed on the basis of the discovery that the displacement amount of the movable section 20 can be increased, and the displacement in the X-Z plane can be dominantly obtained.

On the other hand, it is desirable that the ratio e/a between the length (distance in the Z axis direction) e of the thin plate section 16a, 16b and the distance a between the inner walls of the thin plate sections 16a, 16b is preferably 0.5 to 10 and more preferably 0.7 to 5. The prescribed value of the ratio e/a is prescribed on the basis of the discovery that the displacement amount of the movable section 20 can be increased, and the displacement action can be performed at a high resonance frequency (high response speed can be achieved).

Therefore, in order to suppress the flapping displacement in the Y axis direction or the vibration of the piezoelectric/electrostrictive device 10A according to the first embodiment and provide a structure in which a high speed response performance is excellent and a large displacement is simultaneously obtained at a relatively low voltage, it is preferable that the ratio a/b is 0.5 to 20 and the ratio e/a is 0.5 to 10, and it is more preferable that the ratio a/b is 1 to 10 and the ratio e/a is 0.7 to 5.

Further, it is preferable that the hole 12 is filled with a gel material, for example, silicone gel. Usually, the displacement action of the movable section 20 is restricted by the presence of such a filler material. However, in the first embodiment, it is intended to realize the light weight brought about by the formation of the cutout 36 for the movable section 20 and increase the displacement amount of the movable section 20. Therefore, the restriction of the displacement action of the movable section 20 due to the filler material is counteracted. Accordingly, it is possible to realize the effect owing to the presence of the filler material, namely the realization of the high resonance frequency and the maintenance of the rigidity.

It is preferable that the length (distance in the Z axis direction) f of the movable section 20 is short, because of the following reason. That is, it is possible to realize the light weight and increase the resonance frequency by shortening the length. However, in order to ensure the rigidity of the movable section 20 in the X axis direction and obtain its reliable displacement, it is desirable that the ratio f/d with respect to the thickness d of the thin plate section 16a, 16b is not less than 3 and preferably not less than 10.

The actual size of each component is determined considering, for example, the joining area for attaching the part to the movable section 20, the joining area for attaching the fixation section 22 to another member, the joining area for attaching the electrode terminal or the like, and the strength, the durability, the necessary displacement amount, the resonance frequency, and the driving voltage of the entire piezoelectric/electrostrictive device 10A.

Specifically, for example, the distance a between the inner walls of the thin plate sections 16a, 16b is preferably 100 $\mu$m to 2000 $\mu$m and more preferably 200 $\mu$m to 1000 $\mu$m. The width b of the thin plate section 16a, 16b is preferably 50 $\mu$m to 2000 $\mu$m and more preferably 100 $\mu$m to 500 $\mu$m. The thickness d of the thin plate section 16a, 16b is preferably 2 $\mu$m to 100 $\mu$m and more preferably 4 $\mu$m to 50 $\mu$m, while it satisfies b>d in relation to the width b of the thin plate section 16a, 16b, in order to make it possible to effectively suppress the flapping displacement which is the displacement component in the Y axis direction.

The length e of the thin plate section 16a, 16b is preferably 200 $\mu$m to 3000 $\mu$m and more preferably 300 $\mu$m to 2000 $\mu$m. The length f of the movable section 20 is preferably 50 $\mu$m to 2000 $\mu$m and more preferably 100 $\mu$m to 1000 $\mu$m.

The arrangement as described above exhibits such an extremely excellent effect that the displacement in the Y axis direction does not exceed 10% with respect to the displacement in the X axis direction, while the device can be driven at a low voltage by appropriately making adjustment within the range of the size ratio and the actual size, and it is possible to suppress the displacement component in the Y axis direction to be not more than 5%. In other words, the movable section 20 is displaced in one axis direction, i.e., substantially in the X axis direction. Further, the high speed response is excellent, and it is possible to obtain a large displacement at a relatively low voltage.

In the piezoelectric/electrostrictive device 10A, the shape of the device is not a plate-shaped configuration (i.e., unlike a conventional device). Each of the movable section 20 and the fixation section 22 has a rectangular parallelepiped-shaped configuration. The pair of thin plate sections 16a, 16b are provided so that the side surface of the movable section 20 is continuous to the side surface of the fixation section 22. Therefore, it is possible to selectively increase the rigidity of piezoelectric/electrostrictive device 10A in the Y axis direction.

That is, in the piezoelectric/electrostrictive device 10A, it is possible to selectively generate only the operation of the movable section 20 in the plane (XZ plane). It is possible to suppress the operation of the movable section 20 in the YZ plane (operation in the so-called flapping direction).

Next, explanation will be made for the respective constitutive components of the piezoelectric/electrostrictive device 10A according to the first embodiment.

As described above, the movable section 20 is the portion which is operated on the basis of a driving amount of the thin plate section 16a, 16b, and a variety of members are attached thereto depending on the purpose of use of the piezoelectric/electrostrictive device 10A. For example, when the piezoelectric/electrostrictive device 10A is used as a displacement element, a shield plate for an optical shutter or the like is attached thereto. Especially, when the piezoelectric/electrostrictive device 10A is used for a mechanism for positioning a magnetic head of a hard disk drive or for suppressing a ringing, a member required to be positioned is attached thereto, including, for example, the magnetic head, a slider provided with the magnetic head, and a suspension provided with the slider.

When the movable section 20 is constructed to have the cutout 36 including the through-hole as shown in FIGS. 1 to 10, then the rigidity of the movable section 20 can be appropriately decreased, and the displacement in the X axis direction can be effectively increased without increasing the flapping displacement (displacement in the Y axis direction).

Further, a variety of members may be inserted and attached to the cutout 36 including the through-hole. Accordingly, an advantage is obtained such that the fixing and bonding area for the member can be increased and the reliability of joining is enhanced, and/or an advantage is obtained such that it is possible to make the thickness to be thin or realize a small size of the piezoelectric/electrostrictive device attached with a variety of members.

As described above, the fixation section 22 is the portion for supporting the thin plate sections 16a, 16b and the movable section 20. For example, when the fixation section 22 is utilized to position the magnetic head of the hard disk drive, the entire piezoelectric/electrostrictive device 10A is fixed by supporting and securing the fixation section 22, for example, to a carriage arm attached to VCM (voice coil motor) or a fixation plate or a suspension attached to the carriage arm. As shown in FIG. 1, the terminals 32, 34 for driving the piezoelectric/electrostrictive elements 24a, 24b and other members are arranged on the fixation section 22 in some cases.

The material for constructing the movable section 20 and the fixation section 22 is not specifically limited provided that it has rigidity. However, it is possible to preferably use ceramics to which the ceramic green sheet-laminating method is applicable as described later on. Specifically, the material includes, for example, materials containing a major component of zirconia represented by fully stabilized zirconia and partially stabilized zirconia, alumina, magnesia, silicon nitride, aluminum nitride, and titanium oxide, as well as materials containing a major component of a mixture of them. However, in view of a high mechanical strength and a high toughness, it is preferable to use a material containing a major component of zirconia, especially fully stabilized zirconia and a material containing a major component of partially stabilized zirconia. The metal material is not limited provided that it has rigidity. However, the metal material includes, for example, stainless steel and nickel.

As described above, the thin plate section 16a, 16b is a portion which is driven in accordance with the displacement of the piezoelectric/electrostrictive element 24a, 24b. The thin plate section 16a, 16b is the thin plate-shaped member having flexibility, and it functions to amplify the expansion and contracting displacement of the piezoelectric/electrostrictive element 24a, 24b arranged on the surface as the bending displacement and transmit the displacement to the movable section 20. Therefore, all that is required of the shape or the material of the thin plate section 16a, 16b is that it provides enough flexibility and mechanical strength of such a degree that it is not broken from the bending displacement action. It is possible to make the appropriate selection considering the response performance and the operability of the movable section 20.

It is preferable that the thickness d of the thin plate section 16a, 16b is preferably about 2 $\mu$m to 100 $\mu$m. it is preferable that the combined thickness of the thin plate section 16a (or 16b) and the piezoelectric/electrostrictive element 24a (or 24b) is 7 $\mu$m to 500 $\mu$m. It is preferable that the thickness of the electrode 28, 30 is 0.1 to 50 $\mu$m, and the thickness of the piezoelectric/electrostrictive layer 26 is 3 to 300 $\mu$m. The width b of the thin plate section 16a, 16b is preferably 50 $\mu$m to 2000 $\mu$m.

Preferably, the thin plate sections 16a and 16b are fabricated with ceramic materials similar to those selected for use in the movable section 20 and the fixation section 22. A material containing a major component of zirconia, especially fully stabilized zirconia and a material containing a major component of partially stabilized zirconia are most preferably used, because the mechanical strength is large even in the case of a thin wall thickness, the toughness is high, and the reactivity with the piezoelectric/electrostrictive layer and the electrode material is small.

When the thin plate section 16a, 16b is made of a metal material, it is enough that the metal material has flexibility and the metal material is capable of bending displacement as described above. However, preferably, it is desirable that the thin plate section 16a, 16b is made of an iron-based material such as various stainless steel materials and various spring steel materials. Alternatively, it is desirable that the thin plate section 16a, 16b is made of a non-ferrous material such as beryllium copper, phosphor bronze, nickel, and nickel-iron alloy.

Those which are fully stabilized or partially stabilized as follows are preferably used as fully stabilized zirconia or partially stabilized zirconia as described above. That is, the compound to be used for fully stabilizing or partially stabilizing zirconia includes yttrium oxide, ytterbium oxide, cerium oxide, calcium oxide, and magnesium oxide. When at least one compound of them is added and contained, zirconia is partially or fully stabilized. However, as for the stabilization, the objective zirconia can be stabilized not only by adding one type of the compound but also by adding a combination of the compounds.

The amount of addition of each of the compounds is desirably as follows. That is, yttrium oxide or ytterbium oxide is added by 1 to 30 mole %, preferably 1.5 to 10 mole %. Cerium oxide is added by 6 to 50 mole %, preferably 8 to 20 mole %. Calcium oxide or magnesium oxide is added by 5 to 40 mole %, preferably 5 to 20 mole %. Especially, it is preferable to use yttrium oxide as a stabilizer. In this case, yttrium oxide is desirably added by 1.5 to 10 mole %, more preferably 2 to 4 mole %. For example, alumina, silica, or transition metal oxide may be added as an additive of sintering aid or the like in a range of 0.05 to 20% by weight. However, when the sintering integration based on a film formation method is adopted as a technique for forming the piezoelectric/electrostrictive element 24a, 24b, it is also preferable to add, for example, alumina, magnesia, and transition metal oxide as an additive.

In order to obtain the mechanical strength and the stable crystal phase, it is desirable that the average crystal grain size of zirconia is 0.05 to 3 μm, preferably 0.05 to 1 μm. As described above, ceramics can be used for the thin plate section 16a, 16b in the same manner as in the movable section 20 and the fixation section 22. Preferably, it is advantageous to construct the thin plate sections 16a, 16b with a substantially identical material in view of the reliability of the joined portion and the strength of the piezoelectric/electrostrictive device 10A, in order to reduce any complicated procedure of the production.

The piezoelectric/electrostrictive element 24a, 24b has at least the piezoelectric/electrostrictive layer 26 and the pair of electrodes 28, 30 for applying the electric field to the piezoelectric/electrostrictive layer 26. It is possible to use, for example, piezoelectric/electrostrictive elements of the unimorph type and the bimorph type. However, those of the unimorph type are suitable for the piezoelectric/electrostrictive device 10A as described above, because they are excellent in stability of the generated displacement amount and they are advantageous to realize a light weight.

For example, as shown in FIG. 1, it is possible to preferably use, for example, the piezoelectric/electrostrictive element comprising the first electrode 28, the piezoelectric/electrostrictive layer 26, and the second electrode 30 which are stacked in a layered configuration. Additionally, it is also preferable to provide a multiple stage structure as shown in FIGS. 5 to 9.

As shown in FIG. 1, the piezoelectric/electrostrictive element 24a, 24b is preferably formed on the outer surface side of the piezoelectric/electrostrictive device 10A in view of the fact that the thin plate sections 16a, 16b can be driven to a greater extent. However, the piezoelectric/electrostrictive element 24a, 24b may be formed on the inner surface side of the piezoelectric/electrostrictive device 10A, i.e., on the inner wall surface of the hole 12 depending on, for example, the form of use. Alternatively, the piezoelectric/electrostrictive elements 24a, 24b may be formed both on the outer surface side and on the inner surface side of the piezoelectric/electrostrictive device 10A.

A piezoelectric ceramic material is preferably used for the piezoelectric/electrostrictive layer 26. However, it is also possible to use electrostrictive ceramics, ferroelectric ceramics, or anti-ferroelectric ceramics. However, when the piezoelectric/electrostrictive device 10A is used, for example, to position a magnetic head of a hard disk drive, it is important to provide the linearity concerning the displacement amount of the movable section 20 and the driving voltage or the output voltage. Therefore, it is preferable to use a material having small strain hysteresis. It is preferable to use a material having a coercive electric field of not more than 10 kV/mm.

Specified materials include ceramics containing, for example, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate singly or in mixture.

Especially, a material containing a major component of lead zirconate, lead titanate, and lead magnesium niobate, or a material containing a major component of sodium bismuth titanate is preferably used, in order to obtain the product having a stable composition with a high electromechanical coupling factor and a piezoelectric constant and with a small reactivity with the thin plate sections 16a, 16b (ceramics) during the sintering of the piezoelectric/electrostrictive layer 26.

It is also preferable to use ceramics obtained by adding, to the material described above, for example, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and stannum singly or in mixture.

For example, when lanthanum and/or strontium is contained in the major components of lead zirconate, lead titanate, and lead magnesium niobate, an advantage is obtained in some cases, for example, in such a way that the coercive electric field and the piezoelectric characteristic can be adjusted.

It is desirable to avoid the addition of a material such as silica which tends to form glass, because of the following reason. That is, a material such as silica tends to react with the piezoelectric/electrostrictive material during the heat treatment for the piezoelectric/electrostrictive layer 26. As a result, the composition is varied, and the piezoelectric characteristic is deteriorated.

On the other hand, it is preferable that the pair of electrodes 28, 30 of the piezoelectric/electrostrictive element 24a, 24b are made of metal which is solid at room temperature and which is excellent in conductivity. For example, it is possible to use metal simple substance or alloy of, for example, aluminum, titanium, chromium, iron, cobalt, nickel, copper, zinc, niobium, molybdenum, ruthenium, palladium, rhodium, silver, stannum, tantalum, tungsten, iridium, platinum, gold, and lead. It is also preferable to use a cermet material obtained by dispersing, in the metal described above, the same material as that of the piezoelectric/electrostrictive layer 26 or the thin plate section 16a, 16b.

The material for the electrodes 28, 30 of the piezoelectric/electrostrictive element 24a, 24b is selected and determined depending on the method for forming the piezoelectric/electrostrictive layer 26. For example, when the piezoelectric/electrostrictive layer 26 is formed by sintering on the first electrode 28 after the first electrode 28 is formed on the thin plate section 16a, 16b, it is necessary for the first electrode 28 to use high melting point metal such as platinum, palladium, platinum-palladium alloy, and silver-palladium alloy which does not change at the sintering temperature for the piezoelectric/electrostrictive layer 26. However, the electrode formation can be performed at a low temperature for the second electrode 30 which is formed on the piezoelectric/electrostrictive layer 26 after forming the piezoelectric/electrostrictive layer 26. Therefore, it is possible for the second electrode 30 to use low melting point metal such as aluminum, gold, and silver.

The thickness of the electrode 28, 30 also serves as a factor to considerably decrease the displacement of the piezoelectric/electrostrictive element 24a, 24b. Therefore, it is preferable, especially for the electrode formed after the sintering of the piezoelectric/electrostrictive layer 26, to use organic metal paste capable of obtaining a dense and thinner film after the sintering, for example, a material such as gold resinate paste, platinum resinate paste, and silver resinate paste.

Next, explanation will be made with reference to FIGS. 17A to 26 for several methods for producing the piezoelectric/electrostrictive device 10A according to the first embodiment.

Ceramic materials are preferably used for the constitutive material for each of the members of the piezoelectric/electrostrictive device 10A according to the first embodiment. It is preferable that the constitutive elements of the piezoelectric/electrostrictive device 10A concerning the substrate 14 except for the piezoelectric/electrostrictive elements 24a, 24b, i.e., the thin plate sections 16a, 16b, the fixation section 22, and the movable section 20 are produced by using a ceramic green sheet-laminating method. On the other hand, it is preferable that the piezoelectric/electrostrictive elements 24a, 24b as well as the respective terminals 32, 34 are produced by using a film formation method, for example, for the thin film and the thick film.

According to the ceramic green sheet-laminating method in which the respective members of the substrate 14 of the piezoelectric/electrostrictive device 10A can be formed in an integrated manner, the time-dependent change of state scarcely occurs at the joined portions of the respective members. Therefore, this method provides the high reliability of the joined portion, and it is advantageous to ensure the rigidity.

In the piezoelectric/electrostrictive device 10A according to the first embodiment, the boundary portion (joined portion) between the thin plate section 16a, 16b and the fixation section 22 and the boundary portion (joined portion) between the thin plate section 16a, 16b and the movable section 20 function as supporting points for expressing the displacement. Therefore, the reliability of the joined portion is an important point which dominates the characteristic of the piezoelectric/electrostrictive device 10A.

The production methods described below are excellent in reproducibility and formability. Therefore, it is possible to obtain the piezoelectric/electrostrictive device 10A having a predetermined shape within a short period of time with good reproducibility.

A first production method for the piezoelectric/electrostrictive device 10A according to the first embodiment will be specifically explained below. The following definitions are now made. The laminate, which is obtained by laminating the ceramic green sheets, is defined to be the ceramic green laminate 58 (see, for example, FIG. 17B). The integrated matter, which is obtained by sintering the ceramic green laminate 58, is defined to be the ceramic laminate 60 (see, for example, FIG. 18). The integrated matter comprising the movable section 20, the thin plate sections 16a, 16b, and the fixation section 22, which is obtained by cutting off unnecessary portions from the ceramic laminate 60, is defined to be the ceramic substrate 14C (see FIG. 19).

In the first production method, the ceramic laminate 60 is finally cut into chip units to produce a large number of piezoelectric/electrostrictive devices 10A. However, in order to simplify the explanation, description will be made principally for the case in which one individual of piezoelectric/electrostrictive device 10A is produced.

At first, for example, a binder, a solvent, a dispersing agent, and a plasticizer are added and mixed with a ceramic powder such as zirconia to prepare a slurry. The slurry is subjected to a degassing treatment, and then a ceramic green sheet having a predetermined thickness is prepared in accordance with, for example, a reverse roll coater method and a doctor blade method.

Figure 17B:
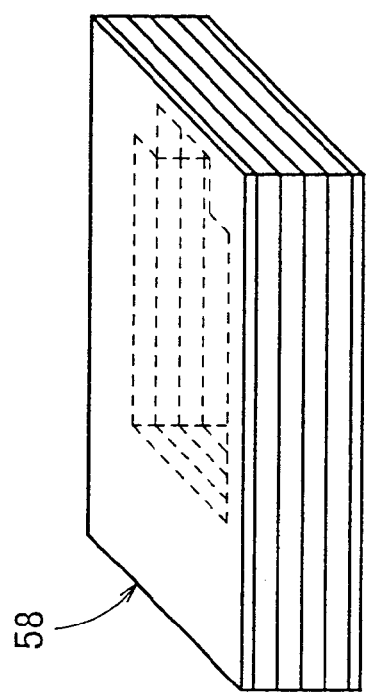
FIG. 17B illustrates a state in which a ceramic green laminate is formed.
Figure 17A:
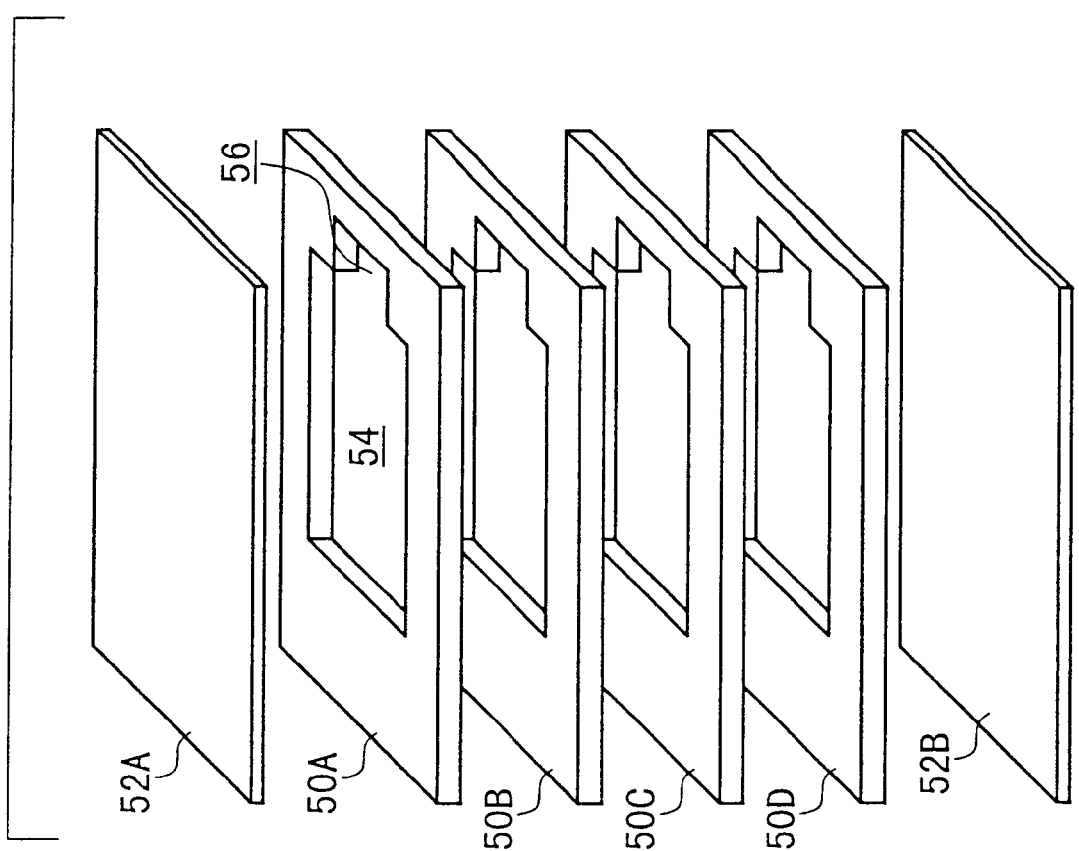
FIG. 17A illustrates a process for laminating ceramic green sheets required when the piezoelectric/electrostrictive device according to the first embodiment is produced in accordance with a first production method.

Subsequently, the ceramic green sheet is processed into those having various shapes as shown in FIG. 17A in accordance with, for example, a method such as a punching out based on a die and a laser machining method to obtain a plurality of ceramic green sheets 50A to 50D, 52A, 52B for forming the substrate.

The ceramic green sheets 50A to 50D, 52A, 52B include the plurality (for example, four) of ceramic green sheets 50A to 50D each of which is continuously formed with at least a window 54 for forming the hole 12 thereafter and a window 56 for forming the cutout (through-hole 36) thereafter, and the plurality (for example, two) of ceramic green sheets 52A, 52B to be formed into the thin plate sections 16a, 16b thereafter. The numbers of ceramic green sheets referred to above are persistently by way of example.

After that, as shown in FIG. 17B, the ceramic green sheets 50A to 50D, 52A, 52B are stacked and secured under pressure so that the ceramic green sheets 50A to 50D are interposed between the ceramic green sheets 52A, 52B to form a ceramic green laminate 58. Subsequently, the ceramic green laminate 58 is sintered to obtain a ceramic laminate 60 (see FIG. 18).

It is noted that there is no limitation for the number of pressure-securing process or processes and the sequence for the purpose of the laminating and integration into one unit. These factors can be appropriately determined depending on the structure, for example, so that the desired structure is obtained on the basis of, for example, the shape of the windows 54, 56 and the number of ceramic green sheets.

It is unnecessary that the shape of the windows 54, 56 is identical in all cases. The shape of the windows 54, 56 can be determined depending on the desired function. There is also no limitation for the number of ceramic green sheets and the thickness of each of the ceramic green sheets.

In the pressure-securing process, it is possible to further improve the laminating performance by applying the heat. The laminating performance at the boundary of the ceramic green sheet can be improved by providing an auxiliary joining layer, for example, by applying and printing, onto the ceramic green sheet, a paste or a slurry principally containing a ceramic powder (it is preferable to use a composition which is the same as or similar to that of the ceramics used for the ceramic green sheet in order to ensure reliability), and a binder. When the ceramic green sheets 52A, 52B are thin, it is preferable to handle them with a plastic film, especially with a polyethylene terephthalate film coated with a releasing agent based on silicone on the surface.

Figure 18:
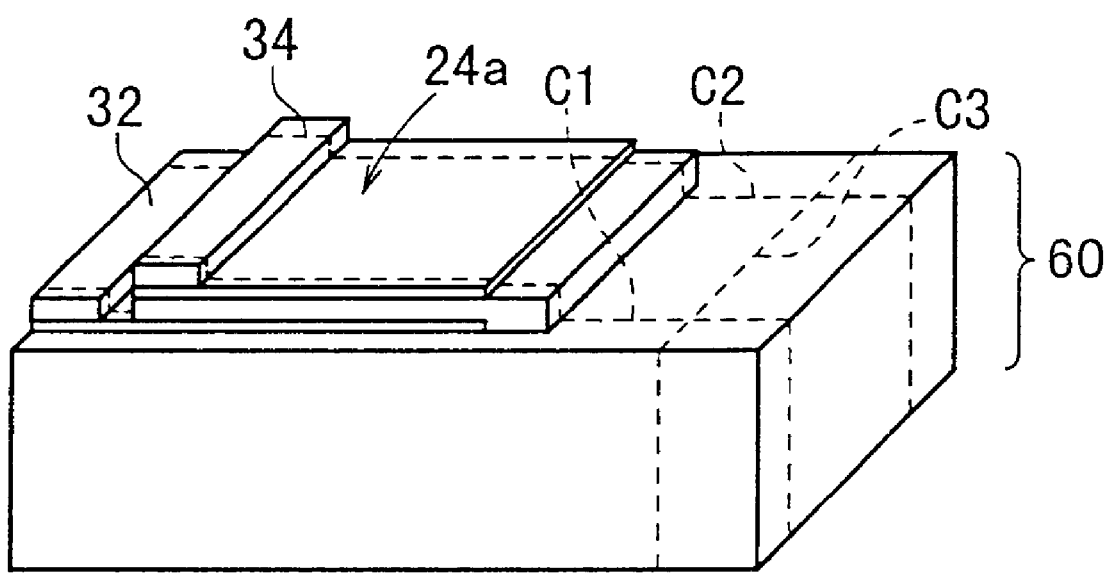
FIG. 18 illustrates a state in which the ceramic green laminate is sintered into a ceramic laminate, and then a piezoelectric/electrostrictive element is formed on the ceramic laminate.

Subsequently, as shown in FIG. 18, the piezoelectric/electrostrictive elements 24a, 24b are formed respectively on both surfaces of the ceramic laminate 60, i.e., on the surfaces corresponding to the surfaces at which the ceramic green sheets 52A, 52B are laminated. Those usable as the method for forming the piezoelectric/electrostrictive elements 24a, 24b include a thick film formation method such as a screen printing method, a dipping method, a coating method, and an electrophoresis method, and a thin film formation method such as an ion beam method, a sputtering method, a vacuum vapor deposition, an ion plating method, a chemical vapor deposition method (CVD), and a plating method.

When the piezoelectric/electrostrictive elements 24a, 24b are formed by using the film formation method as described above, the piezoelectric/electrostrictive elements 24a, 24b and the thin plate sections 16a, 16b can be integrally joined and arranged without using any adhesive. It is possible to ensure the reliability and the reproducibility, and it is easy to form the stack.

In this case, it is preferable that the piezoelectric/electrostrictive elements 24a, 24b are formed by means of a thick film formation method, because of the following reason. That is, especially, when the piezoelectric/electrostrictive layer 26 is formed by using a thick film formation method, the film can be formed by using, for example, a paste, a slurry, a suspension, an emulsion, or a sol containing a major component of particles or powder of piezoelectric ceramics having an average particle size of 0.01 to 5 $\mu$m, preferably 0.05 to 3 $\mu$m. It is possible to obtain good piezoelectric/electrostrictive characteristics by sintering the formed film.

An electrophoresis method is advantageous in that the film can be formed at a high density with a high shape accuracy. A screen printing method is advantageous to simplify the production step, because it is possible to simultaneously perform the film formation and the pattern formation.

Explanation will be specifically made for the formation of the piezoelectric/electrostrictive elements 24a, 24b. At first, the ceramic green laminate 58 is sintered and integrated into one unit at a temperature of 1200° C. to 1600° C. to obtain the ceramic laminate 60. After that, the first electrodes 28 are printed and sintered at predetermined positions on the both surfaces of the ceramic laminate 60. Subsequently, the piezoelectric/electrostrictive layers 26 are printed and sintered. Further, the second electrodes 30 are printed and sintered to form the piezoelectric/electrostrictive elements 24a, 24b. After that, the terminals 32, 34 are printed and sintered in order to electrically connect the respective electrodes 28, 30 to the driving circuit.

In this process, when the materials are selected so that the sintering temperature for each of the members is lowered in accordance with the stacking sequence, for example, when platinum (Pt) is used for the first electrode 28, lead zirconate titanate (PZT) is used for the piezoelectric/electrostrictive layer 26, gold (Au) is used for the second electrode 30, and silver (Ag) is used for the terminals 32, 34, then the material, which has been already sintered beforehand, is not required to be sintered again at a certain sintering stage. Thus, it is possible to avoid the occurrence of inconvenience such as peeling off and aggregation of the electrode material or the like.

When the appropriate materials are selected, it is also possible to successively print the respective members of the piezoelectric/electrostrictive elements 24a, 24b and the terminals 32, 34, followed by a one-time sintering. Further, it is also possible to provide, for example, the respective electrodes 30 at a low temperature after forming the piezoelectric/electrostrictive layers 26.

Alternatively, the respective members of the piezoelectric/electrostrictive elements 24a, 24b and the terminals 32, 34 may be formed by means of a thin film formation method such as a sputtering method and a vapor deposition method. In this case, it is not necessarily indispensable to perform a heat treatment.

When the piezoelectric/electrostrictive elements 24a, 24b are formed, it is also preferable that the piezoelectric/electrostrictive elements 24a, 24b are previously formed on both surfaces of the ceramic green laminate 58, i.e., on the respective surfaces of the ceramic green sheets 52A, 52B, and the ceramic green laminate 58 and the piezoelectric/electrostrictive elements 24a, 24b are simultaneously sintered or co-fired. For example, the following methods are available to perform the co-firing. That is, the sintering may be performed for all of the constitutive films of the ceramic green laminate 58 and the piezoelectric/electrostrictive elements 24a, 24b. The first electrodes 28 and the ceramic green laminate 58 may be co-fired, or the other constitutive films (except for the second electrodes 30 and the ceramic green laminate 58) may be co-fired.

The following method is available to co-fire the piezoelectric/electrostrictive elements 24a, 24b and the ceramic green laminate 58. That is, precursors of the piezoelectric/electrostrictive layers 26 are formed, for example, in accordance with a tape formation method based on the use of a slurry material. The precursors of the piezoelectric/electrostrictive layers 26 before the sintering are laminated on the surfaces of the ceramic green laminate 58, for example, by means of a thermal securing process under pressure, followed by a co-firing to simultaneously produce the movable section 20, the thin plate sections 16a, 16b, the piezoelectric/electrostrictive layers 26, and the fixation section 22. However, in this method, it is necessary to form the electrodes 28 beforehand on the surfaces of the ceramic green laminate 58 or on the piezoelectric/electrostrictive layers 26 by using the film formation method described above.

Another method is also available. That is, the electrodes 28, 30 and the piezoelectric/electrostrictive layers 26, which are the respective constitutive layers of the piezoelectric/electrostrictive elements 24a, 24b, are formed by means of the screen printing on portions to be subsequently formed into at least the thin plate sections 16a, 16b of the ceramic green laminate 58, followed by the co-firing.

The sintering temperature of the constitutive film of the piezoelectric/electrostrictive element 24a, 24b is appropriately determined depending on the material for constructing the same. However, the sintering temperature is generally 500° C. to 1500° C. The sintering temperature is preferably 1000° C. to 1400° C. for the piezoelectric/electrostrictive layer 26. In this case, in order to control the composition of the piezoelectric/electrostrictive layer 26, the sintering is preferably performed in the presence of an evaporation source of the material of the piezoelectric/electrostrictive layer 26. When the piezoelectric/electrostrictive layers 26 and the ceramic green laminate 58 are co-fired, it is necessary to conform the sintering conditions of the both. The piezoelectric/electrostrictive element 24a, 24b is not necessarily formed on the both surfaces of the ceramic laminate 60 or the ceramic green laminate 58. It is of course allowable to form the piezoelectric/electrostrictive element 24a, 24b on only one surface.

Figure 19:
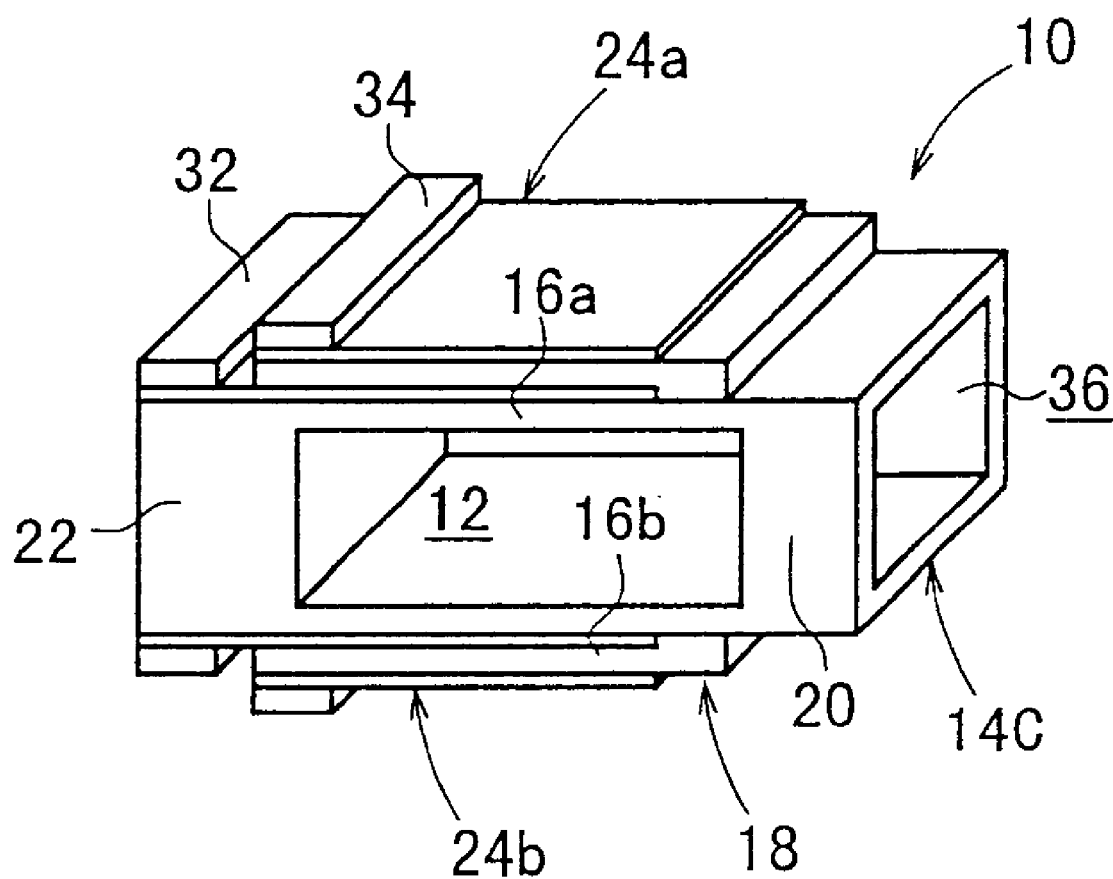
FIG. 19 illustrates a state in which the ceramic laminate is cut along predetermined cutting lines to provide the piezoelectric/electrostrictive device according to the first embodiment.

Subsequently, unnecessary portions are cut off from the ceramic laminate 60 formed with the piezoelectric/electrostrictive elements 24a, 24b as described above. The cutoff positions are located at side portions of the ceramic laminate 60, especially at portions at which the hole 12 based on the window 54 is formed on the side surfaces of the ceramic laminate 60 by means of the cutoff (see cutting lines C1 and C2), and at portions at which the through-hole 36 based on the window 56 is formed at the portion of the movable section 20 of the ceramic laminate 60 by means of the cutoff (see cutting line C3). As a result of the cutoff, as shown in FIG. 19, the piezoelectric/electrostrictive device 10A is completed, which comprises the piezoelectric/electrostrictive elements 24a, 24b formed on the ceramic substrate 14C integrated with the movable section 20 formed with the through-hole 36 in the axial direction, the pair of thin plate sections 16a, 16b, and the fixation section 22.

Those applicable as a cutoff method include a mechanical machining such as a dicing machining and a wire saw machining as well as an electron beam machining and a laser machining based on the use of, for example, the YAG laser and the excimer laser. It is preferable that the heat treatment is performed at 300° to 800° C. for the piezoelectric/electrostrictive device 10A after the cutoff, because of the following reason. That is, any defect such as a microcrack tends to occur in the device as a result of the machining, while the defect can be removed by means of the heat treatment described above, and the reliability is improved. Further, it is preferable to apply the aging treatment by being left to stand for at least 10 hours at a temperature of about 80° C. after the heat treatment, because of the following reason. That is, when the aging treatment is performed, for example, the various stresses, which have been exerted during the production process, can be mitigated to contribute to the improvement in device characteristics.

The first embodiment described above is illustrative of the case in which the movable section 20, the fixation section 22, and the thin plate sections 16a, 16b are formed from a ceramic substrate material 14C. Alternatively, each of the parts may be made of a metal material. Further alternatively, each of the parts may be made to provide a hybrid structure obtained by combining those produced with materials of ceramics and metals. In this case, in order to join the metal materials to one another and/or join the ceramic and metal materials to one another, it is possible to use adhesion with organic resin or glass, brazing, soldering, eutectic bonding, or welding.

Explanation will be made with reference to FIGS. 20A to 26, for example, for production methods (second and third production methods) for piezoelectric/electrostrictive devices (piezoelectric/electrostrictive devices 10Ak and 10Am according to eleventh and twelfth modified embodiments) having a hybrid structure in which the movable section 20 and the fixation section 22 are made of ceramic materials, and the thin plate sections 16a, 16b are made of metal materials. The substrate containing metal and ceramics, which is produced by the second and third production methods, is referred to as the substrate 14D.

Figure 20B:
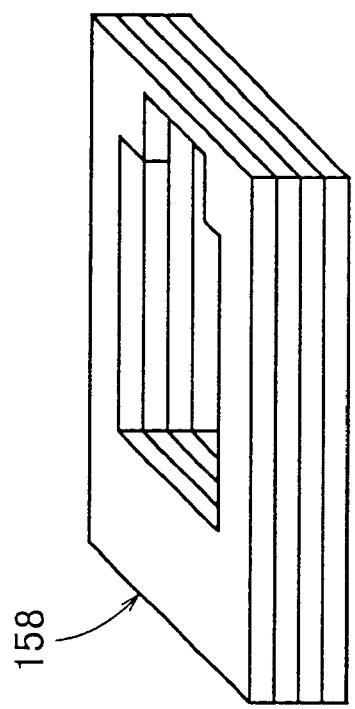
FIG. 20B illustrates a state in which a ceramic green laminate is formed.
Figure 20A:
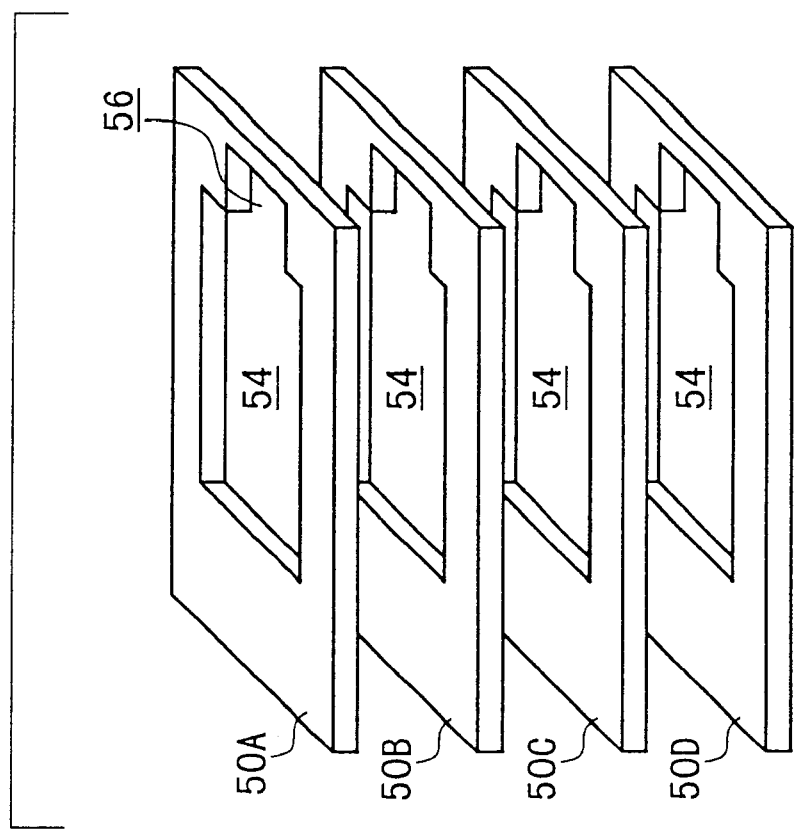
FIG. 20A illustrates a process for laminating ceramic green sheets required when the piezoelectric/electrostrictive device according to an eleventh modified embodiment is produced in accordance with a second production method.

In the second production method, at first, as shown in FIG. 20A, a plurality (for example, four) of frame-shaped ceramic green sheets 50A to 50D each of which is continuously formed with at least a window 54 for forming the hole 12 thereafter and a window 56 for forming the cutout (through-hole 36) thereafter are prepared.

After that, as shown in FIG. 20B, the ceramic green sheets 50A to 50D are laminated and secured under pressure to form a ceramic green laminate 158. After that, as shown in FIG. 21A, the ceramic green laminate 158 is sintered to obtain a ceramic laminate 160. At this stage, the ceramic laminate 160 is formed such that the hole 130 is formed by the windows 54, 56.

Subsequently, as shown in FIG. 21B, the piezoelectric/electrostrictive elements 24a, 24b, which are constructed as separate members, are respectively bonded with an epoxy adhesive to the surfaces of metal plates 152A, 152B to serve as the thin plate sections. The separate members of the piezoelectric/electrostrictive elements 24a, 24b can be formed, for example, in accordance with the ceramic green sheet-laminating method and the screen printing method.

Subsequently, the metal plates 152A, 152B are bonded to the ceramic laminate 160 with the epoxy adhesive so that the ceramic laminate 160 is interposed between the metal plates 152A, 152B and the hole 130 is closed thereby to provide a hybrid laminate 162 (see FIG. 22).

Figure 22:
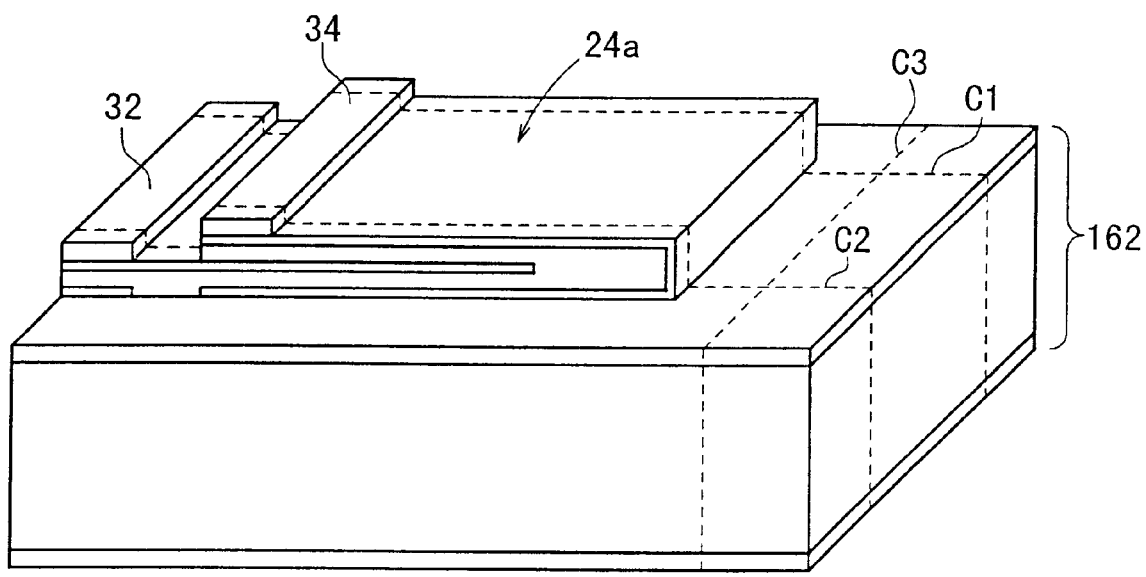
FIG. 22 illustrates a state in the second production method in which the metal plate is bonded to the ceramic laminate to provide a hybrid laminate.
Figure 23:
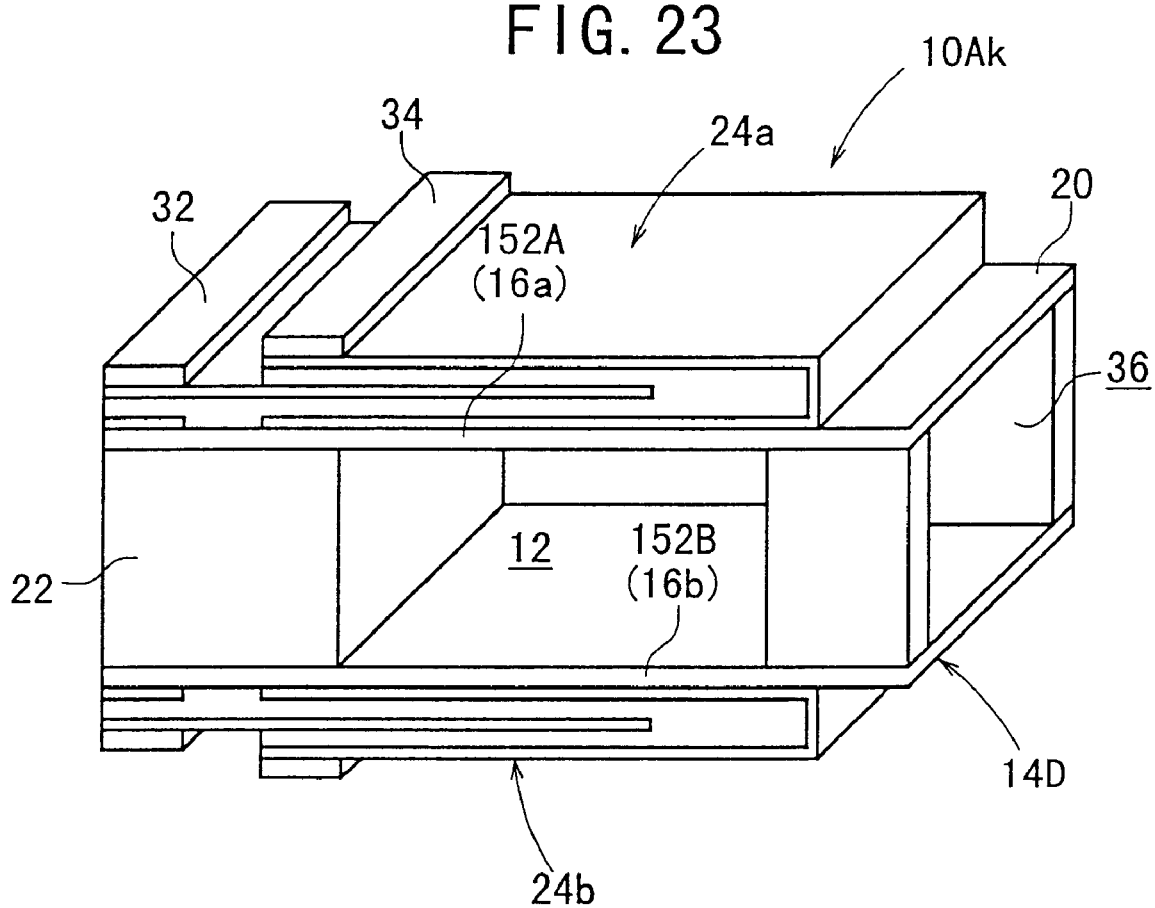
FIG. 23 illustrates a state in the second production method in which the hybrid laminate is cut along predetermined cutting lines to provide the piezoelectric/electrostrictive device according to the eleventh modified embodiment.

Subsequently, as shown in FIG. 22, the hybrid laminate 162, which is formed with the piezoelectric/electrostrictive elements 24a, 24b, is cut along cutting lines C1, C2, C3 to thereby cut off side portions and forward end portions of the hybrid laminate 162. As a result of the cutoff, as shown in FIG. 23, the piezoelectric/electrostrictive device 10Ak according to the eleventh modified embodiment is obtained, in which the piezoelectric/electrostrictive elements 24a, 24b are formed on the thin plate sections 16a, 16b constituted by the metal plates 152A, 152B, of the substrate 14D, and the movable section 20 having the through-hole 36 is formed.

On the other hand, in the third production method, at first, a plurality (for example, four) of frame-shaped ceramic green sheets 50A to 50D each of which is continuously formed with at least a window 54 for forming the hole 12 thereafter and a window 56 for forming the cutout (through-hole 36) thereafter are prepared. The ceramic green sheets 50A to 50D are laminated and secured under pressure to form a ceramic green laminate 158 (see FIGS. 20A and 20B).

Figure 24B:
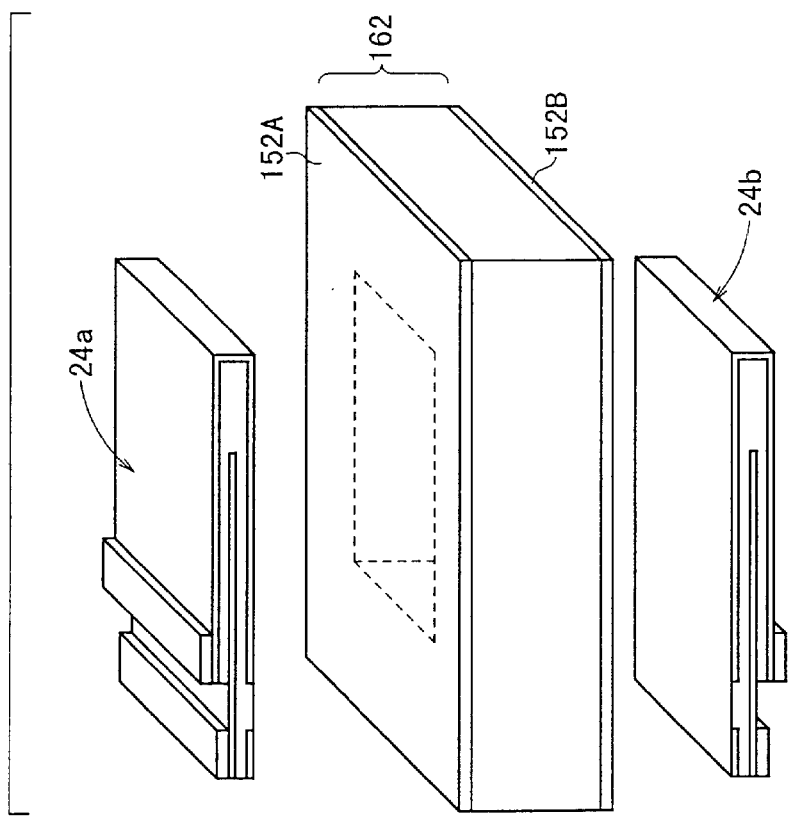
FIG. 24B illustrates a state in which piezoelectric/electrostrictive elements, which are constructed as separate members, are bonded to surfaces of metal plates to serve as thin plate sections respectively.
Figure 24A:
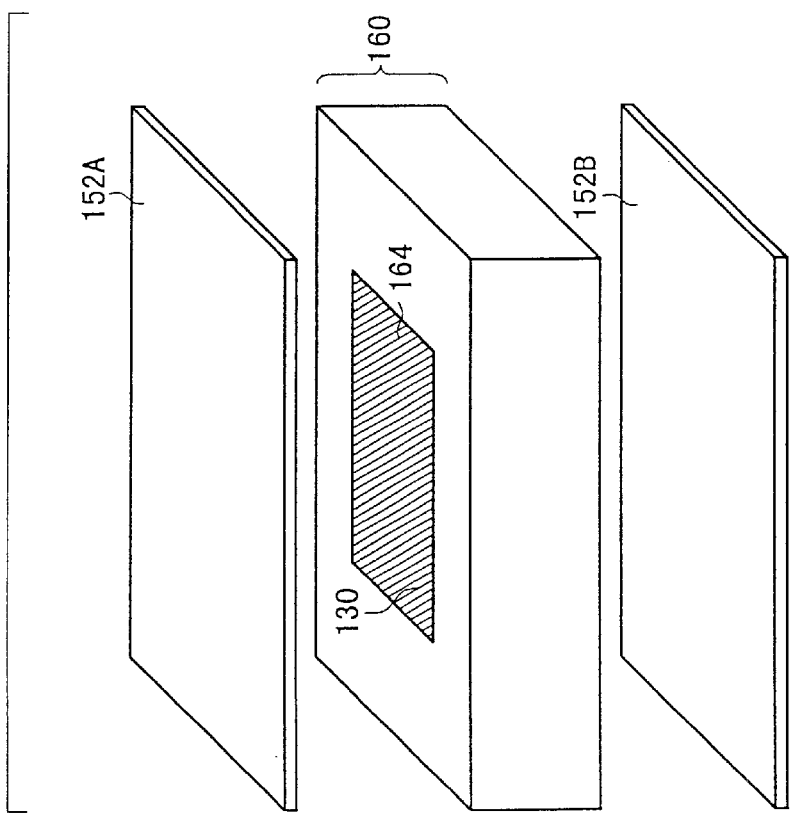
FIG. 24A illustrates a state in a third production method in which a ceramic green laminate is sintered into a ceramic laminate.

After that, the ceramic green laminate 158 is sintered to obtain a ceramic laminate 160 as shown in FIG. 24A. At this stage, the ceramic laminate 160 is formed such that the hole 130 is formed by the windows 54, 56.

Subsequently, as shown in FIG. 24B, the metal plates 152A, 152B are bonded to the ceramic laminate 160 with an epoxy adhesive so that the ceramic laminate 160 is interposed between the metal plates 152A, 152B and the hole 130 is closed thereby to provide a hybrid laminate 162. In this procedure, when the piezoelectric/electrostrictive elements 24a, 24b are affixed to the surfaces of the bonded metal plates 152A, 152B, the hole 130 is optionally filled with a filler material 164 as shown in FIG. 24A so that a sufficient pressure may be applied for bonding.

It is necessary to subsequently remove the filler material 164. Therefore, it is preferable to use a hard material which is easily dissolved in a solvent or the like. The material includes, for example, organic resin, wax, and brazing filler material. It is also possible to adopt a material obtained by mixing ceramic powder as a filler with organic resin such as acrylic.

Figure 25:
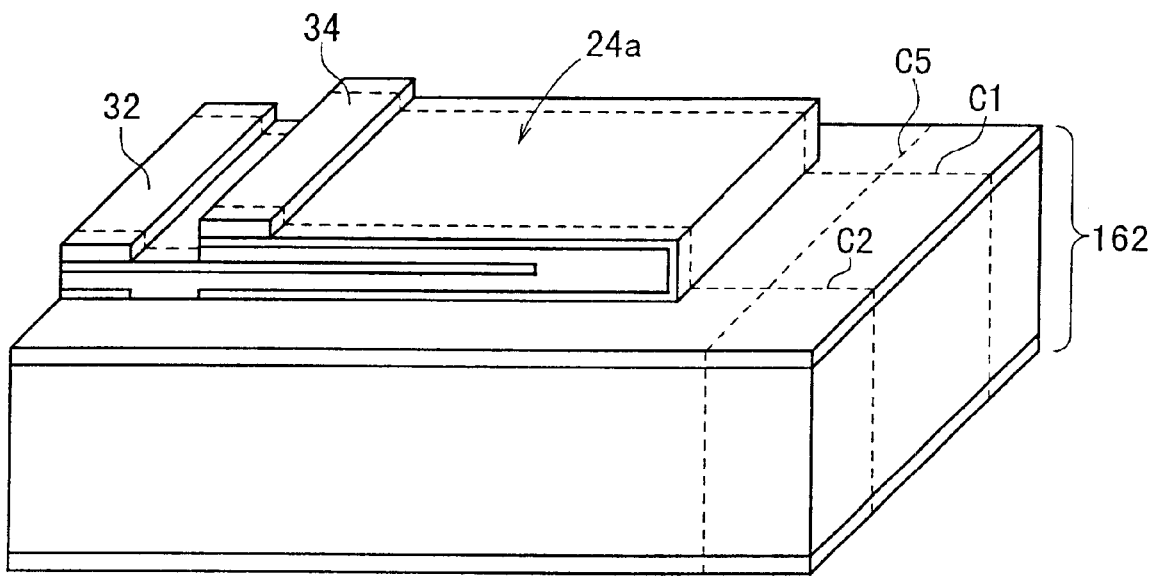
FIG. 25 illustrates a state in the third production method in which the metal plate is bonded to the ceramic laminate to provide a hybrid laminate.

Subsequently, as shown in FIG. 25, the piezoelectric/electrostrictive elements 24a, 24b, which are constructed as separate members, are bonded with an epoxy adhesive to the surfaces of the metal plates 152A, 152B of the hybrid laminate 162. The separate members of the piezoelectric/electrostrictive elements 24a, 24b can be formed, for example, in accordance with a ceramic green sheet-laminating method and a screen printing method.

Figure 26:
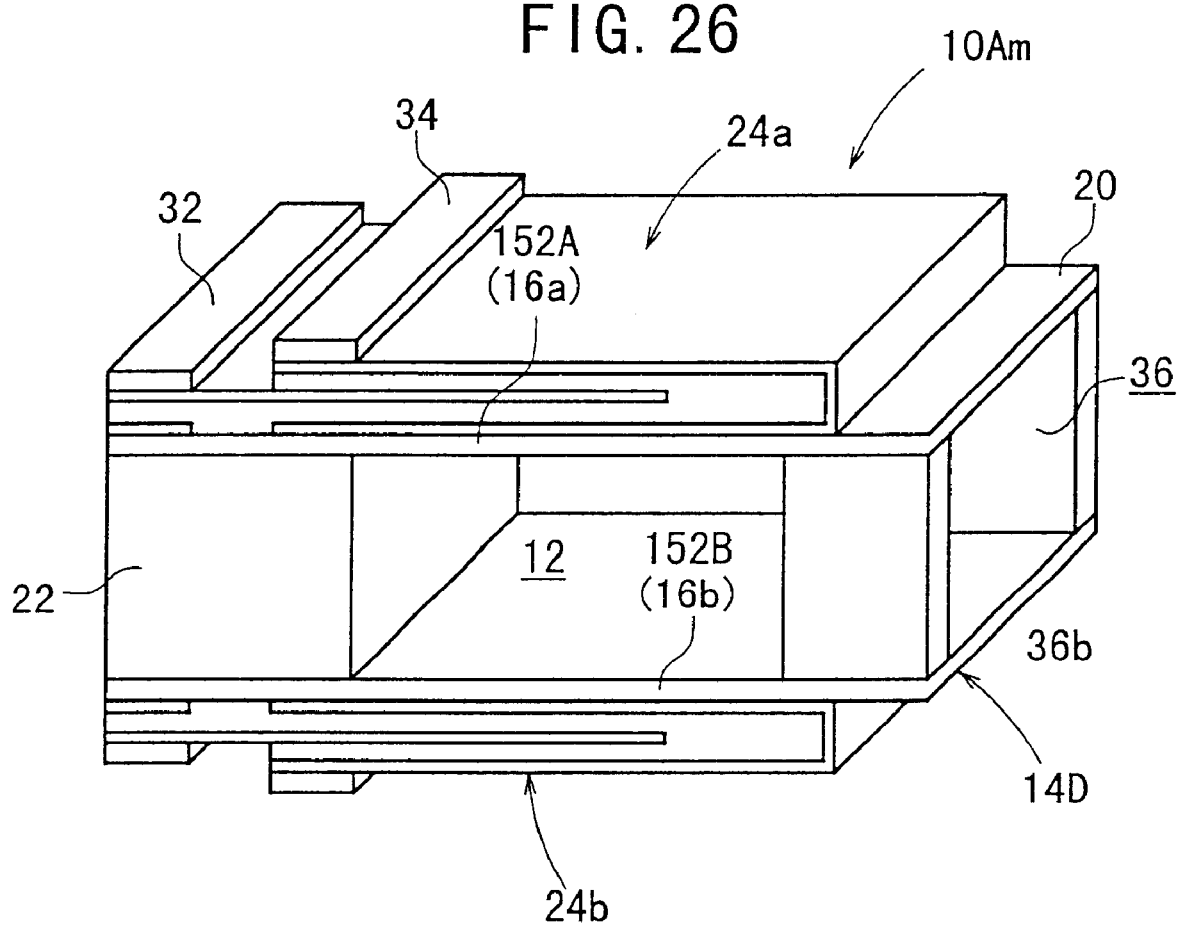
FIG. 26 illustrates a state in the third production method in which the hybrid laminate is cut along predetermined cutting lines to provide a piezoelectric/electrostrictive device according to a twelfth modified embodiment.

Subsequently, the hybrid laminate 162, which is formed with the piezoelectric/electrostrictive elements 24a, 24b, is cut along cutting lines C1, C2, C5 to thereby cut off side portions and forward end portions of the hybrid laminate 162. As a result of the cutoff, as shown in FIG. 26, the piezoelectric/electrostrictive device 10Am according to the twelfth modified embodiment is obtained, in which the piezoelectric/electrostrictive elements 24a, 24b are formed on the thin plate sections 16a, 16b constituted by the metal plates 152A, 152B, of the substrate 14D, and the movable section 20 having the through-hole 36 is formed.

When all of the substrate section is made of metal, for example, the portions corresponding to the ceramic laminate 160 shown in FIG. 21A are formed by means of molding. Further, thin metal materials may be laminated to form the substrate section in accordance with a cladding method.

Next, explanation will be made for a piezoelectric/electrostrictive device 10B according to the second embodiment with reference to FIGS. 27 to 30. Components or parts corresponding to those shown in FIG. 1 are designated by the same reference numerals, duplicate explanation of which will be omitted.

Figure 27:
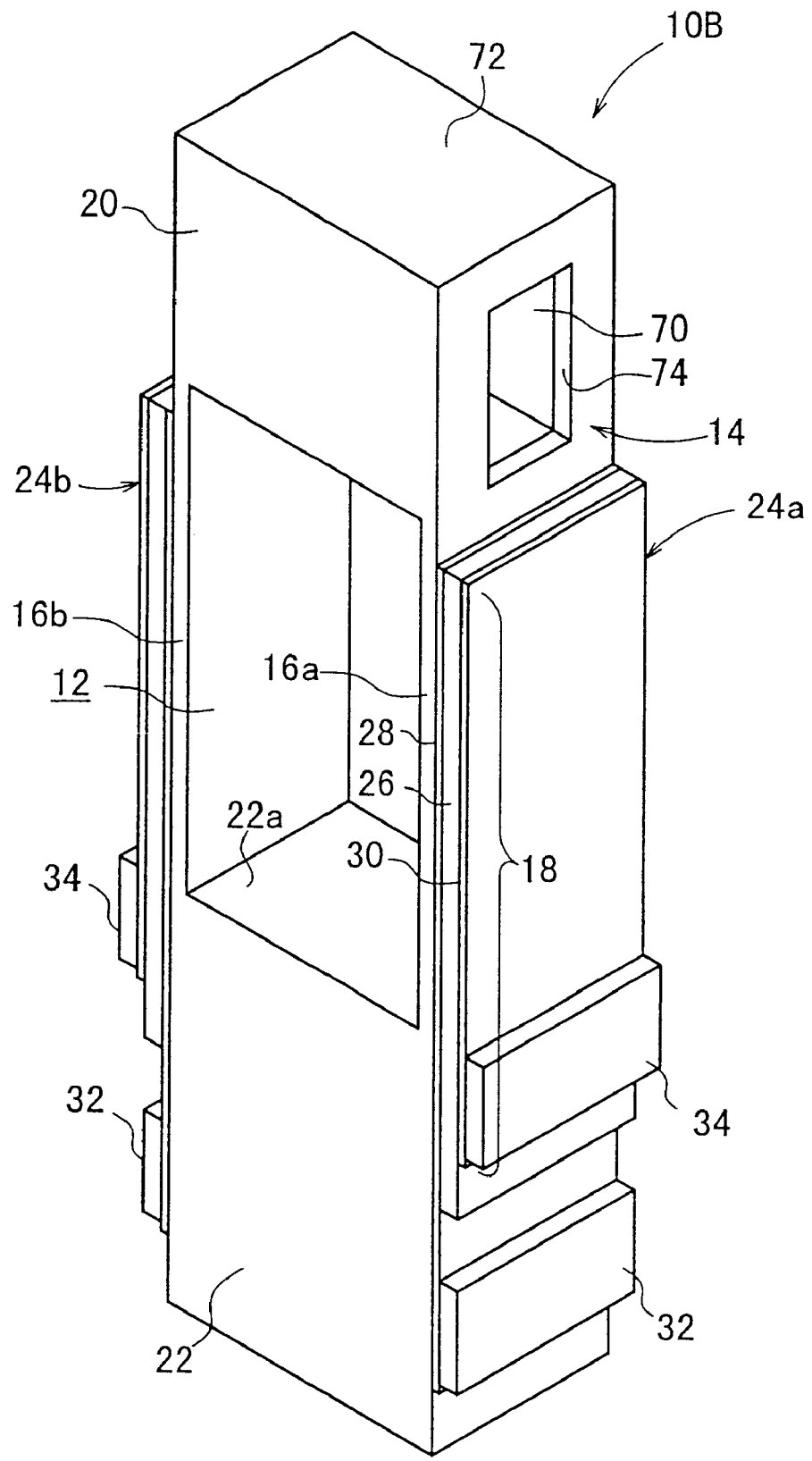
FIG. 27 shows a perspective view illustrating an arrangement of a piezoelectric/electrostrictive device according to a second embodiment.

As shown in FIG. 27, the piezoelectric/electrostrictive device 10B according to the second embodiment is constructed in approximately the same manner as the piezoelectric/electrostrictive device 10A according to the first embodiment described above. However, the former is different from the latter in that the movable section 20 is constructed to have an empty vessel structure. Specifically, the inside of the movable section 20 is hollow (hollow section 70), and the forward end thereof is a closed surface 72. For example, a rectangular through-hole 74 is formed on the side wall.

Also in the piezoelectric/electrostrictive device 10B according to the second embodiment, the movable section 20 is allowed to have a light weight, in the same manner as in the piezoelectric/electrostrictive device 10A according to the first embodiment described above. Therefore, it is possible to increase the resonance frequency without decreasing the displacement amount of the movable section 20.

The hollow section 70 and the through-hole 74 are formed for the movable section 20. Accordingly, the rigidity of the movable section 20 can be appropriately lowered, and the displacement in the X axis direction can be effectively increased without increasing the flapping displacement (displacement in the Y axis direction).

Further, a variety of members may be inserted and attached to the hollow section 70 and the through-hole 74. Accordingly, an advantage is, obtained such that the fixing and bonding area for the member can be increased and the reliability of joining is enhanced, and/or an advantage is obtained such that it is possible to make the thickness to be thin or realize a small size of the piezoelectric/electrostrictive device 10B attached with a variety of members.

The effect to realize the high resonance frequency, which is brought about by the realization of the light weight of the piezoelectric/electrostrictive device 10B according to the second embodiment, is of a somewhat lower nature with respect to that of the piezoelectric/electrostrictive device 10A according to the first embodiment described above. However, the mechanical strength is excellent. Therefore, an advantage is obtained such that the degree of freedom is high when a variety of members or parts are attached to the movable section 20, and it is easy to perform the design.

The same steps as those executed in the method for producing the piezoelectric/electrostrictive device 10A according to the first embodiment described above are also executed when the piezoelectric/electrostrictive device 10B according to the second embodiment is produced.

A production method, which follows the first production method described above, will be explained below. At first, as shown in FIG. 28A, for example, a method such as a punching out based on a die or a laser machining is used to prepare a plurality (for example, four) of ceramic green sheets 50A to 50D continuously formed with at least a window 54 for forming the hole 12 thereafter and a window 80 for forming the hollow section 70 thereafter, and a plurality (for example, two) of ceramic green sheets 52A, 52B for forming the thin plate sections 16a, 16b thereafter, having the through-hole 74 at a portion corresponding to the window 80.

Figure 28B:
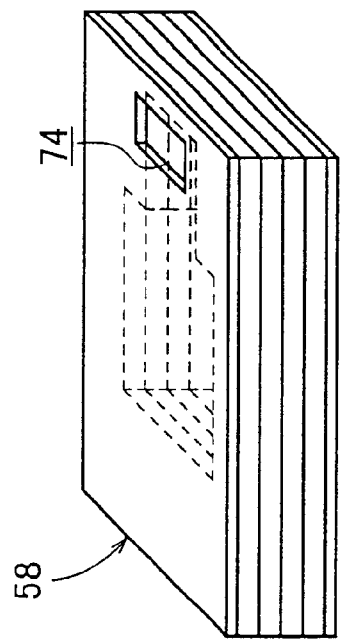
FIG. 28B illustrates a state in which a ceramic green laminate is formed.
Figure 28A:
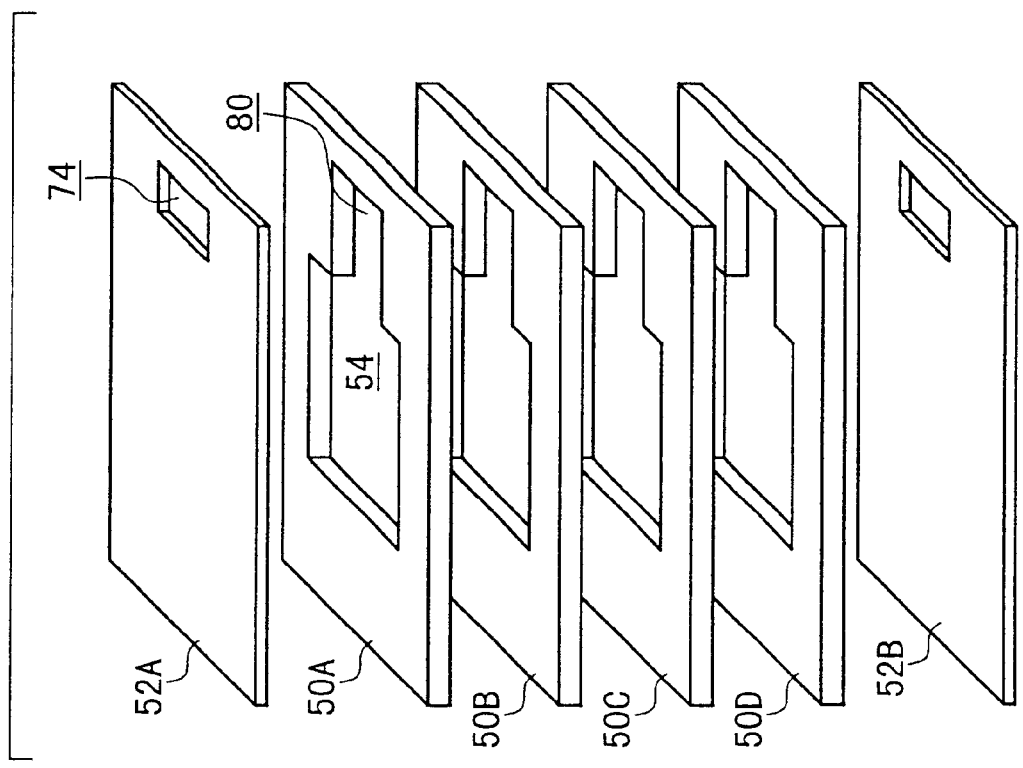
FIG. 28A illustrates a process for laminating ceramic green sheets required when the piezoelectric/electrostrictive device according to the second embodiment is produced in accordance with the first production method.

After that, as shown in FIG. 28B, the ceramic green sheets 50A to 50D, 52A, 52B are laminated and secured under pressure so that the ceramic green sheets 50A to 50D are interposed between the ceramic green sheets 52A, 52B to provide a ceramic green laminate 58. After that, as shown in FIG. 29, the ceramic green laminate 58 is sintered to obtain a ceramic laminate 60.

Figure 29:
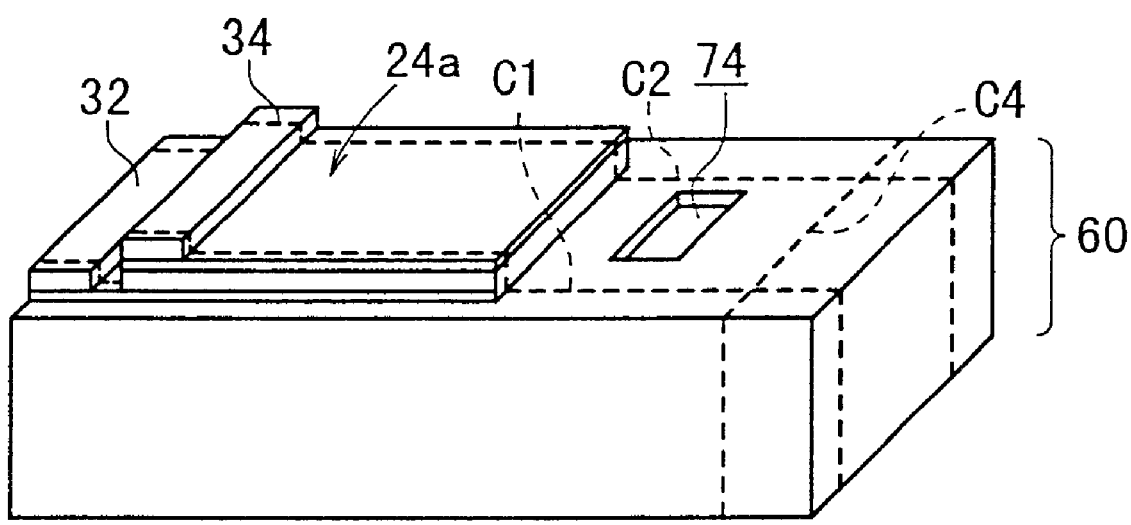
FIG. 29 illustrates a state in which the ceramic green laminate is sintered into a ceramic laminate, and then the piezoelectric/electrostrictive element is formed on the ceramic laminate.

After that, as shown in FIG. 29, the piezoelectric/electrostrictive elements 24a, 24b are formed on both surfaces of the ceramic laminate 60, i.e., on surfaces corresponding to the surfaces at which the ceramic green sheets 52A, 52B are laminated.

Figure 30:
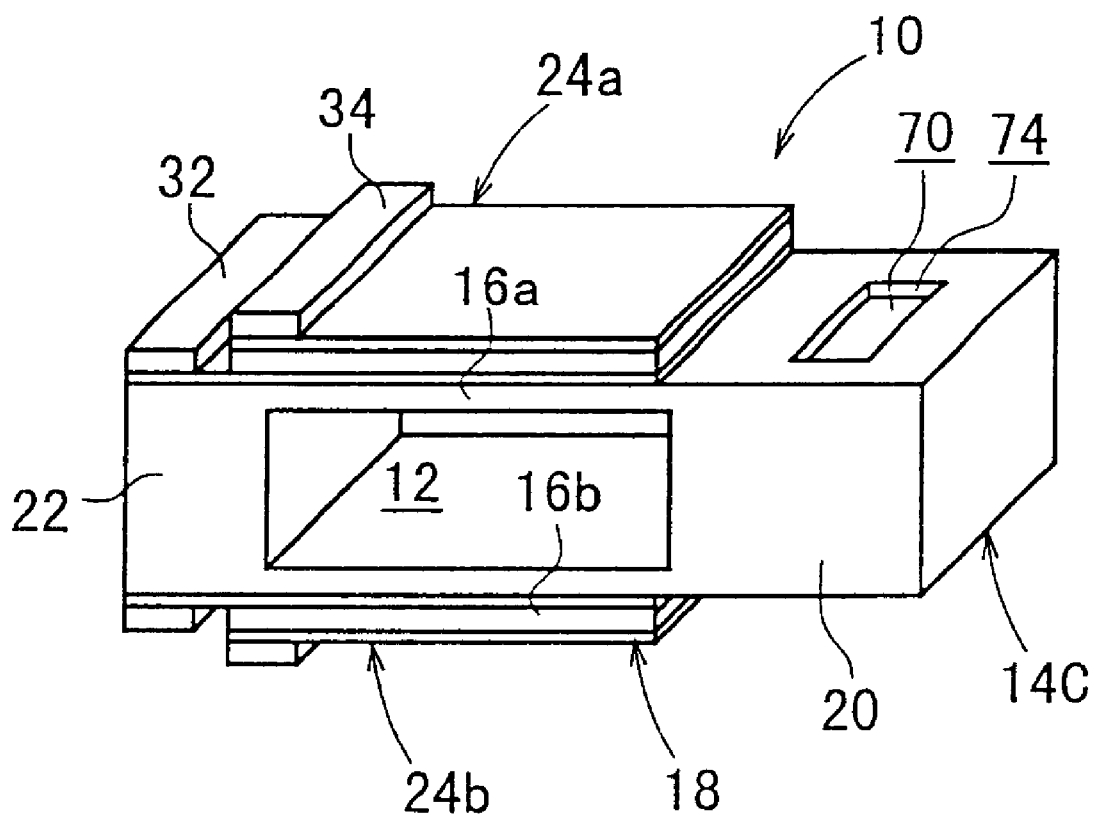
FIG. 30 illustrates a state in which the ceramic laminate is cut along predetermined cutting lines to provide the piezoelectric/electrostrictive device according to the second embodiment.

Subsequently, unnecessary portions are cut off from the ceramic laminate 60 which is formed with the piezoelectric/electrostrictive elements 24a, 24b as described above. The cutoff is performed at positions corresponding to side portions of the ceramic laminate 60, especially portions at which the hole 12 based on the window 54 is formed at the side surface of the ceramic laminate 60 by the cutoff (see cutting lines C1 and C2), and a portion at which the hollow section 70 based on the window 80 is formed at the portion of the movable section 20 of the ceramic laminate 60 (see cutting line C4). As a result of the cutoff, as shown in FIG. 30, the piezoelectric/electrostrictive device 10B is completed, in which the piezoelectric/electrostrictive elements 24a, 24b are formed on a ceramic substrate 14C integrated with the movable section 20 formed with the hollow section 70 and the through-hole 74, the pair of thin plate sections 16a, 16b, and the fixation section 22.

The embodiment described above is illustrative of the case to follow the first production method. Alternatively, the piezoelectric/electrostrictive device 10B may be produced in accordance with the second production method or the third production method based on the use of the metal plates 152A, 152B.

Next, explanation will be made for a piezoelectric/electrostrictive device 10C according to the third embodiment with reference to FIG. 31. Components or parts corresponding to those shown in FIG. 1 are designated by the same reference numerals, duplicate explanation of which will be omitted.

Figure 31:
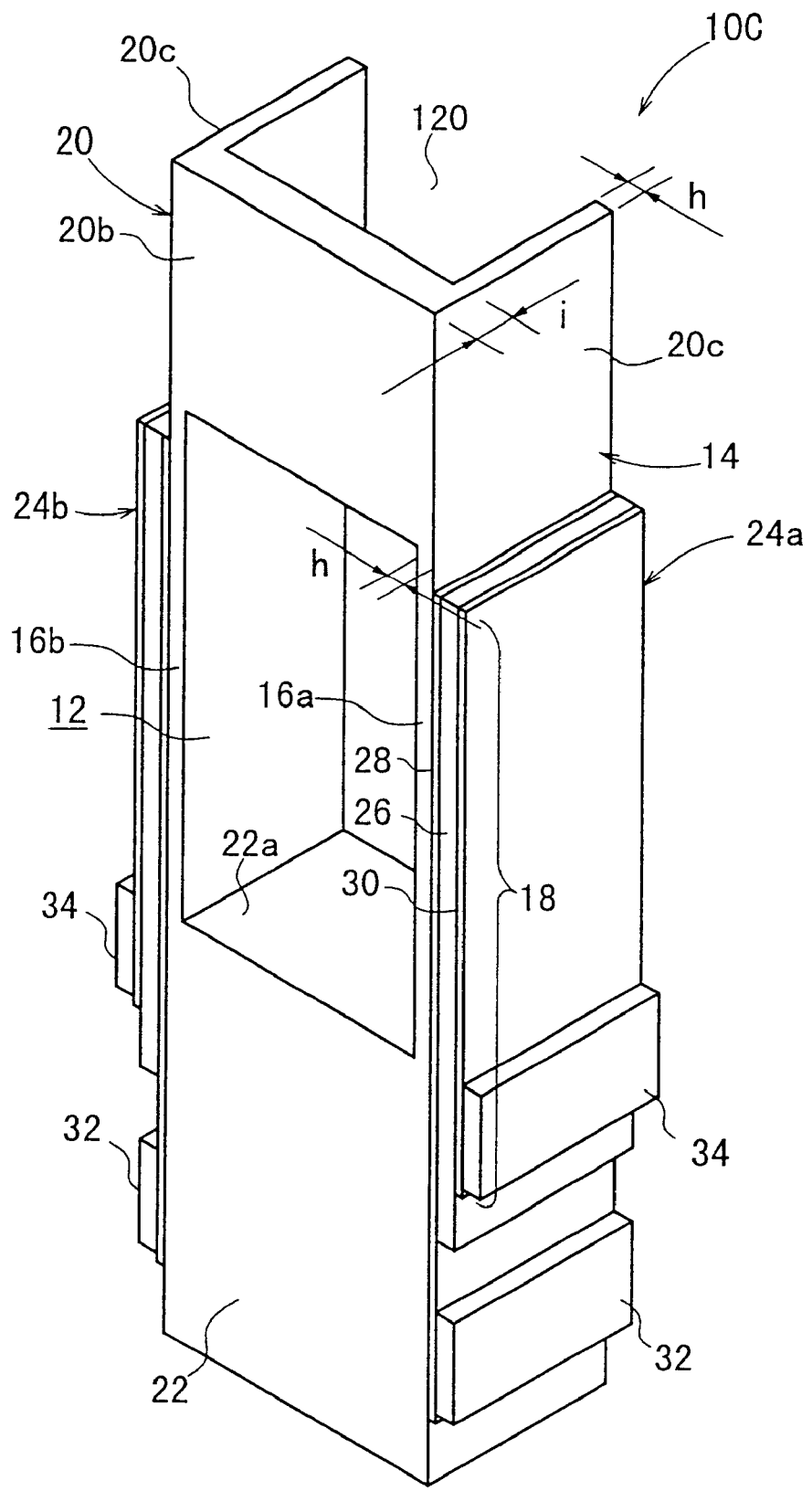
FIG. 31 shows a perspective view illustrating an arrangement of a piezoelectric/electrostrictive device according to a third embodiment.

As shown in FIG. 31, the piezoelectric/electrostrictive device 10C according to the third embodiment is constructed in approximately the same manner as the piezoelectric/electrostrictive device 10A according to the first embodiment described above. However, the former is different from the latter in that a portion of the movable section 20, which corresponds to the principal surface disposed oppositely to the front surface 20b, is eliminated, and the movable section 20 is cut off to a great extent (cutout 120).

In this embodiment, the thickness h of the side surface 20c of the movable section 20 is the same as the thickness d of the thin plate sections 16a, 16b.

The piezoelectric/electrostrictive device 10C according to the third embodiment is also formed with the cutout 120, and thus the movable section 20 is allowed to have a light weight, in the same manner as the piezoelectric/electrostrictive device 10A according to the first embodiment. Therefore, it is possible to increase the resonance frequency without decreasing the displacement amount of the movable section 20. Especially, in the third embodiment, the weight can be greatly reduced. Therefore, it is possible to increase the areal size of the entire piezoelectric/electrostrictive device 10C or the movable section 20. It is possible to improve the degree of freedom concerning the attachment of a variety of members or parts.

The cutout 120 is formed for the movable section 20. Accordingly, the rigidity of the movable section 20 can be appropriately lowered, and the displacement in the X axis direction can be effectively increased without increasing the flapping displacement (displacement in the Y axis direction).

When a variety of members or parts are attached, then the member or the part may be fixed in a form of being fitted on the side of the cutout 120, or it may be fixed on the back surface side thereof, i.e., on the side of the front surface 20b of the movable section 20. When the fixation is effected on the side of the cutout 120, there is obtained an advantage that the thickness of the piezoelectric/electrostrictive device 10C attached with the member or the part can be made thin, and an advantage that the fixing area for the member or the part can be enlarged.

The strength of the structure is lowered as compared with the piezoelectric/electrostrictive device 10A according to the first embodiment. Therefore, it is preferable that the thickness i of the front surface 20b of the movable section 20 is made thicker than that in the first embodiment.

When the piezoelectric/electrostrictive device 10C according to the third embodiment is produced, the same steps as those used in the production method for the piezoelectric/electrostrictive device 10A according to the first embodiment described above are executed. However, explanation therefor is omitted.

Figure 32:
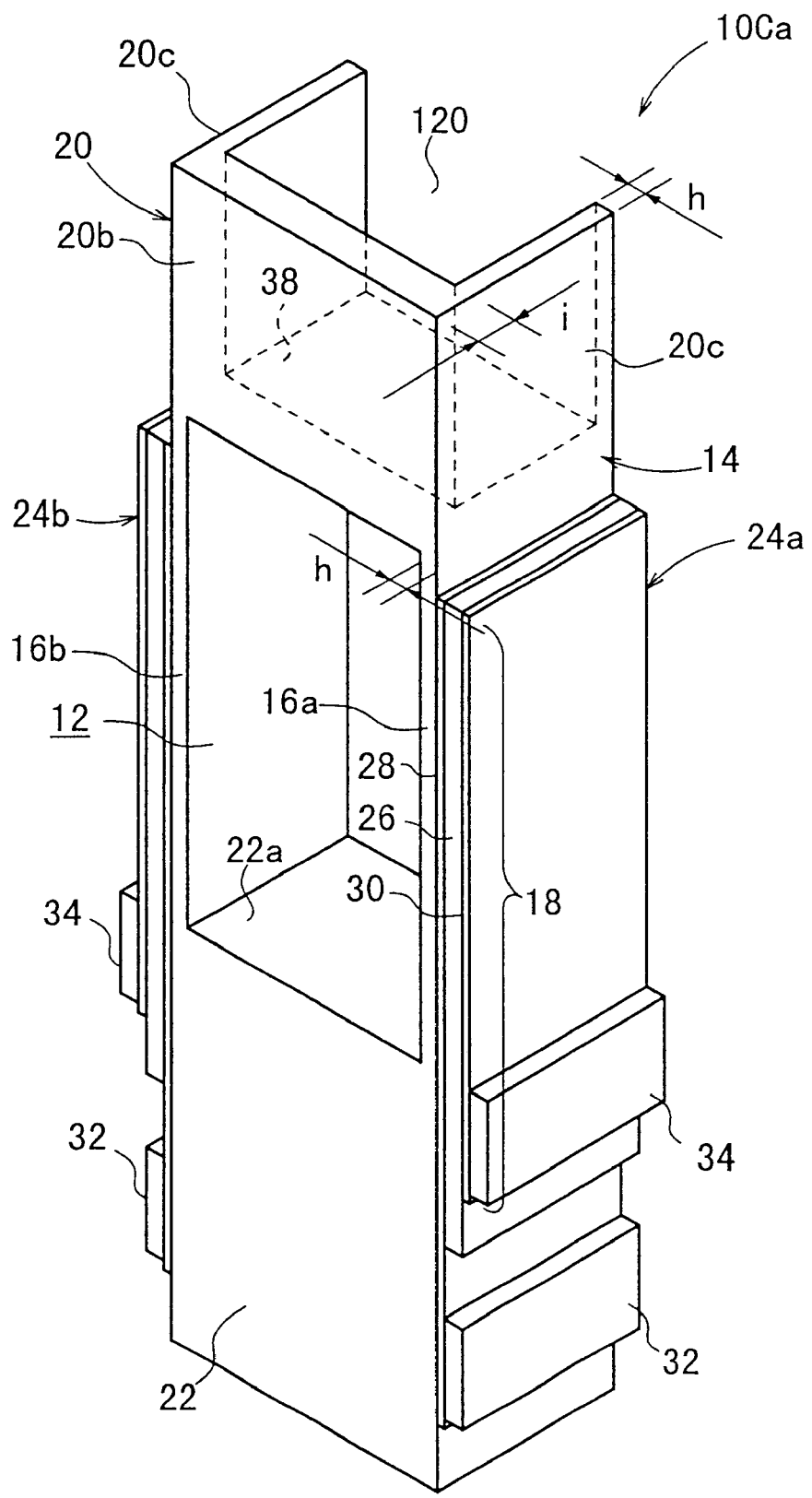
FIG. 32 shows a perspective view illustrating an arrangement of a modified embodiment of the piezoelectric/electrostrictive device according to the third embodiment.

A partition 38 may be provided between the cutout 120 and the hole 12, as in a piezoelectric/electrostrictive device 10Ca according to a modified embodiment shown in FIG. 32. In this case, when a variety of members or parts are inserted into the cutout 36 to be fixed, the member or the part can be easily positioned by the aid of the partition 38. It is possible to reduce the dispersion of the characteristic of the final product. Further, it is possible to utilize the four or five surfaces as the bonding and fixing surfaces. Thus, the reliability is improved for the attachment of the member or the part.

Next, explanation will be made for a piezoelectric/electrostrictive device 10D according to the fourth embodiment with reference to FIGS. 33 to 36. Components or parts corresponding to those shown in FIG. 31 are designated by the same reference numerals, duplicate explanation of which will be omitted.

Figure 33:
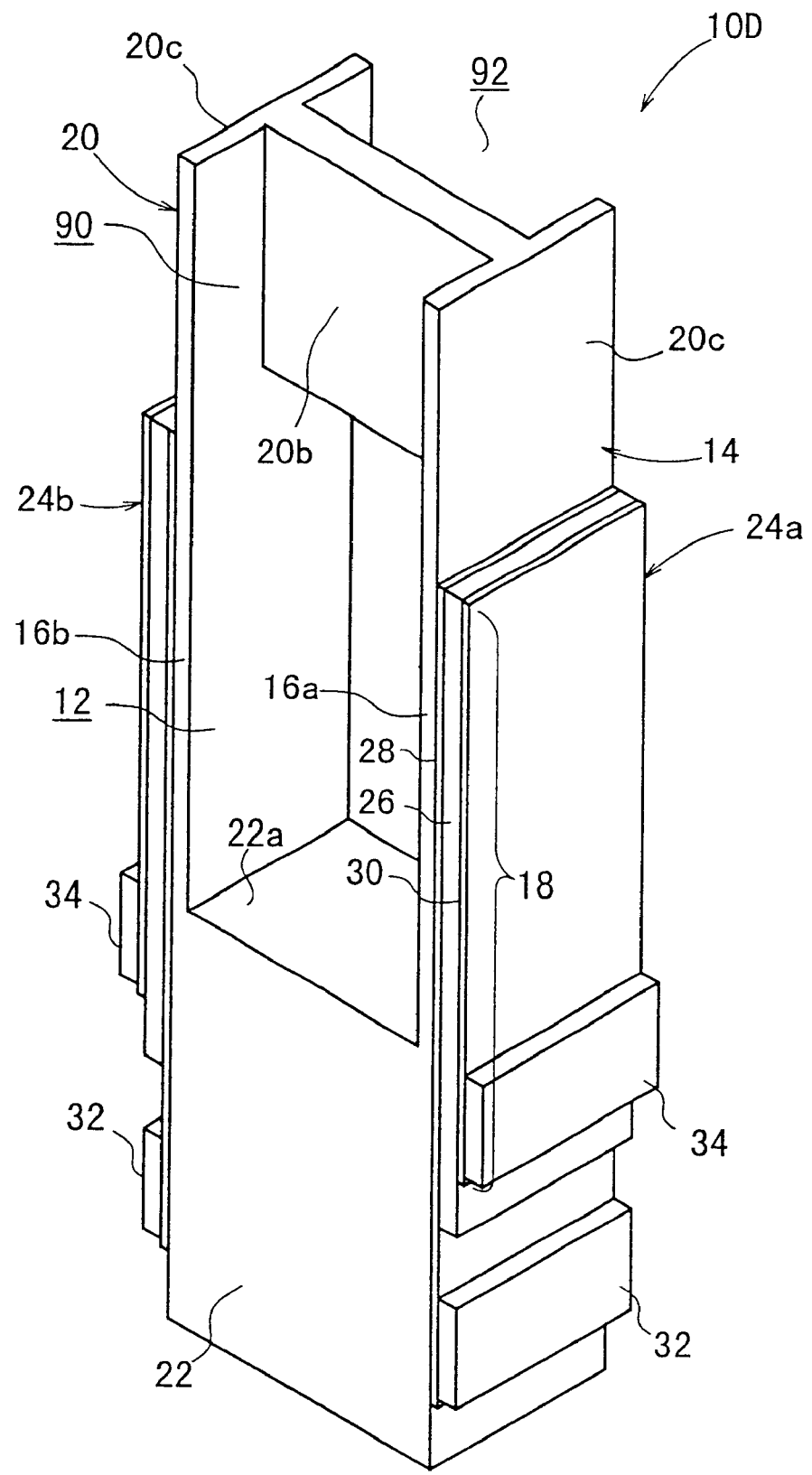
FIG. 33 shows a perspective view illustrating an arrangement of a piezoelectric/electrostrictive device according to a fourth embodiment.

As shown in FIG. 33, the piezoelectric/electrostrictive device 10D according to the fourth embodiment is constructed in approximately the same manner as the piezoelectric/electrostrictive device 10C according to the third embodiment described above. However, the former is different from the latter in that the front surface 20b of the movable section 20 is located at an approximately central position in the widthwise direction of the movable section 20 to construct a substantially H-shaped upper surface. That is, the piezoelectric/electrostrictive device 10D is constructed such that cutouts 90, 92 are provided for both principal surfaces of the movable section 20 respectively.

Also in the piezoelectric/electrostrictive device 10D according to the fourth embodiment, the movable section 20 is allowed to have a light weight, in the same manner as in the piezoelectric/electrostrictive device 10A according to the first embodiment described above. Therefore, it is possible to increase the resonance frequency without decreasing the displacement amount of the movable section 20.

Especially, the piezoelectric/electrostrictive device 10D according to the fourth embodiment has such a form that the side surfaces 20c of the movable section 20 are connected via the front surface 20b at positions symmetrical to one another in the widthwise direction. Therefore, a feature is obtained such that the flapping is decreased in the Y axis direction, as the displacement form.

When the front surface 20b, which is formed at the deep position, is utilized as an attachment surface for a variety of members or parts, then the member or the part is attached so that it is fitted, and the member or the part can be supported with the three surfaces of the back surface of the front surface 20b and the pair of inner wall surfaces of the side surfaces 20c of the movable section 20. Therefore, it is possible to reliably hold a part which is larger than the movable section 20.

In other words, the cutouts 90, 92 are formed for the movable section 20. Accordingly, the rigidity of the movable section 20 can be appropriately lowered, and the displacement in the X axis direction can be effectively increased without increasing the flapping displacement (displacement in the Y axis direction).

When a variety of members or parts are attached, then the member or the part may be fixed in a form of being fitted to the cutout 90, 92. In this case, there are obtained an advantage that the thickness of the piezoelectric/electrostrictive device 10D attached with the member or the part can be made thin, and an advantage that the fixing area for the member or the part can be enlarged.

The same steps as those executed in the method for producing the piezoelectric/electrostrictive device 10A according to the first embodiment described above are also executed when the piezoelectric/electrostrictive device 10D according to the fourth embodiment is produced.

A production method, which follows the first production method described above, will be explained below. At first, as shown in FIG. 34A, for example, a method such as the punching out based on a die or a laser machining is used to prepare a plurality (for example, four) of ceramic green sheets 50A to 50D continuously formed with at least a window 54 for forming the hole 12 thereafter and windows 100, 102 for forming the cutouts 90, 92 thereafter, and a plurality (for example, two) of ceramic green sheets 52A, 52B for forming the thin plate sections 16a, 16b thereafter.

Figure 34B:
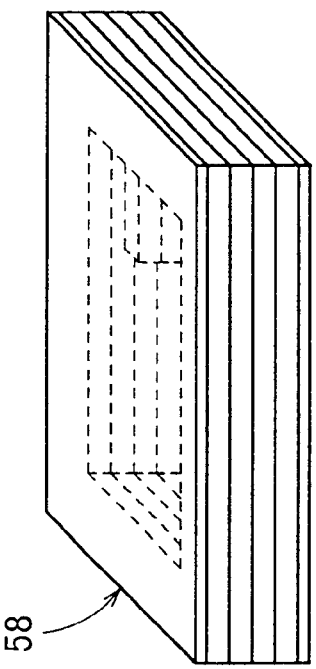
FIG. 34B illustrates a state in which a ceramic green laminate is formed.
Figure 34A:
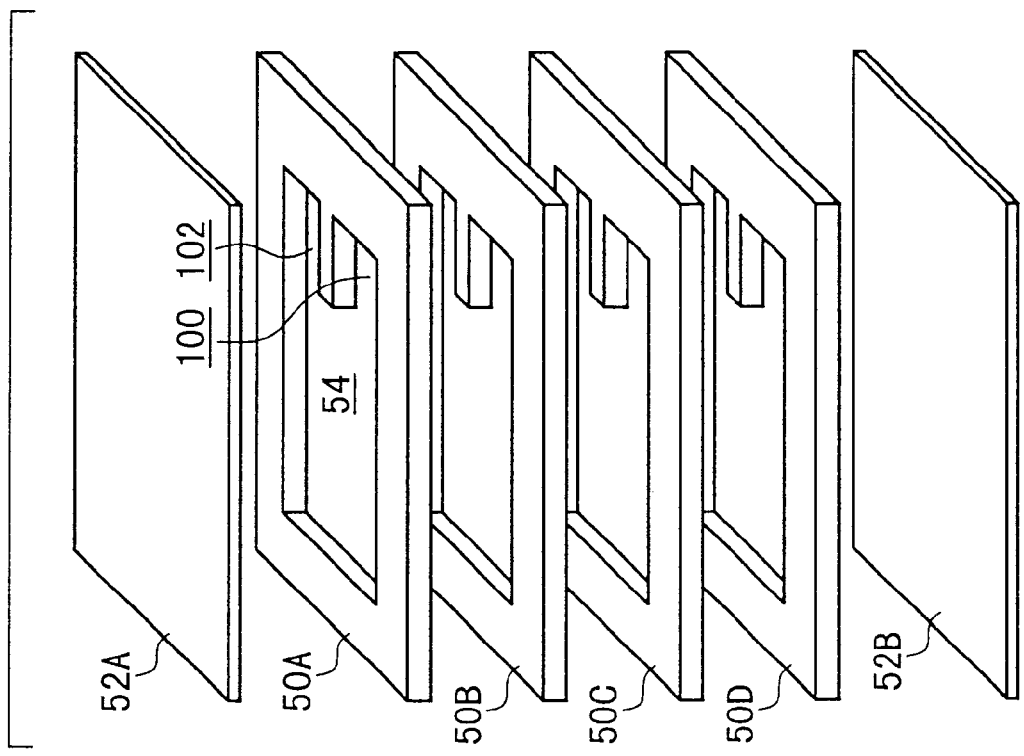
FIG. 34A illustrates a process for laminating ceramic green sheets required when the piezoelectric/electrostrictive device according to the fourth embodiment is produced in accordance with the first production method.

After that, as shown in FIG. 34B, the ceramic green sheets 50A to 50D, 52A, 52B are laminated and secured under pressure so that the ceramic green sheets 50A to 50D are interposed between the ceramic green sheets 52A, 52B to provide a ceramic green laminate 58. After that, as shown in FIG. 35, the ceramic green laminate 58 is sintered to obtain a ceramic laminate 60.

Figure 35:
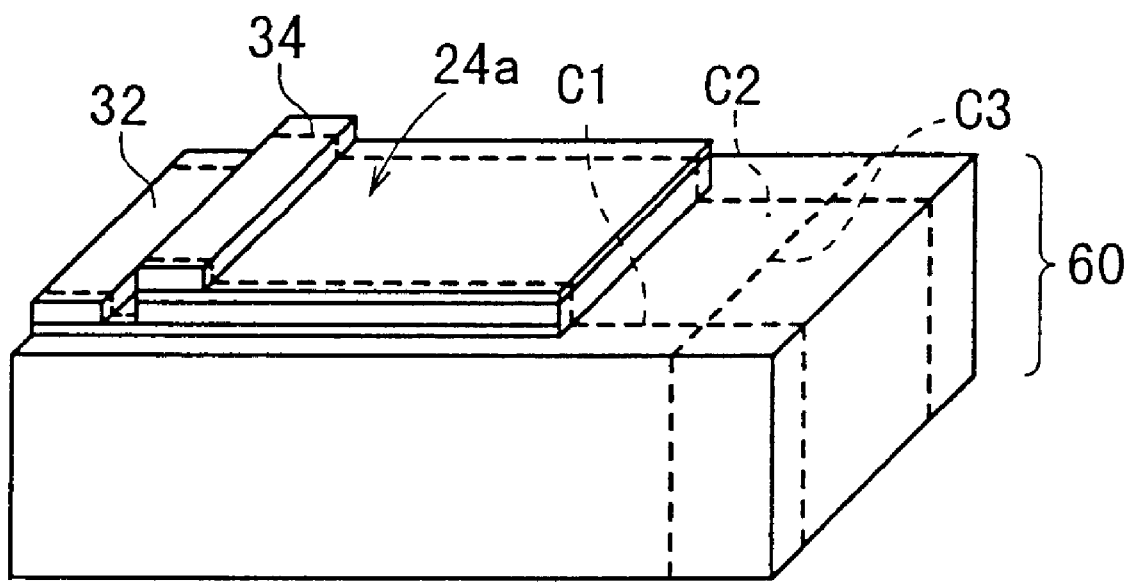
FIG. 35 illustrates a state in which the ceramic green laminate is sintered into a ceramic laminate, and then the piezoelectric/electrostrictive element is formed on the ceramic laminate.

After that, as shown in FIG. 35, the piezoelectric/electrostrictive elements 24a, 24b are formed on both surfaces of the ceramic laminate 60, i.e., on surfaces corresponding to the surfaces at which the ceramic green sheets 52A, 52B are laminated.

Figure 36:
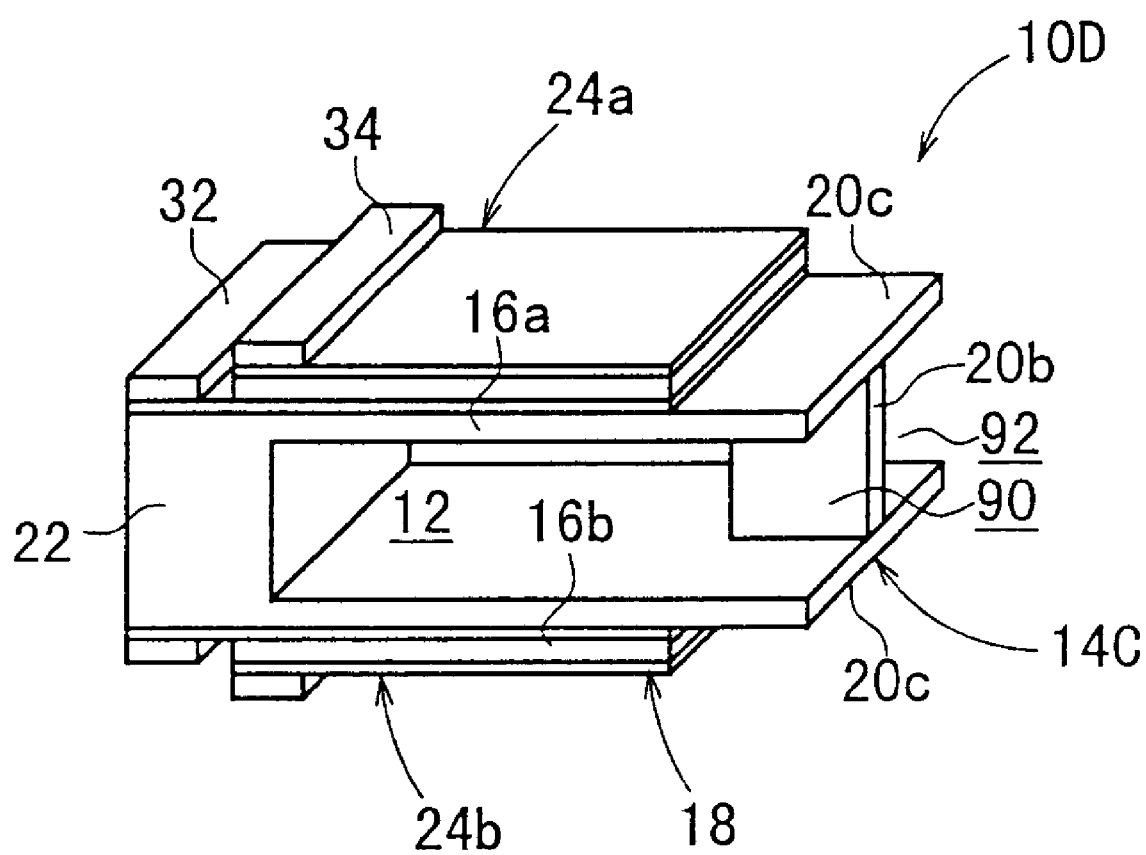
FIG. 36 illustrates a state in which the ceramic laminate is cut along predetermined cutting lines to provide the piezoelectric/electrostrictive device according to the fourth embodiment.

Subsequently, unnecessary portions are cut off from the ceramic laminate 60 which is formed with the piezoelectric/ electrostrictive elements 24a, 24b as described above. The cutoff is performed at positions corresponding to side portions of the ceramic laminate 60, especially portions at which the hole 12 based on the window 54 is formed at the side surface of the ceramic laminate 60 by the cutoff (see cutting lines C1 and C2), and a portion at which the cutouts 90, 92 based on the windows 100,102 are formed at the portions of the movable section 20 of the ceramic laminate 60 (see cutting line C3). As a result of the cutoff, as shown in FIG. 36, the piezoelectric/electrostrictive device 10D is completed, in which the piezoelectric/electrostrictive elements 24a, 24b are formed on a ceramic substrate 14C integrated with the movable section 20 having the substantially H-shaped upper surface, the pair of thin plate sections 16a, 6b, and the fixation section 22.

Next, explanation will be made for a piezoelectric/electrostrictive device 10E according to the fifth embodiment with reference to FIG. 37. Components or parts corresponding to those shown in FIG. 31 are designated by the same reference numerals, duplicate explanation of which will be omitted.

Figure 37:
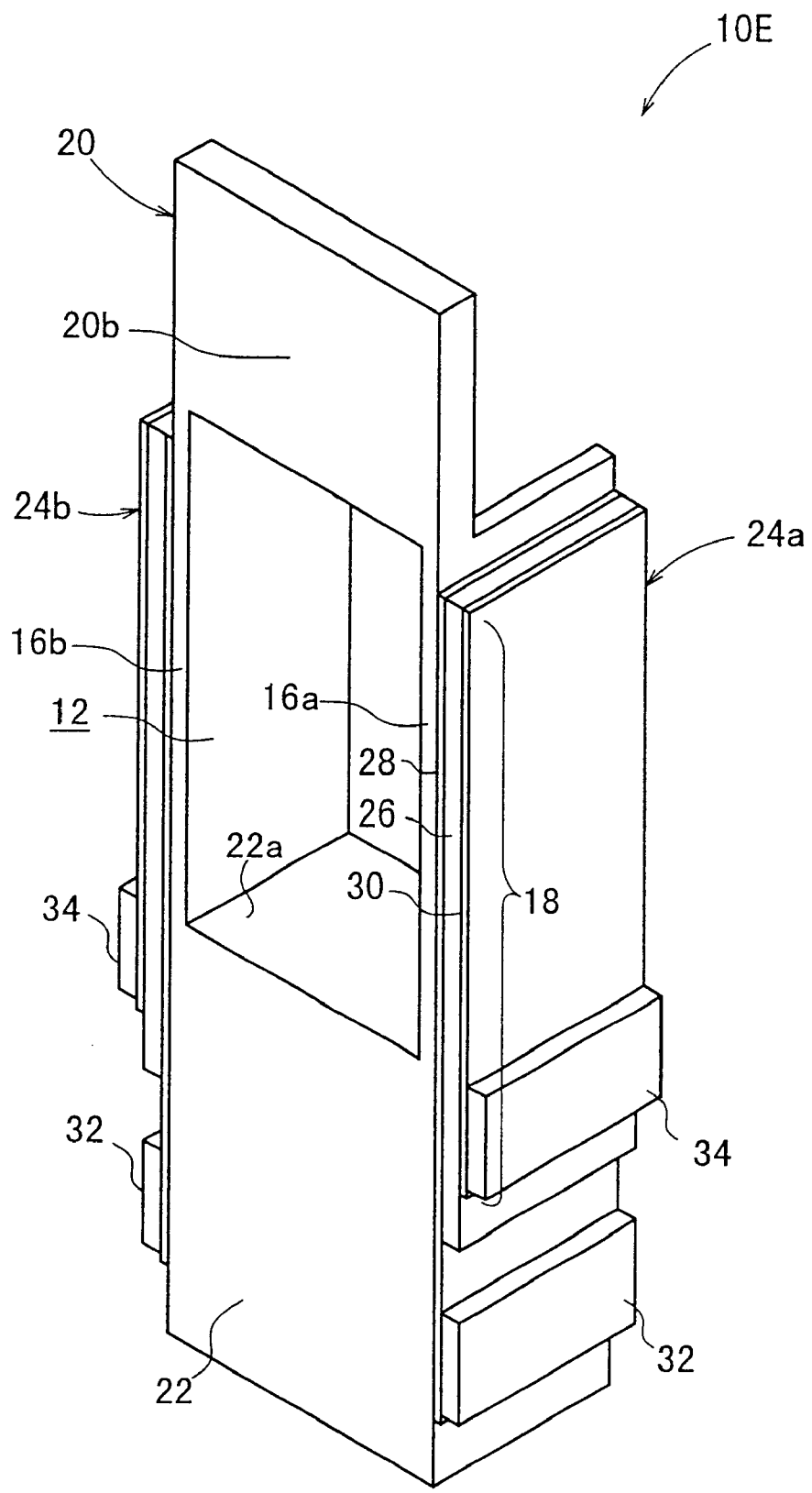
FIG. 37 shows a perspective view illustrating an arrangement of a piezoelectric/electrostrictive device according to a fifth embodiment.

As shown in FIG. 37, the piezoelectric/electrostrictive device 10E according to the fifth embodiment is constructed in approximately the same manner as the piezoelectric/electrostrictive device 10C according to the third embodiment described above (see FIG. 31). However, the former is different from the latter in that a portion of the side surface 20c of the movable section 20 is partially eliminated. In other words, the movable section 20 is constructed by only a portion of the front surface 20b.

Also in the piezoelectric/electrostrictive device 10E according to the fifth embodiment, the movable section 20 is allowed to have a light weight, in the same manner as in the piezoelectric/electrostrictive device 10A according to the first embodiment. Therefore, it is possible to increase the resonance frequency without decreasing the displacement amount of the movable section 20. Especially, in the fifth embodiment, the movable section 20 is constructed by only the minimum portion necessary to attach the part. Therefore, even when the areal size is enlarged in order to attach the part, it is possible to suppress the increase in mass of the movable section 20 to a minimum. Accordingly, the piezoelectric/electrostrictive device 10E according to the fifth embodiment is most suitable to realize a high resonance frequency.

That is, the movable section 20 is constructed by only a portion of the front surface 20b. Accordingly, the rigidity of the movable section 20 can be appropriately lowered, and the displacement in the X axis direction can be effectively increased without increasing the flapping displacement (displacement in the Y axis direction).

A variety of members or parts may be attached on the back surface side of a portion of the front surface 20b. In this case, there is obtained an advantage that the thickness of the piezoelectric/electrostrictive device 10E attached with the member or the part can be made thin, and an advantage that the member or the part can be fixed to be fitted into the hole 12, and thus it is possible to realize a small size of the piezoelectric/electrostrictive device 10E attached with the member or the part.

When the piezoelectric/electrostrictive device 10E according to the fifth embodiment is produced, the same steps as those used in the production method for the piezoelectric/electrostrictive device 10A according to the first embodiment described above are executed. However, explanation therefor is omitted.

Next, explanation will be made for a piezoelectric/electrostrictive device 10F according to the sixth embodiment with reference to FIGS. 38 to 42. Components or parts corresponding to those shown in FIG. 1 are designated by the same reference numerals, duplicate explanation of which will be omitted.

Figure 38:
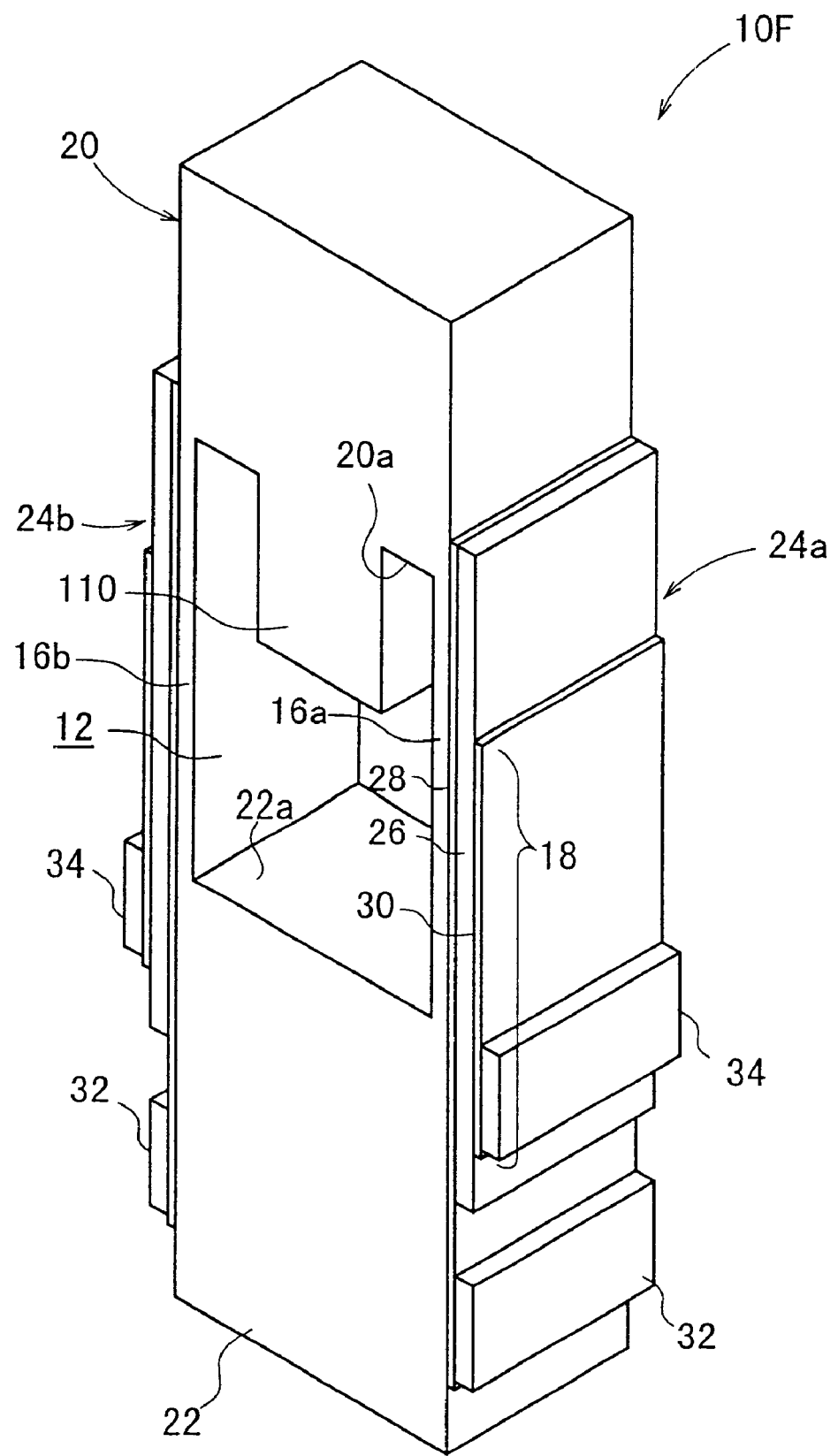
FIG. 38 shows a perspective view illustrating an arrangement of a piezoelectric/electrostrictive device according to a sixth embodiment.

As shown in FIG. 38, the piezoelectric/electrostrictive device 10F according to the sixth embodiment is constructed in approximately the same manner as the piezoelectric/electrostrictive device 10A according to the first embodiment described above. However, the former is different from the latter in that the movable section 20 is solid without involving, for example, the hollow section and the through-hole, and a part of the inner wall 20a of the movable section 20 is expanded in the hole 12 (expanded section 110). In other words, the piezoelectric/electrostrictive device 10F is constructed such that the areal size of the front surface 20b of the movable section 20 is increased owing to the presence of the expanded section 110.

In the piezoelectric/electrostrictive device 10F according to the sixth embodiment, for example, when a variety of members or parts are attached to the front surface 20b of the movable section 20, it is possible to increase the areal size of the front surface 20b (attachment surface for the member or the part in this case) of the movable section 20, without changing the maximum length of the piezoelectric/electrostrictive device 10F.

In this embodiment, the weight is increased due to the provision of the expanded section 110. However, the expanded section 110 is expanded toward the hole 12. Therefore, the center of gravity of the movable section 20 can be located at a position deviated toward the fixation section 22. Little influence is exerted by the decrease in resonance frequency brought about by the increase in weight. In this embodiment, the member or the part is attached at a position deviated toward the fixation section 22 as well. Therefore, the resonance frequency is scarcely decreased after attaching the member or the part, and the displacement of the movable section 20 is maintained as intended. In other words, the piezoelectric/electrostrictive device 10F is designed such that the resonance frequency is substantially improved.

In other words, in the piezoelectric/electrostrictive device 10F according to the sixth embodiment, the areal size of the attachment surface for the member or the part is increased for the movable section 20, and the reliability is improved concerning the attachment of the member or the part, while the degree of influence on the resonance frequency (decrease in resonance frequency) can be decreased, which would be otherwise caused when the attachment of the member or the part is considered to be important.

The same steps as those executed in the method for producing the piezoelectric/electrostrictive device 10A according to the first embodiment described above are also executed when the piezoelectric/electrostrictive device 10F according to the sixth embodiment is produced.

A production method, which follows the first production method described above, will be explained below. At first, as shown in FIG. 39A, for example, a method such as the punching out based on a die or a laser machining is used to prepare a plurality (for example, four) of first ceramic green sheets 50A to 50D having at least a window 54 for forming the hole 12 thereafter and a projection 112 protruding toward the inside of the window 54 for forming the expanded section 110 thereafter, a plurality (for example, two) of second ceramic green sheets 116A, 16B formed with a window 114 for forming the hole 12 thereafter, and a plurality (for example, two) of ceramic green sheets 52A, 52B for forming the thin plate sections 16a, 16b thereafter.

Figure 40:
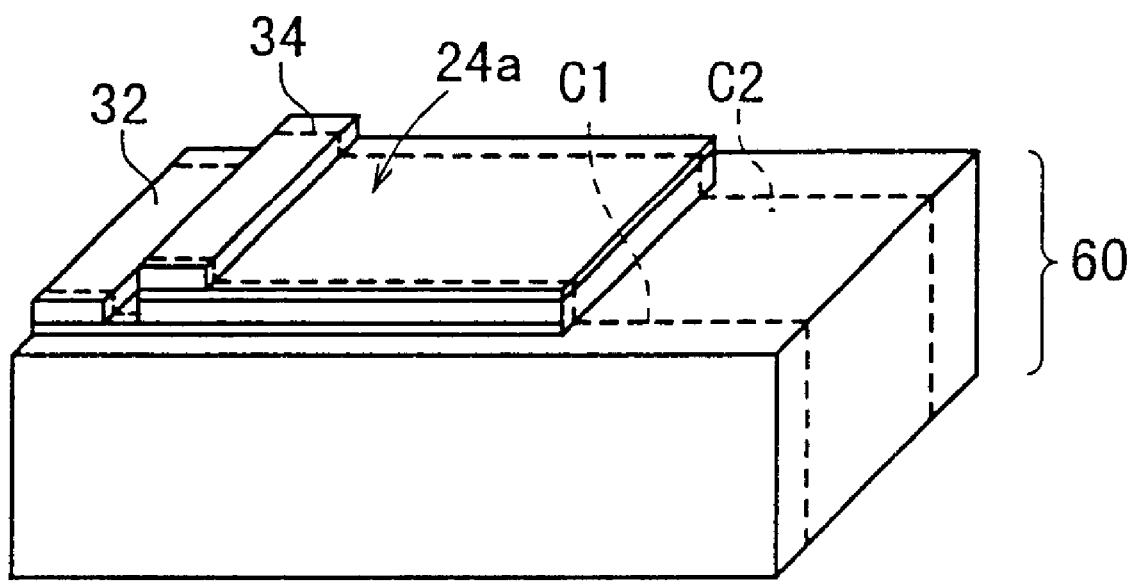
FIG. 40 illustrates a state in which the ceramic green laminate is sintered into a ceramic laminate, and then the piezoelectric/electrostrictive element is formed on the ceramic laminate.

After that, as shown in FIG. 39B, the first ceramic green sheets 50A to 50D are laminated and secured under pressure so that an obtained laminate (laminate of the first ceramic green sheets 50A to 50D) is interposed between the second ceramic green sheets 116A, 116B. Further, the first and second ceramic green sheets 50A to 50D, 116A, 116B are laminated and secured under pressure so that they are interposed between the ceramic green sheets 52A, 52B to thereby provide a ceramic green laminate 58. After that, as shown in FIG. 40, for example, the ceramic green laminate 58 is sintered to obtain a ceramic laminate 60.

Figure 41:
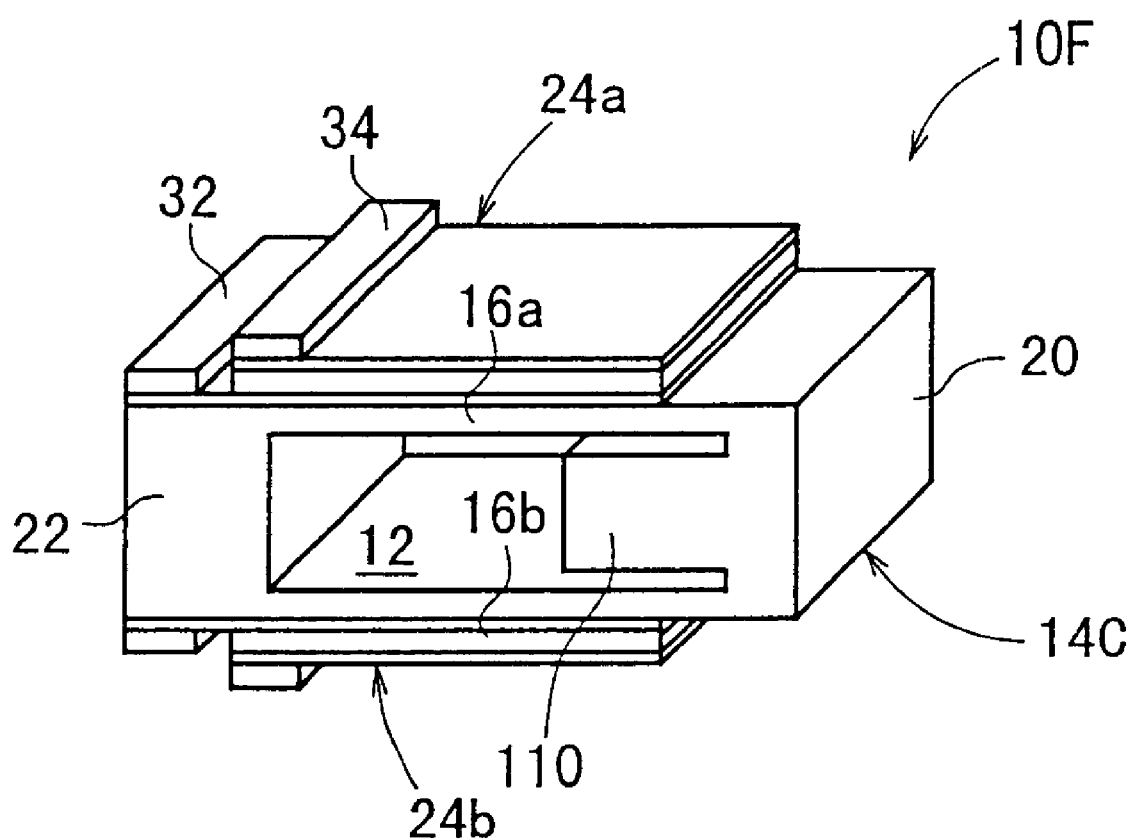
FIG. 41 illustrates a state in which the ceramic laminate is cut along predetermined cutting lines to provide the piezoelectric/electrostrictive device according to the sixth embodiment.
Figure 42:
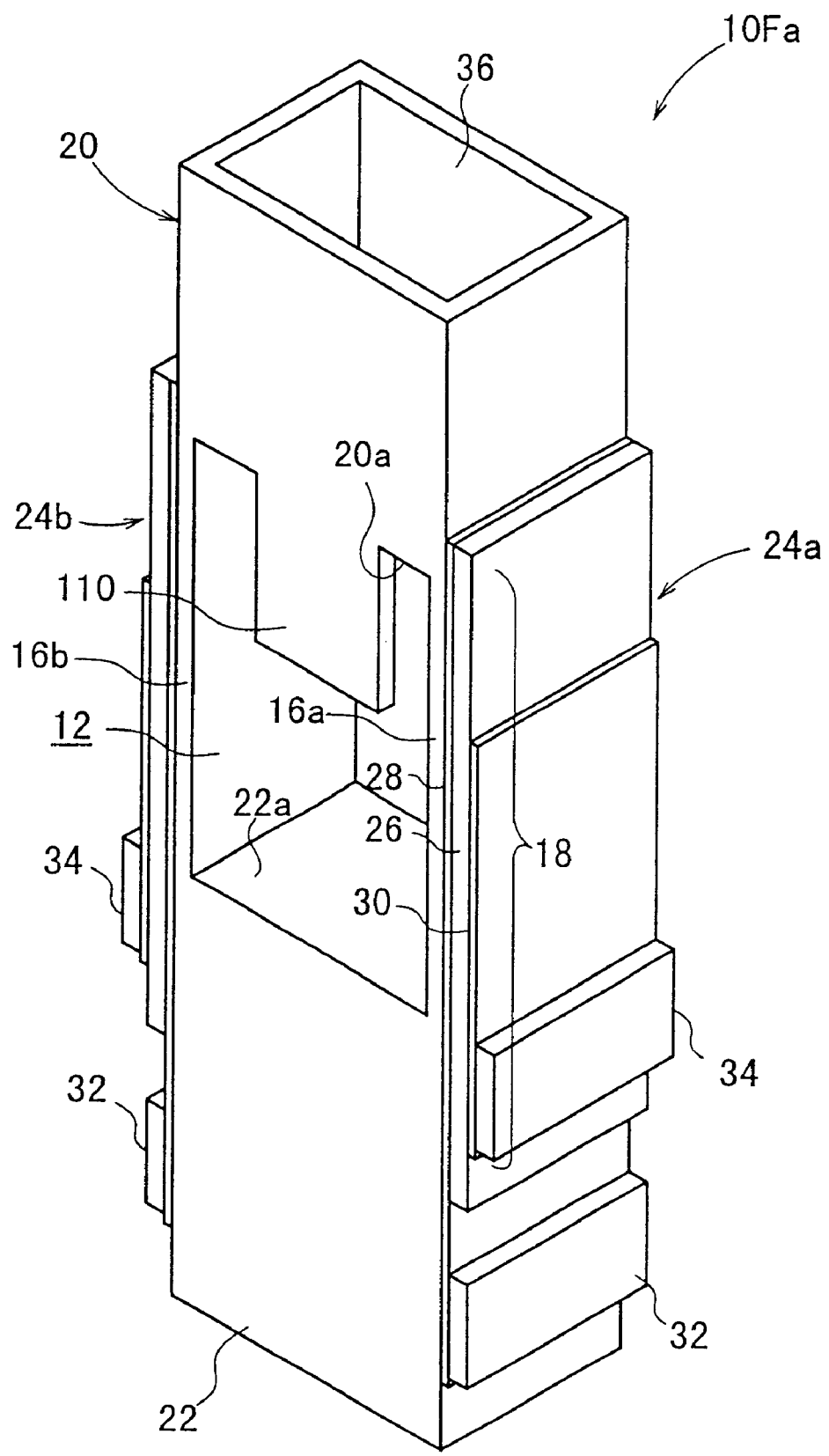
FIG. 42 shows a perspective view illustrating an arrangement of a modified embodiment of the piezoelectric/electrostrictive device according to the sixth embodiment.

After that, as shown in FIG. 41, the piezoelectric/electrostrictive elements 24a, 24b are formed on both surfaces of the ceramic laminate 60, i.e., on surfaces corresponding to the surfaces at which the ceramic green sheets 52A, 52B are laminated.

Subsequently, unnecessary portions are cut off from the ceramic laminate 60 which is formed with the piezoelectric/electrostrictive elements 24a, 24b as described above. The cutoff is performed at positions corresponding to side portions of the ceramic laminate 60, especially portions at which the hole 12 based on the window 54 is formed at the side surface of the ceramic laminate 60 by the cutoff (see cutting lines C1 and C2). As a result of the cutoff, as shown in FIG. 41, the piezoelectric/electrostrictive device 10F is completed, in which the piezoelectric/electrostrictive elements 24a, 24b are formed on a ceramic substrate 14C integrated with the movable section 20 having the expanded section 110 expanded toward the hole 12, the pair of thin plate sections 16a, 16b, and the fixation section 22.

In this embodiment, the movable section 20 is constructed to be solid. Alternatively, as in a piezoelectric/electrostrictive device 10Fa according to a modified embodiment shown in FIG. 42, various cutouts 36 (for example, the through-hole and the hollow section) may be provided, or the device may be constructed to have an empty vessel structure or a plate-shaped configuration with only a part attachment surface. In this case, it is advantageous to realize a high resonance frequency, because the movable section 20 is allowed to have a light weight. The piezoelectric/electrostrictive device 10Fa according to this modified embodiment is illustrative of the case in which a through-hole 36 having a rectangular cross section, which is continuously formed over a range from the forward end surface of the movable section 20 to the hole 12, is formed for the movable section 20 which is provided with the expanded section 110 expanded toward the hole 12.

Next, explanation will be made for a piezoelectric/electrostrictive device 10G according to the seventh embodiment with reference to FIG. 43. Components or parts corresponding to those shown in FIG. 1 are designated by the same reference numerals, duplicate explanation of which will be omitted.

Figure 43:
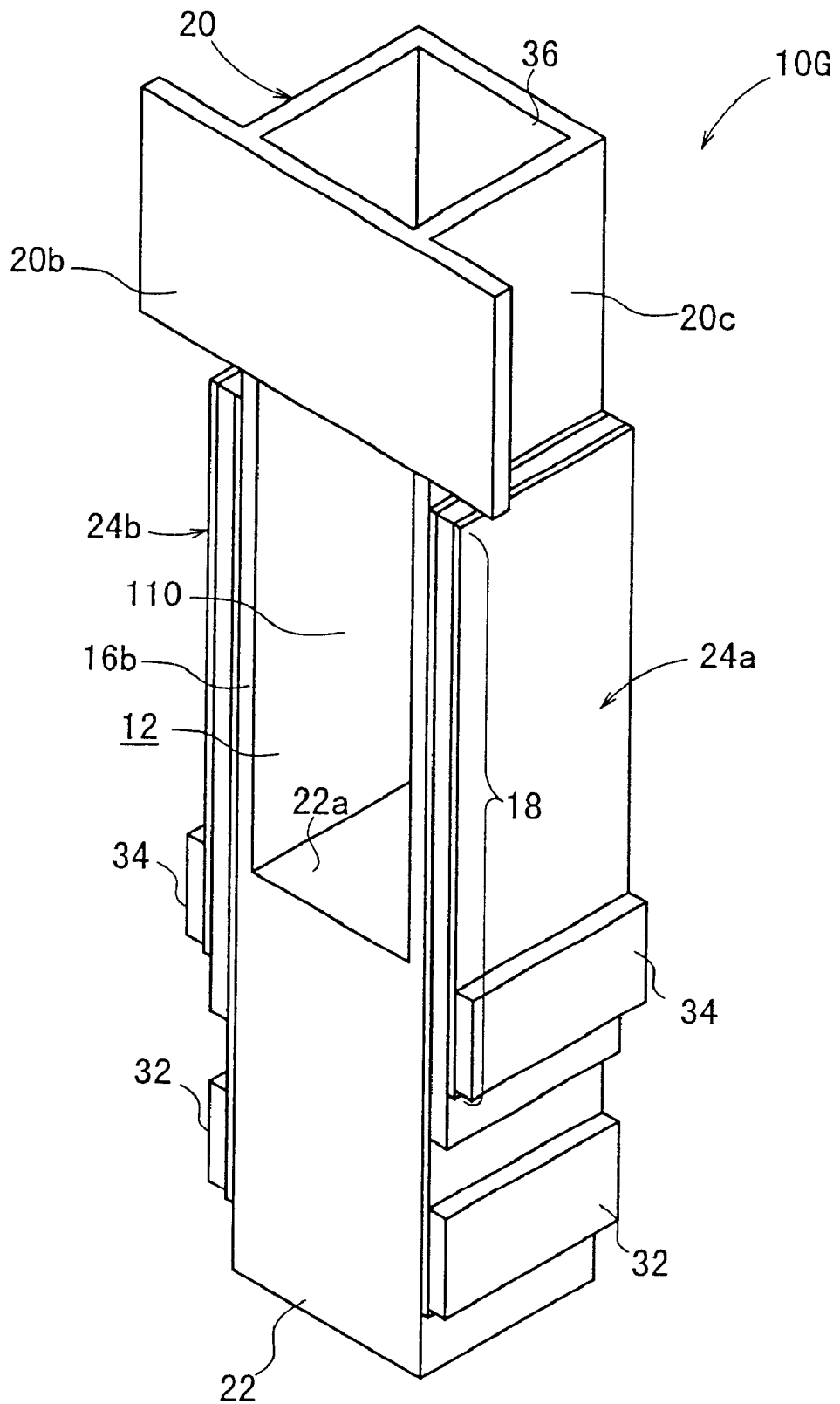
FIG. 43 shows a perspective view illustrating an arrangement of a piezoelectric/electrostrictive device according to a seventh embodiment.
Figure 44:
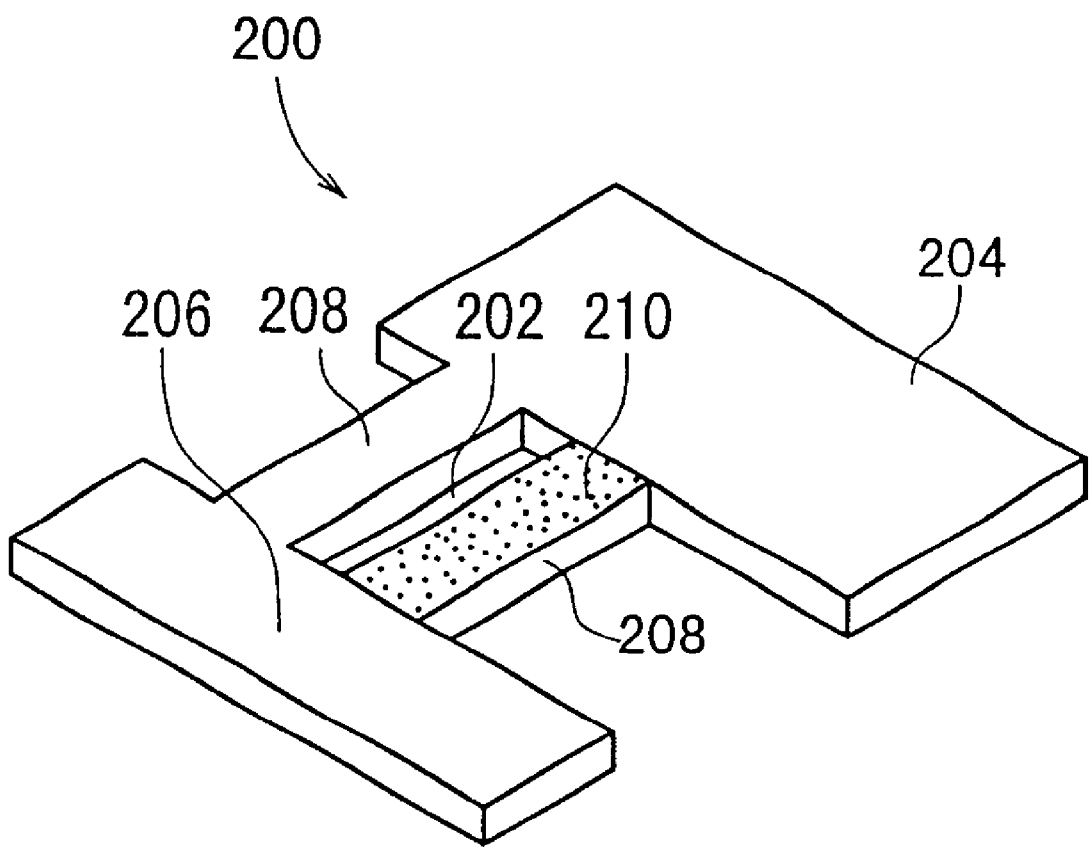
FIG. 44 shows an arrangement of a piezoelectric/electrostrictive device concerning an illustrative conventional technique.

As shown in FIG. 43, the piezoelectric/electrostrictive device 10G according to the seventh embodiment is constructed in approximately the same manner as the piezoelectric/electrostrictive device 10A according to the first embodiment described above. However, the former is different from the latter in that the areal size of the front surface 20b of the movable section 20 is widened in the lateral direction (direction of the X axis).

In this case, when the front surface of the movable section 20 is utilized as an attachment surface for a variety of members or parts, it is possible to improve the reliability concerning the attachment of the member or the part, because the areal size of the front surface 20b is widened. The front surface 20b may be produced in an integrated manner, for example, in accordance with a green sheet-laminating method, or it may be bonded as a separate member afterward. In this case, there is no special limitation for the material such as a metal and ceramics.

The piezoelectric/electrostrictive devices 10A to 10G according to the first to seventh embodiments are illustrative of the individual adoption of the arrangement in which the movable section 20 is allowed to have the light weight (first to fifth embodiments), the arrangement in which the expanded section 110 protruding from the movable section 20 to the hole 12 is provided (sixth embodiment), and the arrangement in which the areal size of the front surface 20b of the movable section 20 is widened in the lateral direction (seventh embodiment) respectively. Alternatively, it is also preferable to combine the arrangement in which the movable section 20 is allowed to have a light weight and the arrangement in which the expanded section 110 protruding from the movable section 20 to the hole 12 is provided. In this case, it is possible to simultaneously realize the high resonance frequency owing to the light weight of the movable section 20 and the reliability of the attachment of the part, as well as the suppression of the decrease in resonance frequency owing to the fact that the attachment position for the member or the part can be shifted toward the fixation side.

It is also preferable to combine the arrangement in which the expanded section 110 protruding from the movable section 20 to the hole 12 is provided and the arrangement in which the areal size of the front surface 20b of the movable section 20 is widened in the lateral direction. In this case, it is possible to simultaneously realize the reliability of the attachment of the part and the increase in displacement amount of the movable section 20, as well as the suppression of the decrease in resonance frequency owing to the fact that the attachment position for the member or the part can be shifted toward the fixation side.

Further, it is also preferable to combine all of the arrangements described above. In this case, it is possible to simultaneously realize a high resonance frequency owing to the light weight of the movable section 20, the increase in displacement amount of the movable section 20, and the reliability of the attachment of the part, as well as the suppression of the decrease in resonance frequency owing to the fact that the attachment position for the member or the part can be shifted toward the fixation side.

The piezoelectric/electrostrictive device described above can be utilized as the active device including, for example, various transducers, various actuators, frequency region functional parts (filters), transformers, vibrators, resonators, oscillators, and discriminators for the communication and the power generation, as well as the sensor element for various sensors including, for example, ultrasonic sensors, acceleration sensors, angular velocity sensors, shock sensors, and mass sensors. Especially, the piezoelectric/electrostrictive device described above can be preferably utilized for various actuators to be used as the mechanism for adjusting the displacement and the positioning and for adjusting the angle for various precision parts such as those of optical instruments and precision mechanical equipments.

It is a matter of course that the piezoelectric/electrostrictive device and the method for producing the same according to the present invention are not limited to the embodiments described above, which may be embodied in other various forms without deviating from the gist or essential characteristics of the present invention.

What is claimed is:

1. A method for producing a piezoelecuic/electrostrictive device comprising:
   forming a pair of mutually opposing thin plate sections;
   forming a fixation section for supporting said thin plate sections;
   forming one or more piezoelectric/electrostrictive elements arranged on at least one thin plate section of said pair of thin plate sections;
   forming a hole formed by both inner walls of said pair of thin plate sections and an inner wall of said fixation section; and
   forming a movable section having a cutout at an end of said thin plate sections by cutting off a predetermined part after producing at least said piezoelecuic/electrostrictive element on said thin plate section.

2. The method for producing said piezoelectric/electrostrictive device according to claim 1, wherein said cutout includes at least one of a hollow section and a through-hole provided for said movable section.

3. A method for producing a piezoelectric/electrostrictive device comprising:
   a pair of mutually opposing thin plate sections, a movable section, and a fixation section for supporting said thin plate sections and said movable section;
   one or more piezoelectric/electrostrictive elements arranged on at least one thin plate section of said pair of thin plate sections; and
   a hole formed by both inner walls of said pair of thin plate sections, an inner wall of said movable section, and an inner wall of said fixation section; said method comprising:
      a step of producing a ceramic laminate by integrally sintering a ceramic green laminate including at least a ceramic green sheet having a window for forming at least said hole thereafter and ceramic green sheets to be formed into said thin plate sections thereafter to produce said ceramic laminate;
      a step of forming said piezoelectric/electrostrictive element on an outer surface of a portion of said ceramic laminate to be formed into said thin plate section; and
      a cutoff step of forming said movable section having at least a cutout by means of at least one time of cutoff treatment for said ceramic laminate formed with said piezoelectric/electrostrictive element.

4. The method for producing said piezoelectric/electrostrictive device according to claim 3, wherein:
   in said step of producing said ceramic laminate, said ceramic laminate is produced by integrally sintering a ceramic green laminate including a ceramic green sheet having a window for forming said movable section having at least said cutout, and said ceramic green sheets to be formed into said thin plate sections thereafter to produce said ceramic laminate; and
   in said cutoff step, said movable section having at least said cutout is formed by means of said cutoff treatment for said ceramic laminate formed with said piezoelectric/electrostrictive element.

5. The method for producing said piezoelectric/electrostrictive device according to claim 3, wherein said cutout includes at least one of a hollow section and a through-hole provided for said movable section.

6. The method for producing said piezoelectric/electrostrictive device according to claim 3, wherein in said cutoff step, said hole is exposed by means of said cutoff treatment for said ceramic laminate.

7. A method for producing a piezoelectric/electrostrictive device comprising:
   a pair of mutually opposing thin plate sections, a movable section, and a fixation section for supporting said thin plate sections and said movable section;
   one or more piezoelectric/electrostrictive elements arranged on at least one thin plate section of said pair of thin plate sections; and
   a hole formed by both inner walls of said pair of thin plate sections, an inner wall of said movable section, and an inner wall of said fixation section, said method comprising:
      a step of forming said movable section having an expanded section expanded in said hole by cutting off a predetermined part after producing at least said piezoelectric/electrostrictive element on said thin plate section.

8. The method for producing said piezoelectric/electrostrictive device according to claim 7, wherein:
   in said step of producing said ceramic laminate, said ceramic laminate is produced by integrally sintering a ceramic green laminate including a ceramic green sheet having a window for forming said movable section formed with at least said expanded section, and said ceramic green sheets to be formed into said thin plate sections thereafter to produce said ceramic laminate; and
   in said cutoff step, said movable section having at least said expanded section is formed by means of said cutoff treatment for said ceramic laminate formed with said piezoelectric/electrostrictive element.

9. The method for producing said piezoelectric/electrostrictive device according to claim 7, wherein in said cutoff step, said hole is exposed by means of said cutoff treatment for said ceramic laminate.

10. A method for producing a piezoelectric/electrostrictive device comprising:
   a pair of mutually opposing thin plate sections, a movable section, and a fixation section for supporting said thin plate sections and said movable section;
   one or more piezoelectric/electrostrictive elements arranged on at least one thin plate section of said pair of thin plate sections; and
   a hole formed by both inner walls of said pair of thin plate sections, an inner wall of said movable section, and an inner wall of said fixation section; said method comprising:
      a step of producing a ceramic laminate by integrally sintering a ceramic green laminate including at least a ceramic green sheet having a window for forming at least said hole thereafter and ceramic green sheets to be formed into said thin plate sections thereafter to produce said ceramic laminate;
      a step of forming said piezoelectric/electrostrictive element on an outer surface of a portion of said ceramic laminate to be formed into said thin plate section; and
      a cutoff step of forming said movable section having at least an expanded section expanded in said hole by means of at least one time of cutoff treatment for said ceramic laminate formed with said piezoelectric/electrostrictive element.

* * * * *